(12) United States Patent
Yokota et al.

(10) Patent No.: US 7,301,421 B2
(45) Date of Patent: Nov. 27, 2007

(54) SURFACE ACOUSTIC WAVE DEVICE, MANUFACTURING METHOD THEREFOR, AND COMMUNICATIONS EQUIPMENT

(75) Inventors: Yuuko Yokota, Kyoto (JP); Masayuki Funami, Kyoto (JP); Takanori Ikuta, Kyoto (JP); Wataru Koga, Kyoto (JP); Yoshifumi Yamagata, Kyoto (JP); Motoki Ito, Kyoto (JP); Kiyohiro Iioka, Kyoto (JP)

(73) Assignee: Kyocera Corporation, Kyoto (JP)

( * ) Notice: Subject to any disclaimer, the term of this patent is extended or adjusted under 35 U.S.C. 154(b) by 217 days.

(21) Appl. No.: 11/169,160

(22) Filed: Jun. 28, 2005

(65) Prior Publication Data
US 2005/0285699 A1  Dec. 29, 2005

(30) Foreign Application Priority Data

| Jun. 28, 2004 | (JP) | ............................. | 2004-190559 |
| Jun. 28, 2004 | (JP) | ............................. | 2004-190560 |
| Jun. 28, 2004 | (JP) | ............................. | 2004-190565 |
| Aug. 26, 2004 | (JP) | ............................. | 2004-247509 |
| Sep. 15, 2004 | (JP) | ............................. | 2004-268255 |
| Sep. 15, 2004 | (JP) | ............................. | 2004-268256 |

(51) Int. Cl.
*H03H 9/72* (2006.01)
*H03H 9/64* (2006.01)

(52) U.S. Cl. ...................................... 333/133; 333/193
(58) Field of Classification Search ........ 333/193–196, 333/133
See application file for complete search history.

(56) References Cited

U.S. PATENT DOCUMENTS 5,773,917 A   6/1998  Satoh et al.
5,864,260 A * 1/1999  Lee ............................. 333/133
6,297,580 B1  10/2001 Takayama et al.
7,030,716 B2 * 4/2006 Tsutsumi et al. ........... 333/133

FOREIGN PATENT DOCUMENTS

| JP | 59-4216 | * | 1/1984 | ............. 310/313 R |
| JP | 2-288410 | * | 11/1990 | ................. 333/193 |

(Continued)

OTHER PUBLICATIONS

Akinori Miyamoto, et al., "Novel Optical Observation Technique for shear Horizontal Wave in SAW Resonators on 42 YX-cut Lithium Tantalate"; 2002 IEEE Ultrasonics Symposium-89, vol. 1, pp. 89-92, Oct. 2002.

*Primary Examiner*—Barbara Summons
(74) *Attorney, Agent, or Firm*—Hogan & Hartson LLP

(57) ABSTRACT

A conductor layer 10 is provided so as to prevent pyroelectric destruction occurring in the steps of manufacturing a surface acoustic wave element 1 on the other surface opposite to an IDT electrode formation surface of a piezoelectric substrate 2. At this time, the conductor layer 10 is formed, except for a region 5a opposed to an input electrode section 5 in a filter region 9 and/or a region 6a opposed to an output electrode section 6. This allows a coupling amount between the input electrode section 5 and the output electrode section 6 due to a parasitic capacitance formed between the input electrode section 5 and the output electrode section 6 in the filter region 9 to be reduced, thereby allowing the out-of-band attenuation characteristics of a surface acoustic wave device to be improved.

25 Claims, 36 Drawing Sheets

FOREIGN PATENT DOCUMENTS

| | | |
|---|---|---|
| JP | 04-293310 | 10/1992 |
| JP | 4-313906 | 11/1992 |
| JP | 7-122961 | 5/1995 |
| JP | WO99/54995 | 10/1999 |
| JP | 11-340780 | * 12/1999 |
| JP | 2000-165185 | * 6/2000 |

* cited by examiner

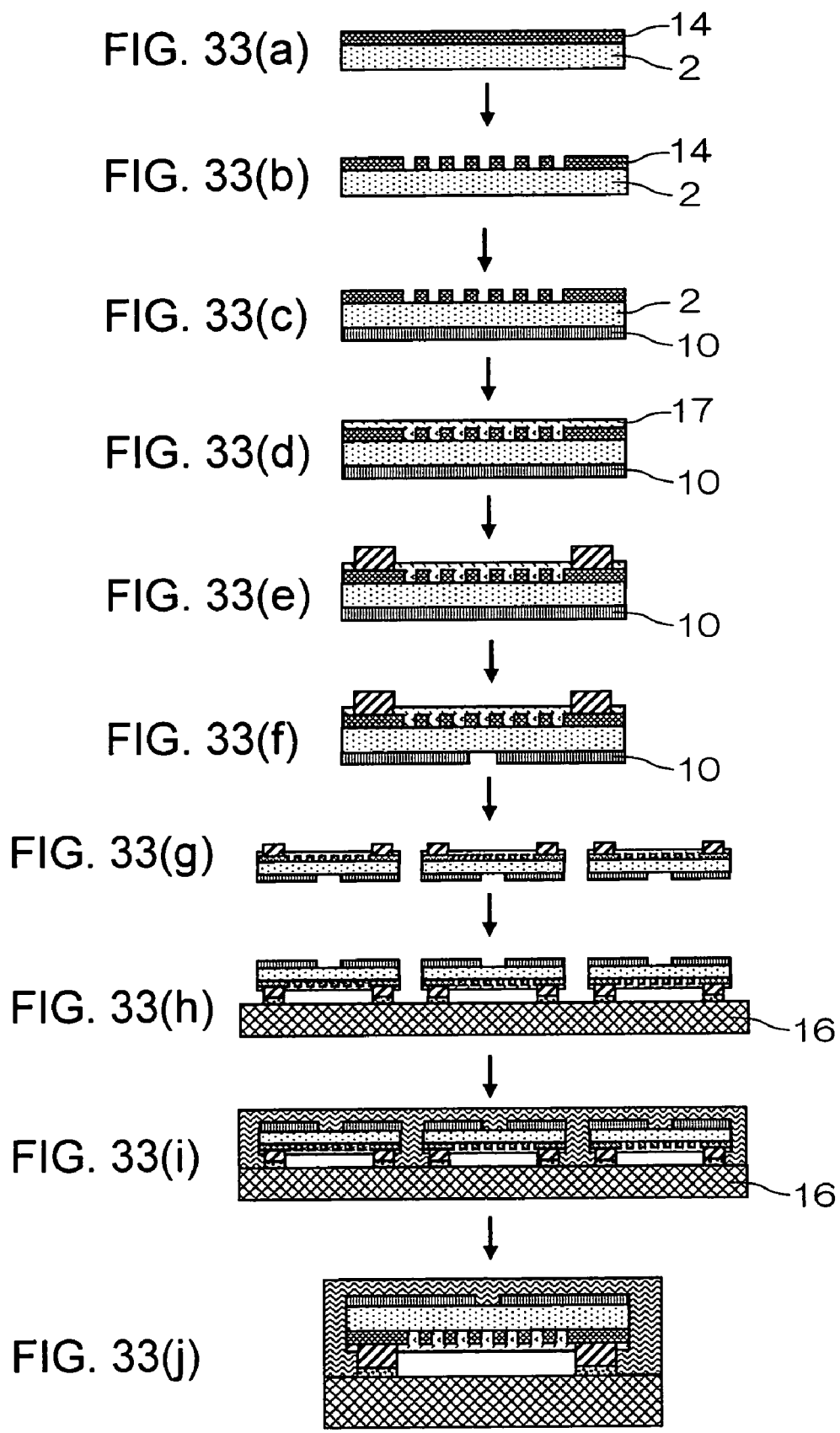

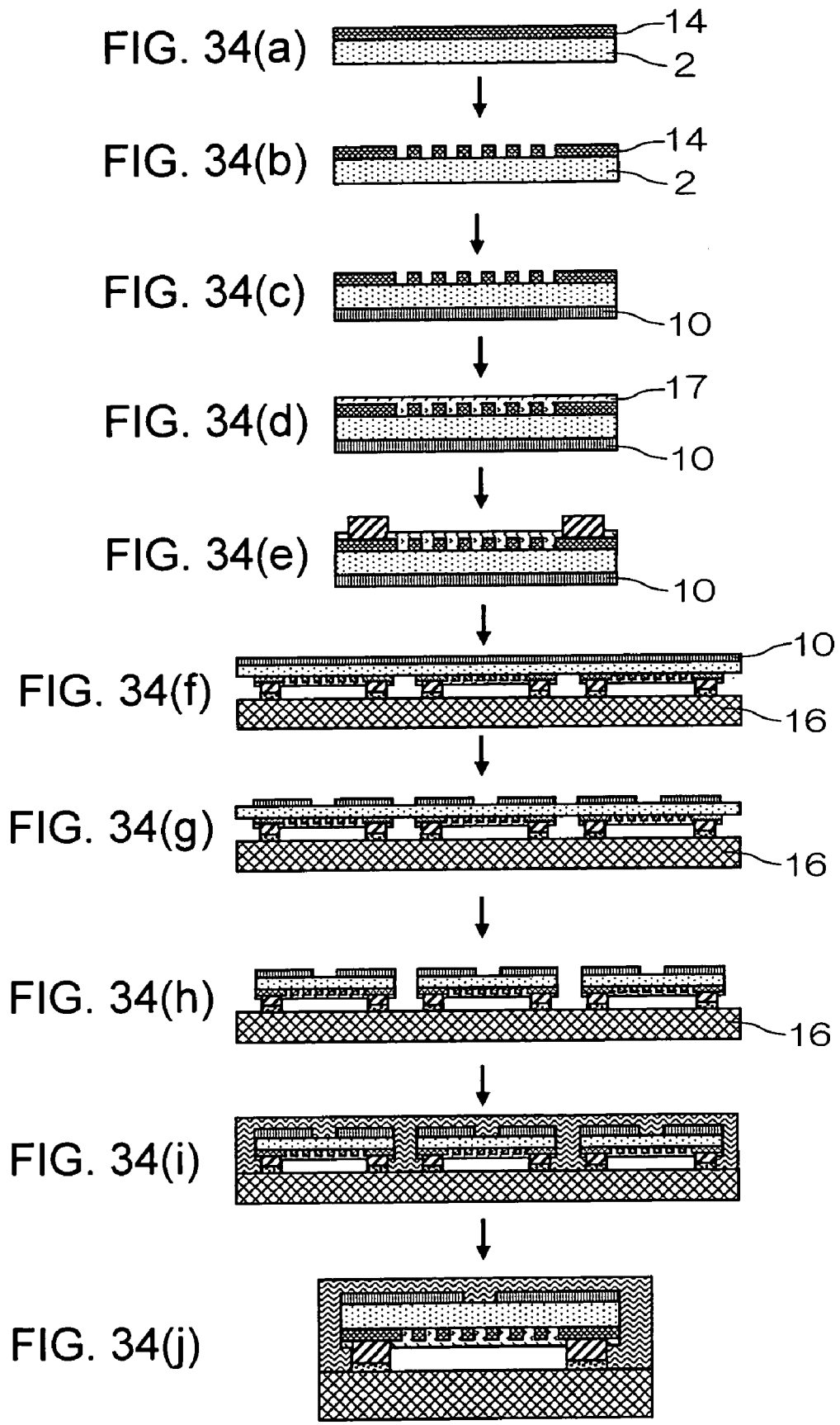

※MNW: MATCHING NETWORK

※MNW: MATCHING NETWORK

1500

400

220

SURFACE ACOUSTIC WAVE DEVICE, MANUFACTURING METHOD THEREFOR, AND COMMUNICATIONS EQUIPMENT

BACKGROUND OF THE INVENTION

1. Field of the Invention

The present invention relates to a surface acoustic wave device employed as a surface acoustic wave filter or the like, a manufacturing method therefor, and a communications equipment.

2. Description of Related Art

In recent years, surface acoustic wave filters have been employed for various types of communications equipments.

As the frequency and the function of the communications equipment have increased, a request to increase the out-of-band attenuation of the surface acoustic wave filter has progressively increased.

A schematic sectional view of a face-down mounting structure of a conventional surface acoustic wave device is illustrated in FIG. 45.

In FIG. 45, reference numeral 51 denotes a piezoelectric substrate, reference numeral 52 denotes a ground pad, reference numeral 53 denotes an IDT (Inter Digital Transducer) electrode (referred to as an IDT electrode) in a comb shape formed on the piezoelectric substrate 51, reference numeral 54 denotes a conduction pattern formed on a package (mounting substrate) 57, and reference numeral 55 denotes a connecting bump, and reference numeral 59 denotes a conductor layer formed on a reverse surface (a surface opposite to a surface on which the IDT electrode is formed) of the piezoelectric substrate 51.

In the configuration shown in FIG. 45, the ground pad 52 and the IDT electrode 53 are formed of an Al—Cu film, for example, and the conduction pattern 54 and the ground pad 52 are electrically connected to each other by the bump 55 composed of Au, for example. Further, a cover 56 is further subjected to seam welding or the like through a joint layer 58, thereby sealing the package 57 to maintain the internal airtightness of the surface acoustic wave device accommodating a surface acoustic wave element.

The main causes of degradation of an out-of-band attenuation in the conventional surface acoustic wave device having such a face-down structure are input-output electromagnetic coupling due to an increase in electrical resistance of an electrode such as the ground pad 52, the IDT electrode 53, the conductor pattern 54 formed on the package 57, etc. in the surface acoustic wave element, a parasitic inductance, or a stray capacitance.

The input-output electromagnetic coupling due to the stray capacitance will be particularly described.

The surface acoustic wave element is an element using a comb-shaped IDT electrode produced on a piezoelectric substrate. Generally, a piezoelectric member exhibits pyroelectric properties due to a rapid temperature change. When an element having an IDT electrode on a piezoelectric substrate is passed through a step in which there is a rapid temperature change while being manufactured, sparks are generated between electrode sections in the IDT electrode, thereby destroying the element. In order that charges are stored in the piezoelectric substrate as little as possible, therefore, a conductor layer 59 is generally formed throughout the reverse surface of the piezoelectric substrate.

Although the conductor layer 59 is effective in preventing pyroelectric destruction during the element manufacturing process, however, the inventors found that a capacity coupling occurs between the conductor layer 59 and the input/output electrodes of the IDT electrode 53, which deteriorates the out-of-band attenuation.

Particular, a branching filter (a duplexer) for isolating a signal in a transmission-side frequency band (e.g., a low frequency-side frequency band) and a signal in a receiving-side frequency band (e.g., a high frequency-side frequency band) in the surface acoustic wave device will be described in detail.

The branching filter is referred to as a surface acoustic wave duplexer (hereinafter abbreviated as an SAW-DPX).

In the SAW-DPX, a filter in the transmission-side frequency band (hereinafter referred to as a transmission-side filter) and a filter in the receiving-side frequency band (hereinafter referred to as a receiving-side filter) are formed on the same surface of the same piezoelectric substrate to achieve miniaturization.

When the transmission-side filter and the receiving-side filter are actually formed on the same piezoelectric substrate, however, isolation characteristics between both the filters cannot satisfy requirement specifications in a communications terminal.

The isolation characteristics mean the level of a signal leakage from one filter to the other filter. Such signal leakage must be miniaturized.

Particularly in the branching filter, when a high-power transmission signal amplified on the transmission side leaks from the transmission-side filter to the receiving-side filter to leak to the receiving side, an originally low-power receiving signal cannot be received.

In specifications of the isolation characteristics required for the branching filter, therefore, it is required that signal leakage is significantly minimized. This required specifications are significantly stricter than specifications required for a Dual-SAW filter employed between stages.

It is considered that one cause of degradation of the isolation characteristics between the filters is leakage of an elastic wave. Particularly in the SAW-DPX, it is considered that an elastic wave excited in an IDT electrode forming the transmission-side filter cannot be sufficiently trapped in the IDT electrode, and the elastic wave that has leaked from the IDT electrode in the transmission-side filter propagates on the surface of the piezoelectric substrate and is received by an IDT electrode forming the receiving-side filter so that the signal leaks from the transmission-side filter to the receiving-side filter, thereby degrading the isolation characteristics (Akinori Miyamoto, Shin-ichi Wakana, and Akio Ito, Fujitsu Laboratories Limited, "Novel optical observation technique for shear horizontal wave in SAW resonators on 42° YX-cut lithium tantalate" 2002 IEEE ULTRASONICS SYMPOSIUM-89).

Specifically, a propagation path of a surface acoustic wave from the IDT electrode in the transmission-side filter and a propagation path of a surface acoustic wave from the IDT electrode in the receiving-side filter are arranged so as to be overlapped with each other on the same straight line. Therefore, it is considered that the surface acoustic wave leaks from the IDT electrode in the transmission-side filter to the IDT electrode in the receiving-side filter, thereby degrading the isolation characteristics.

Therefore, an attempt to improve the isolation characteristics by respectively separating the transmission-side filter and the receiving-side filter that have been formed on the same piezoelectric substrate and forming the filters on separate piezoelectric substrates to cut off the propagation of the leakage of the surface acoustic wave has been made.

In such an attempt, however, the isolation characteristics are certainly improved. However, the transmission-side filter and the receiving-side filter that have been originally integrally formed are separated and formed on the separate piezoelectric substrates. In a case where the transmission-side filter and the receiving-side filter are mounted on a mounting substrate, therefore, the area of a region serving as a branching filter is larger than that in a case where the transmission-side filter and the receiving-side filter are integrally formed on the same piezoelectric substrate. Therefore, it is impossible to fulfill a miniaturization requirement.

Therefore, it is also considered that the respective IDT electrodes in the transmission-side filter and the receiving-side filter are arranged such that the propagation paths of the surface acoustic wave from both the IDT electrodes are parallel to each other, for example, so as not to be overlapped with each other. It should be possible to provide a small-sized SAW-DPX having improved isolation characteristics while forming the transmission-side filter and the receiving-side filter on the same piezoelectric substrate to achieve miniaturization without separating the filters on the separate piezoelectric substrates.

When the inventors of the present invention have conducted detailed experiments, however, the isolation characteristics have not been improved. This means that the cause of the degradation of the isolation characteristics is not only the leakage of the surface acoustic wave.

The inventors of the present invention have found that the above-mentioned reverse surface conductor layer 59 is effective in preventing pyroelectric destruction during the element manufacturing process but is harmful for the isolation characteristics of the surface acoustic wave element.

An object of the present invention is to provide, in a surface acoustic wave device in which a surface acoustic wave element is face-down mounted on a mounting substrate, a surface acoustic wave device capable of improving the out-of-band attenuation of a filter and being superior in reliability and a communications equipment using the same.

Another object of the present invention is to particularly provide a surface acoustic wave device, in which a transmission-side filter and a receiving-side filter are formed on the same piezoelectric substrate, being small in size and having superior isolation characteristics and a communications equipment using the same.

SUMMARY OF THE INVENTION

A surface acoustic wave device according to the present invention is one in which a main surface of a piezoelectric substrate having a filter region formed thereon is mounted on a mounting substrate, wherein an IDT electrode, an input electrode section, and an output electrode section are formed in the filter region on the main surface of the piezoelectric substrate, and a conductor layer is partially formed on the other surface opposite to the main surface of the piezoelectric substrate.

A region where no conductor layer is formed on the other surface is referred to as a "conductor-unformed region".

In the foregoing configuration, even if mounting (flip-chip mounting) with a surface where the IDT electrode is formed (hereinafter referred to as an IDT electrode formation surface) of the piezoelectric substrate opposed to a main surface of the mounting substrate is performed, the input electrode section and the output electrode section in the filter region are not easily capacitive-coupled through the conductor layer on the other surface of the piezoelectric substrate. An out-of-band attenuation is hardly degraded, although the surface acoustic wave device is small in size.

Particularly, it is required that the thickness of the piezoelectric substrate is reduced for the surface acoustic wave device from recent requests to reduce the sizes/heights of components. If the thickness of the piezoelectric substrate is reduced, a capacitance between the electrode on the main surface of the piezoelectric substrate and the conductor layer on the other surface thereof is increased. Consequently, the degradation of the out-of-band attenuation becomes more serious. In order to cope with this, a conductor layer having a conductor-unformed region in its part is formed, so that a surface acoustic wave device of a thin type and having out-of-band attenuation characteristics can be obtained.

Moreover, in the steps of manufacturing the surface acoustic wave device, the conductor layer on the other surface of the piezoelectric substrate exists, thereby making it possible to prevent pyroelectric destruction (break down) of a surface acoustic wave element.

The conductor layer may be formed on the other surface of the piezoelectric substrate, except for a region opposed to the input electrode section and/or a region opposed to the output electrode section on the other surface of the piezoelectric substrate.

According to this configuration, a parasitic capacitance formed between the input electrode section and the output electrode section in the filter region can be isolated between the input and output electrode sections. Therefore, a capacitive-coupling amount can be made significantly smaller than that in a case where the conductor layer is formed throughout the other surface as in the conventional example. Consequently, out-of-band attenuation characteristics caused by the parasitic capacitance can be increased and improved.

The conductor layer may be formed on the other surface of the piezoelectric substrate, except for a region opposed to a portion connected directly from the input electrode section to the IDT electrode and/or a region opposed to a portion connected directly from the output electrode section to the IDT electrode on the other surface of the piezoelectric substrate.

In this case, a coupling amount between the input and output electrode sections caused by a parasitic capacitance formed by the portion connected directly from the input electrode section to the IDT electrode and the portion connected directly from the output electrode section to the IDT electrode can be reduced, thereby making it possible to restrain degradation of out-of-band attenuation characteristics caused by the parasitic capacitance and to further increase the out-of-band attenuation.

The conductor layer may be formed on the other surface of the piezoelectric substrate, except for a region opposed to the filter region on the other surface of the piezoelectric substrate.

In this case, a coupling amount through a parasitic capacitance formed between a connection electrode for connecting a plurality of IDT electrodes forming the filter region on the IDT electrode and the input-output electrode sections can be further reduced, thereby making it possible to restrain degradation of out-of-band attenuation characteristics caused by the parasitic capacitance and to further increase the out-of-band attenuation.

The conductor layer may have, in the region opposed to the input electrode section and/or the region opposed to the output electrode section on the other surface of the piezoelectric substrate, an isolation section isolated from the other region.

According to this configuration, a parasitic capacitance formed between the input electrode section and the output electrode section in the filter region can be isolated by the isolation section. Therefore, a coupling amount caused by the parasitic capacitance between the input and output electrode sections can be made significantly smaller than that in a case where the conductor layer is formed throughout the other surface as in the conventional example. Degradation of out-of-band attenuation characteristics caused by the parasitic capacitance can be restrained, and the out-of-band attenuation can be increased.

The conductor layer may have, in the region opposed to the portion connected directly from the input electrode section to the IDT electrode and/or the region opposed to the portion connected directly from the output electrode section to the IDT electrode on the other surface of the piezoelectric substrate, an isolation section isolated from the other region.

In this case, a coupling amount between the input and output electrode sections caused by a parasitic capacitance formed by the portion connected directly from the input electrode section to the IDT electrode and the portion connected directly from the output electrode section to the IDT electrode can be reduced, thereby making it possible to restrain degradation of out-of-band attenuation characteristics caused by the parasitic capacitance and to further increase the out-of-band attenuation.

The conductor layer may be formed on the other surface of the piezoelectric substrate with a large number of conductor-unformed regions dispersed.

In this configuration, a parasitic capacitance formed between the input electrode section and the output electrode section in the filter region can be made smaller than that in a case where the conductor layer is formed throughout the other surface as in the conventional example. Therefore, degradation of out-of-band attenuation characteristics caused by the parasitic capacitance can be restrained in correspondence with a reduced area of the conductor layer on the other surface, and the out-of-band attenuation can be increased.

It is preferable that in the region opposed to the input electrode section and/or the region opposed to the output electrode section on the other surface of the piezoelectric substrate, the ratio (percentage) of an area occupied by the conductor-unformed regions is higher than the other region.

According to this configuration, in the region opposed to at least one of the input electrode section and the output electrode section, the ratio of the area occupied by the conductor layer is made higher than that of the area in the other region. Therefore, a coupling amount between the input electrode section and the output electrode section in the filter region can be further reduced, thereby allowing out-of-band attenuation characteristics to be further improved.

The ratio of the area occupied by the conductor-unformed regions may be higher than that of the area in the other region, in the region opposed to the portion connected directly from the input electrode section to the IDT electrode and/or the region opposed to the portion connected directly from the output electrode section to the IDT electrode on the other surface of the piezoelectric substrate.

In this case, a parasitic capacitance formed between the input electrode section and the output electrode section in the filter region can be further reduced, thereby allowing out-of-band attenuation characteristics to be further improved.

A surface acoustic wave device according to the present invention is also applicable to a branching filter (a duplexer), in which a filter region comprises a transmission-side filter region and a receiving-side filter region, for isolating a signal in a transmission-side frequency band and a signal in a receiving-side frequency band.

Degradation of isolation characteristics in the branching filter is caused by capacitive coupling through a reverse surface conductor layer generally formed throughout the other surface of the piezoelectric substrate between an input electrode section in a transmission-side filter (e.g., a low frequency-side filter) and an output electrode section in a receiving-side filter (e.g., a high frequency-side filter) formed on the main surface of the piezoelectric substrate.

An effect produced in a case where the present invention is applied to a branching filter will be described using the results of simulation and a concept diagram of a circuit used for simulation.

FIG. 35($a$) is a circuit diagram of a communications equipment in a case where there is no parasitic capacitance, FIG. 35($b$) is a graph showing an example of isolation characteristics, 35($c$) is a circuit diagram of a communications equipment in a case where there is a parasitic capacitance C caused by a reverse surface conductor, and 35($d$) is a graph showing an example of isolation characteristics.

The parasitic capacitance C shown in FIG. 35($c$) is a parasitic capacitance existing between the input electrode section in the transmission-side filter and the output electrode section in the receiving-side filter and is a very small parasitic capacitance of approximately 50 fF (femto=$10^{-15}$).

As apparent from comparison between

FIGS. 35($b$) and 35($d$), the signal intensity at 869 MHz to 894 MHz is −30 dB to −40 dB, as shown in FIG. 35($d$), when such a parasitic capacitance C exists, while being not more than −50 dB, as shown in FIG. 35($b$), when there is no parasitic capacitance. This proves that the isolation characteristics are significantly improved because there is no parasitic capacitance.

Such a parasitic capacitance of approximately 50 fF corresponds to a capacitance formed when electrodes in the shape of a square, about 180 μm on a side, are opposed to the surface and the reverse surface of the piezoelectric substrate when the dielectric constant is calculated as 42.7 in a case where a lithium tantalate single crystal substrate having a thickness of 250 μm is used as the piezoelectric substrate, for example. Generally, the area of the input-output electrode sections in the surface acoustic wave filter is of this degree. Therefore, it can be said that a value inserted as a parasitic capacitance C by simulation is a value on which reality is appropriately reflected.

It is the parasitic capacitance C between the input electrode section in the transmission-side filter and the output electrode section in the receiving-side filter, herein described, that most greatly affects the isolation characteristics. However, there is also a parasitic capacitance between a connection electrode for connecting the IDT electrodes in one of the filters and the input-output electrode sections in the filter, and there is also a parasitic capacitance between a connection electrode for connecting the IDT electrodes in one of the filters and a connection electrode for connecting the IDT electrodes in the other filter. The parasitic capacitances similarly degrade the isolation characteristics.

Therefore, the transmission-side filter and the receiving-side filter can be integrally formed on the same piezoelectric substrate by forming the conductor layer having the conductor-unformed regions in its part to improve the isolation characteristics between the transmission-side filter and the receiving-side filter.

Thus, it is possible to manufacture an SAW-DPX that is smaller in size than that in which a transmission-side filter and a receiving-side filter are manufactured on separate piezoelectric substrates. The input electrode in the transmission-side filter and the output electrode in the receiving-side filter are hardly capacitive-coupled through the conductor layer on the other surface. Therefore, a surface acoustic wave device that does not degrade the isolation characteristics can be obtained, although it is a small-sized SAW-DPX, and pyroelectric destruction of the surface acoustic wave element in the manufacturing process can be prevented.

The conductor layer may be formed on the other surface of the piezoelectric substrate, except for a region opposed to the input electrode section in the transmission-side filter region and/or a region opposed to the output electrode section in the receiving-side filter region on the other surface of the piezoelectric substrate.

According to this configuration, a parasitic capacitance formed between the input electrode section in the transmission-side filter region and the output electrode section in the receiving-side filter region can be made significantly smaller than that in a case where the conductor layer is formed throughout the other surface as in the conventional example, thereby making it possible to restrain detour of a signal due to the parasitic capacitance and to improve isolation characteristics.

The conductor layer may be formed on the other surface of the piezoelectric substrate, except for a region opposed to a portion connected directly from the input electrode section to the IDT electrode in the transmission-side filter region and/or a region opposed to a portion connected directly from the output electrode section to the IDT electrode in the receiving-side filter region on the other surface of the piezoelectric substrate.

According to this configuration, a parasitic capacitance formed by the portion connected directly from the input electrode section to the IDT electrode in the transmission-side filter region and/or the portion connected directly from the output electrode section to the IDT electrode in the receiving-side filter region can be reduced. Therefore, isolation characteristics can be further improved.

The conductor layer may be formed on the other surface of the piezoelectric substrate, except for a region opposed to the transmission-side filter region and/or a region opposed to the receiving-side filter region on the other surface of the piezoelectric substrate. At this time, all parasitic capacitances formed between a plurality of IDT electrodes or a connection electrode for connecting the IDT electrodes and input-output electrode sections can be further reliably reduced, thereby allowing isolation characteristics to be further improved.

The conductor layer may have, in the region opposed to the input electrode section in the transmission-side filter region and/or the region opposed to the output electrode section in the receiving-side filter region on the other surface of the piezoelectric substrate, an isolation section isolated from the other region.

According to this configuration, a parasitic capacitance formed between the input electrode section in the transmission-side filter and the output electrode section in the receiving-side filter can be isolated by the isolation section. Therefore, a coupling amount can be made significantly smaller than that in a case where the conductor layer is formed throughout the other surface as in the conventional example. Therefore, degradation of isolation characteristics caused by the parasitic capacitance can be restrained, thereby allowing the isolation characteristics to be improved.

The conductor layer may have, in the region opposed to the portion connected directly from the input electrode section to the IDT electrode in the transmission-side filter region and/or the region opposed to the portion connected directly from the output electrode section to the IDT electrode in the receiving-side filter region on the other surface of the piezoelectric substrate, an isolation section isolated from the other region.

According to this configuration, a coupling amount based on a parasitic capacitance formed by the portion connected directly from the input electrode section to the IDT electrode in the transmission-side filter region and the portion connected directly from the output electrode section to the IDT electrode in the receiving-side filter region can be reduced, thereby allowing degradation of isolation characteristics caused by the parasitic capacitance to be restrained.

The conductor layer may have, in the region opposed to the transmission-side filter region and/or the region, opposed to the receiving-side filter region on the other surface of the piezoelectric substrate, an isolation section isolated from the other region.

According to this surface acoustic wave device, a coupling amount through a parasitic capacitance formed between a connection electrode for connecting a plurality of IDT electrodes forming each of the filter regions or the IDT electrodes themselves and the input-output electrode sections through the parasitic capacitance between the filter regions can be further reduced, thereby making it possible to restrain degradation of isolation characteristics caused by the parasitic capacitance.

The conductor layer may be formed on the other surface of the piezoelectric substrate with the region opposed to the transmission-side filter region and the region opposed to the receiving-side filter region isolated from each other.

According to this surface acoustic wave device, a coupling amount caused by a parasitic capacitance formed between a connection electrode for connecting a plurality of IDT electrodes forming each of the filter regions or the IDT electrodes themselves and the input-output electrode sections through the parasitic capacitance between the filter regions can be further reduced, thereby making it possible to restrain degradation of isolation characteristics caused by the parasitic capacitance.

The conductor layer may be formed, in the region opposed to the transmission-side filter region and/or the region opposed to the receiving-side filter region on the other surface of the piezoelectric substrate, with the region opposed to the input electrode section in the transmission-side filter region and the region opposed to the output electrode section in the receiving-side filter region isolated from each other.

In this configuration, a conductor layer on the other surface corresponding to the input electrode section forming each of the filter regions and a conductor layer on the other surface corresponding to the output electrode section forming the filter region are formed in a isolated manner. Therefore, coupling through a parasitic capacitance between the input electrode section and the output electrode section that form the filter regions can be restrained, thereby allowing attenuation characteristics in the vicinity of the pass band of the filter to be improved. Consequently, isolation characteristics between the filters can be improved.

The conductor layer may be formed on the other surface of the piezoelectric substrate with a large number of conductor-unformed regions dispersed.

According to the surface acoustic wave device in the present invention, the conductor layer formed on the other surface of the piezoelectric substrate is formed with the large number of conductor-unformed regions dispersed. Therefore, a parasitic capacitance formed between the input electrode section in the transmission-side filter region and the output electrode section in the receiving-side filter region can be made smaller than that in a case where the conductor layer is formed throughout the other surface as in the conventional example. Therefore, degradation of isolation characteristics caused by the parasitic capacitance can be restrained in correspondence with a reduced area of the conductor layer on the other surface, thereby allowing the isolation characteristics to be improved.

It is preferable that in the region opposed to the input electrode section in the transmission-side filter region and/or the region opposed to the output electrode section in the receiving-side filter region on the other surface of the piezoelectric substrate, the ratio of an area occupied by the conductor-unformed regions is higher than that in the other region.

According to this configuration, a parasitic capacitance formed between the input electrode section in the transmission-side filter region and the output electrode section in the receiving-side filter region can be further reduced, thereby allowing isolation characteristics to be further improved.

In the region opposed to the portion connected directly from the input electrode section to the IDT electrode in the transmission-side filter region and/or the region opposed to the portion connected directly from the output electrode section to the IDT electrode in the receiving-side filter region on the other surface of the piezoelectric substrate, the ratio of an area occupied by the conductor-unformed regions may be higher than that in the other region.

Also in this case, a parasitic capacitance formed between the input electrode section in the transmission-side filter region and the output electrode section in the receiving-side filter region can be further reduced, thereby allowing isolation characteristics to be further improved.

When the surface roughness of the conductor-unformed regions on the other surface of the piezoelectric substrate is higher than the surface roughness of a region where the conductor layer is formed, an amount of degradation by the propagation of a bulk wave out of degradation factors of out-of-band attenuation characteristics can be also reduced. Therefore, the out-of-band attenuation characteristics can be more significantly improved.

The out-of-band attenuation is degraded due to capacitive coupling between the input and output electrode sections, and is also degraded by an acoustic wave that is changed into a bulk wave without being converted into a surface acoustic wave by the IDT electrode propagating in the piezoelectric substrate, being reflected on the other surface of the piezoelectric substrate and an end surface of the surface acoustic wave element, and being coupled to the IDT electrode formed in the filter region again.

Although the amount of degradation by the propagation of the bulk wave is smaller than the effect of a parasitic capacitance, it is preferable that the degradation by the bulk wave is also restrained in order to completely satisfy a strict requirement for the out-of-band attenuation characteristics.

Therefore, the surface roughness on the other surface of a region from which the conductor layer on the other surface of the piezoelectric substrate is removed is made higher than the surface roughness on the other surface of a region where the conductor layer is formed, so that the bulk wave is scattered on the other surface of the piezoelectric substrate that is made partially coarse. Therefore, it is possible for the bulk wave generated from the IDT electrode formed in the filter region not to be sufficiently coupled again to the IDT electrode, thereby allowing the out-of-band attenuation characteristics to be further improved.

When an annular electrode is formed so as to enclose the filter region on the main surface of the piezoelectric substrate, and the annular electrode is joined to a mounting substrate-side annular conductor formed on the mounting substrate, the surface acoustic wave element can be mounted on the mounting substrate firmly and in a state where the IDT electrode and the input and output electrode sections are hermetically sealed by joining the annular electrode and the mounting substrate-side annular conductor. In processing the conductor layer on the other surface of the piezoelectric substrate after mounting the surface acoustic wave element on the mounting substrate, as described later, therefore, the conductor layer can be also processed without damaging the IDT electrode formed on the main surface of the piezoelectric substrate.

The shape of the annular electrode may be a shape separately enclosing the transmission-side filter region and the receiving-side filter region, or may be a shape enclosing both the filter regions.

When the IDT electrode is electrically connected to the annular electrode through a resistor, and the annular electrode is at a ground potential, the IDT electrode is at a ground potential directly, while being brought into a state where it is almost insulated from the ground potential in a frequency band where the surface acoustic wave device is employed. Therefore, charges can be prevented from being stored in the IDT electrode without affecting the pass characteristics of the filter region. Even if there is no conductor layer throughout the other surface of the piezoelectric substrate, therefore, pyroelectric destruction of the surface acoustic wave device can be reliably prevented.

It is preferable that the piezoelectric substrate is composed of a lithium tantalate single crystal or a lithium niobate single crystal or a lithium tetraborate single crystal, the oxygen content of which is lower than a stoichiometric composition ratio. The piezoelectric substrate in this case has the property of looking like a conductor directly, similarly to a resistor for electrically connecting the IDT electrode to the annular electrode, while almost looking like an insulator in a frequency band where the surface acoustic wave device is employed. Consequently, charges can be prevented from being stored in the IDT electrode without affecting the pass band characteristics of the filter by employing the piezoelectric substrate as a substrate of the surface acoustic wave device. Even if there is not whole conductor layer throughout the other surface of the piezoelectric substrate, pyroelectric destruction of the surface acoustic wave device can be satisfactorily prevented. Moreover, the number of steps in the manufacturing process of the surface acoustic wave device need not be increased in order to prevent the pyroelectric destruction.

The piezoelectric substrate may be an overlapping of two material layers, and may be composed of a piezoelectric material on the side of its main surface and a material having a lower dielectric constant than that of the piezoelectric material on the side of the other surface.

When the piezoelectric substrate is composed of the piezoelectric material on the side of the main surface and is composed of the dielectric material having a lower dielectric constant than the piezoelectric material on the side of the other surface, an effective dielectric constant between the input electrode section and the output electrode section in the filter region can be reduced. This also allows a parasitic capacitance to be reduced (this corresponds to reduction in the dielectric constant between the electrode sections forming the parasitic capacitance).

Accordingly, out-of-band attenuation characteristics can be further improved. Particularly when a lithium tantalate single crystal or a lithium niobate single crystal or a lithium tetraborate single crystal, the oxygen content of which is lower than a stoichiometric composition ratio, is employed as the piezoelectric material, both the effect of satisfactorily preventing pyroelectric destruction and the effect of reducing the effective dielectric constant can be obtained.

In order to manufacture the surface acoustic wave device according to the present invention, the following method of manufacturing the surface acoustic wave device according to the present invention is suitable.

The method of manufacturing the surface acoustic wave device according to the present invention comprises an electrode layer formation step for forming an electrode layer on a main surface of a piezoelectric substrate; an electrode patterning step for patterning the electrode layer on the main surface to form a filter region comprising an IDT electrode, an input electrode section, and an output electrode section; and a step of carrying out either one of an separation step for separating the piezoelectric substrate to obtain a large number of surface acoustic wave elements and a mounting step for mounting the surface acoustic wave elements on a mounting substrate with the main surface of the piezoelectric substrate opposed thereto prior to carrying out the other step, a partial conductor layer formation step for partially forming a conductor layer on the other surface of the piezoelectric substrate being provided.

According to this manufacturing method, processing for the conductor layer on the other surface can be performed in a batch manner for the piezoelectric substrate having the large number of surface acoustic wave elements integrally formed thereon, which is efficient.

The partial conductor layer formation step may comprise a conductor layer formation step for forming a conductor layer on the other surface of the piezoelectric substrate before the electrode layer formation step, between the electrode layer formation step and the electrode patterning step, or between the electrode patterning step and the separation step or the mounting step, and a removal step for removing a portion, corresponding to the conductor-unformed regions, of the conductor layer formed on the other surface after the conductor layer formation step.

Processing for removing the conductor layer on the other surface can be performed in a batch manner for the piezoelectric substrate having the large number of surface acoustic wave elements integrally formed thereon, which is efficient in the removal step.

The partial conductor layer formation step may be a step of previously setting a conductor-unformed region where no conductor layer is formed and forming a conductor layer in a region other than the conductor-unformed region.

It is preferable that in partially removing the conductor layer formed on the other surface in the removal step, the surface roughness on the other surface of a region to be removed is higher than the surface roughness on the other surface of a region that is not removed.

According to this method, degradation of out-of-band attenuation characteristics by the propagation of a bulk wave can be efficiently restrained without increasing the danger of damage to the piezoelectric substrate that is made progressively thinner. If the surface roughness on the whole of the other surface is made larger, the piezoelectric substrate may be deteriorated during manufacturing steps. This deterioration will occur in high probability when the piezoelectric substrate is made thinner with respect to demands for compactness of the device.

Further, this can be carried out simultaneously with a measure against degradation of out-of-band attenuation characteristics due to a parasitic capacitance, which is efficient.

A communications equipment according to the present invention comprises at least one of a receiving circuit and a transmission circuit each having the above-mentioned surface acoustic wave device.

According to the communications equipment in the present invention, the communications equipment can satisfy a strict out-of-band attenuation that has been conventionally required by using the surface acoustic wave device according to the present invention in the communications equipment. Further, the surface acoustic wave device is small in size, although it has good out-of-band attenuation characteristics. Therefore, the mounting areas of other components can be increased, so that options for the components are broadened, thereby making it possible to realize a high-functional communications equipment.

The communications equipment according to the present invention uses the above-mentioned surface acoustic wave device as a branching filter. By using the surface acoustic wave device according to the present invention as a branching filter, a communications equipment can satisfy strict isolation characteristics required for the branching filter is obtained. Further, the surface acoustic wave device is small in size, although it is a branching filter having good isolation characteristics. Therefore, the mounting areas of other components can be increased, so that options for the components are broadened, thereby making it possible to realize a high-functional communications equipment.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 33($a$) to 33($j$) are cross-sectional views showing the steps of a method of manufacturing a surface acoustic wave device according to the present invention;

FIGS. 34($a$) to 34($j$) are cross-sectional views showing the steps of another method of manufacturing a surface acoustic wave device according to the present invention;

FIG. 35($b$) is a graph showing an example of isolation characteristics in a case where there is no parasitic capacitance;

FIG. 35($c$) is a circuit diagram of a communications equipment in a case where there is a parasitic capacitance C;

FIG. 35($d$) is a graph showing an example of isolation characteristics in a case where there is a parasitic capacitance;

DETAILED DESCRIPTION OF PREFERRED EMBODIMENTS

<Surface Acoustic Wave Element>

Figure 1:
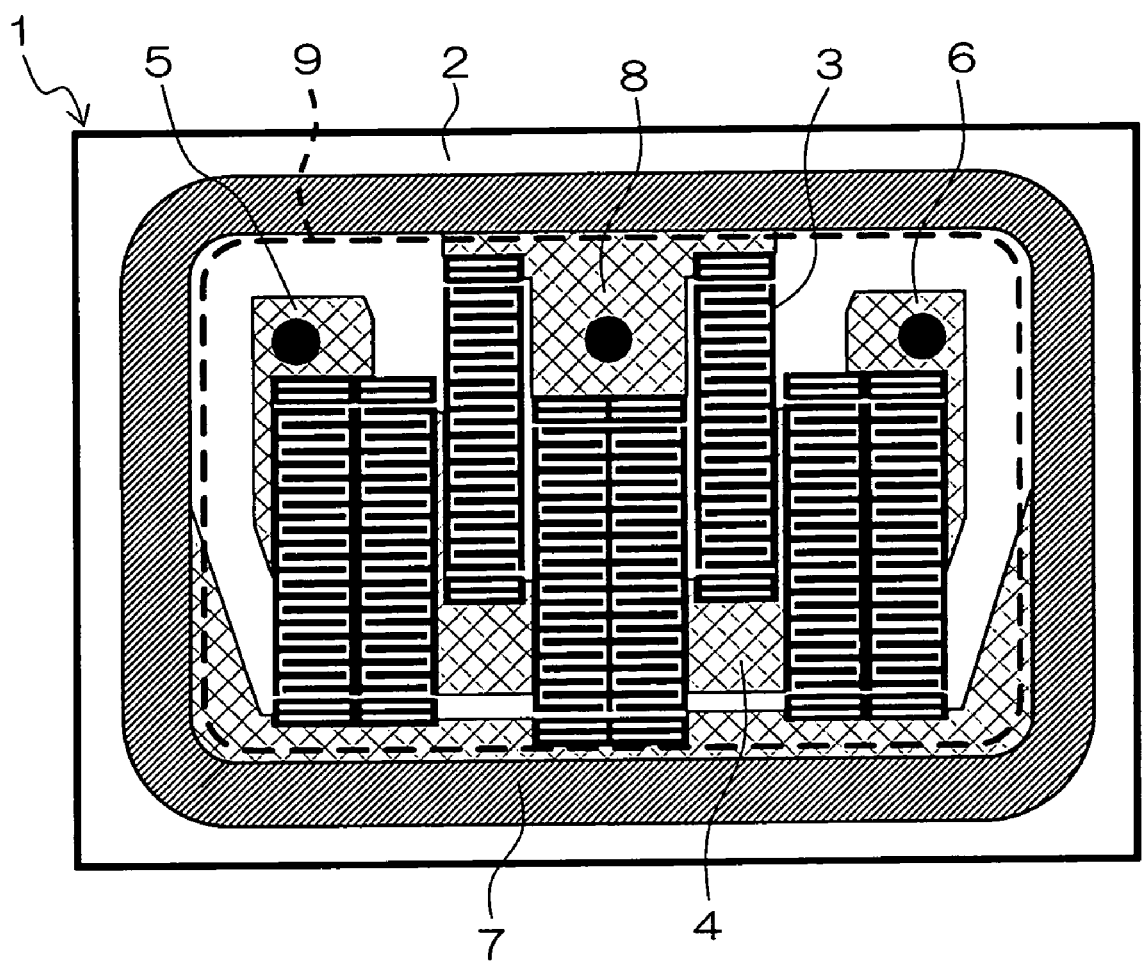
FIG. 1 is a plan view showing a main surface of a piezoelectric substrate in which a surface acoustic wave element serving as a constituent element of a surface acoustic wave device according to the present invention is formed.

FIG. 1 is a plan view showing a main surface of a piezoelectric substrate having a surface acoustic wave element, serving as a constituent element of a surface acoustic wave device according to the present invention, formed therein.

As shown in FIG. 1, a filter region 9 is formed on an IDT electrode formation surface (referred to as a main surface) of a piezoelectric substrate 2. A plurality of IDT electrodes 3 composing a ladder-type filter, a connection electrode 4 for connecting the IDT electrodes 3, and an input electrode section 5 and an output electrode section 6 that are electrically connected to the IDT electrodes 3 so as to connect a surface acoustic wave element 1 and a mounting substrate (not shown) are formed in the filter region 9.

Reference numeral 7 denotes an annular electrode of a square frame shape formed so as to enclose the IDT electrodes 3, the connection electrode 4, the input electrode section 5, the output electrode section 6, and a ground electrode 8 (hereinafter referred to as IDT electrodes and others). Reference numeral 8 denotes a ground electrode. The ground electrode 8 is connected to the annular electrode 7.

The annular electrode 7 is connected to an annular conductor on the side of the mounting substrate (hereinafter referred to as a mounting substrate-side annular conductor) using a solder or the like, to function as a ground electrode in a surface acoustic wave filter as well as to serve to seal a space between the piezoelectric substrate 2 and the mounting substrate.

In the surface acoustic wave element 1, a conductor layer having conductor-unformed regions in its part is formed on a surface opposite to the surface on which the IDT electrodes and others are formed (referred to as the other surface) of the piezoelectric substrate 2. This makes it possible to reduce capacitive coupling occurring between the input electrode section 5 and the output electrode section 6 in the filter region 9 through a parasitic capacitance generated between the electrode sections and the conductor layer, thereby allowing the out-of-band attenuation characteristics of the surface acoustic wave element 1 to be improved.

Although the annular electrode 7 is utilized as the ground electrode in the surface acoustic wave element 1 in this example, the annular electrode 7 may not be used as the ground electrode. For example, the ground electrode 8 in the surface acoustic wave element 1 may be directly connected to a ground electrode in the mounting substrate.

The above-mentioned surface acoustic wave element 1 is mounted on the mounting substrate with the main surface of the piezoelectric substrate 2 opposed to an upper surface of the mounting substrate, thereby constituting the surface acoustic wave device.

Figure 2:
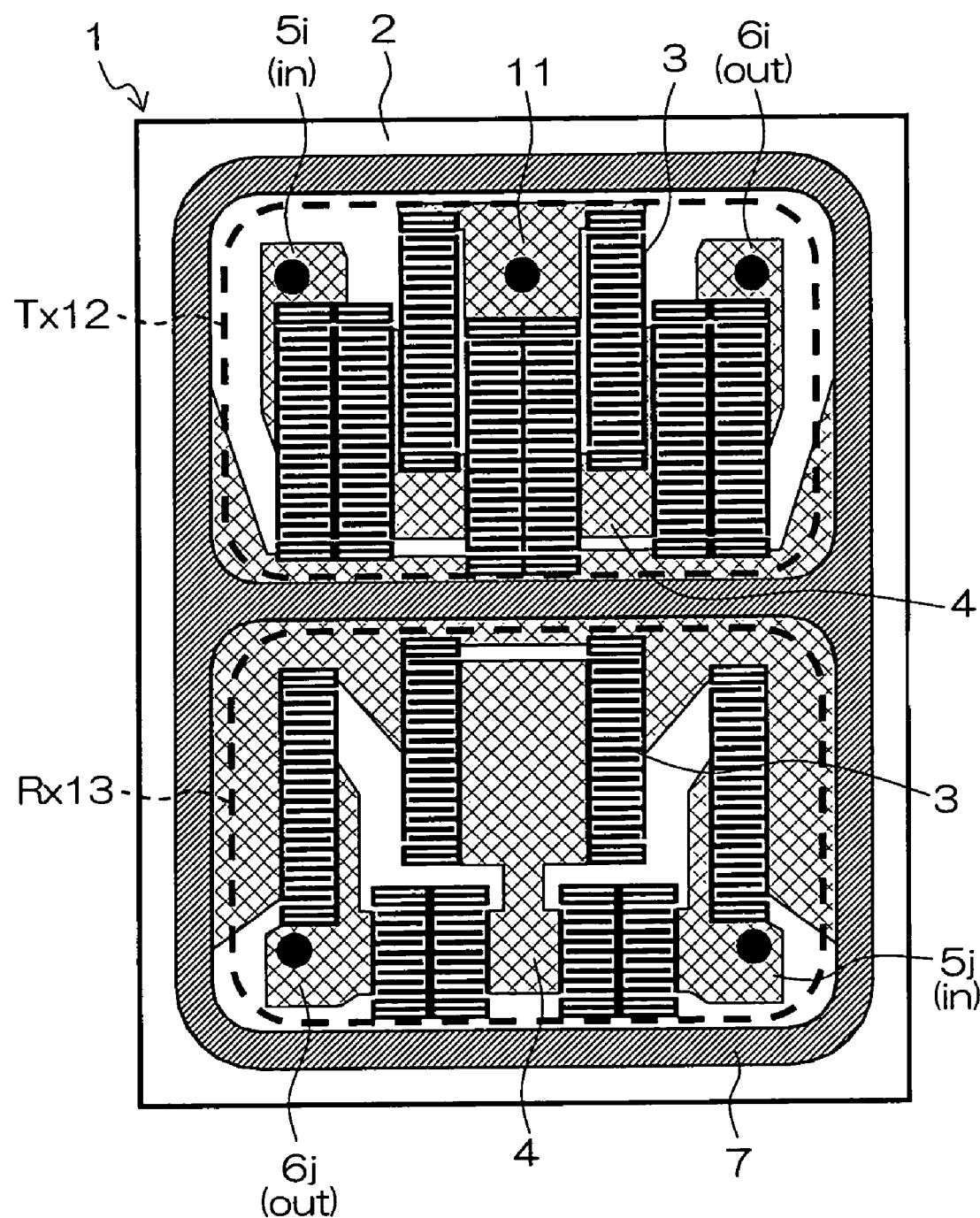
FIG. 2 is a plan view showing a main surface of a surface acoustic wave element having a transmission-side filter and a receiving-side filter formed therein.

FIG. 2 is a plan view showing a main surface of another surface acoustic wave element 1 manufactured according to the present invention.

The surface acoustic wave element 1 is an example in which two ladder-type surface acoustic wave elements are used, to constitute a duplexer. Two filter regions are formed, respectively compose a transmission-side filter and a receiving-side filter.

As shown in FIG. 2, a transmission-side filter region 12 and a receiving-side filter region 13 are formed on a piezoelectric substrate 2. In the transmission-side filter region 12, a plurality of IDT electrodes 3 composing an IDT electrode and a connection electrode 4 for connecting the IDT electrodes 3, and an input electrode section 5i and an output electrode section 6i that are electrically connected to the IDT electrodes 3 for connecting the surface acoustic wave element 1 and a mounting substrate (not shown) are formed.

Similarly, in the receiving-side filter region 13, a plurality of IDT electrodes 3 composing an IDT electrode and a connection electrode 4 for connecting the IDT electrodes 3, and an input electrode section 5j and an output electrode section 6j that are electrically connected to the IDT electrodes 3 for connecting the surface acoustic wave element 1 and the mounting substrate are formed.

An annular electrode 7 is formed so as to individually enclose the transmission-side filter region 12 and the receiving-side filter region 13. The annular electrode 7 is connected to a mounting substrate-side annular conductor formed on an upper surface of the mounting substrate using a solder or the like in correspondence therewith.

In this example, the annular electrode 7 is integrally formed so as to individually enclose the transmission-side filter region 12 and the receiving-side filter region 13, to function as a ground electrode in the receiving-side filter composed of the receiving-side filter region 13 as well as to serve to separately seal the transmission-side filter region 12 and the receiving-side filter region 13 between the piezoelectric substrate 2 and the mounting substrate.

Also in the surface acoustic wave element 1, a conductor layer having conductor-unformed regions in its part is formed on a surface opposite to the surface on which the IDT electrodes and others are formed (referred to as the other surface) of the piezoelectric substrate 2. This makes it possible to reduce capacitive coupling occurring between the input electrode section 5i in the transmission-side filter region 12 and the output electrode section 6j in the receiving-side filter region 13 through a parasitic capacitance generated between the electrode sections and a conductor layer, thereby allowing the out-of-band attenuation characteristics of the surface acoustic wave element 1 to be improved.

In this example, a ground electrode 11 in the transmission-side filter composed of the transmission-side filter region 12 is not connected to the annular electrode 7 on the piezoelectric substrate 2. The transmission-side filter is grounded by connecting the ground electrode 11 to a ground electrode in the mounting substrate using a solder bump or the like. Particularly when the pass band of the transmission-side filter is positioned on the lower frequency side than the pass band of the receiving-side filter, a configuration in which the ground electrode 11 in the transmission-side filter is not connected to the annular electrode 7 is desirable in obtaining a high attenuation at a frequency, corresponding to the pass band of the receiving-side filter on the high frequency side, in the pass band of the transmission-side filter.

Conversely, the transmission-side filter may be directly connected to the ground electrode in the mounting substrate using the annular electrode 7 as the ground electrode in the transmission-side filter. On the other hand, the receiving-side filter may be also directly connected to the ground electrode in the mounting substrate without using the annular electrode 7 as the ground electrode, similarly to the transmission-side filter.

Figure 3:
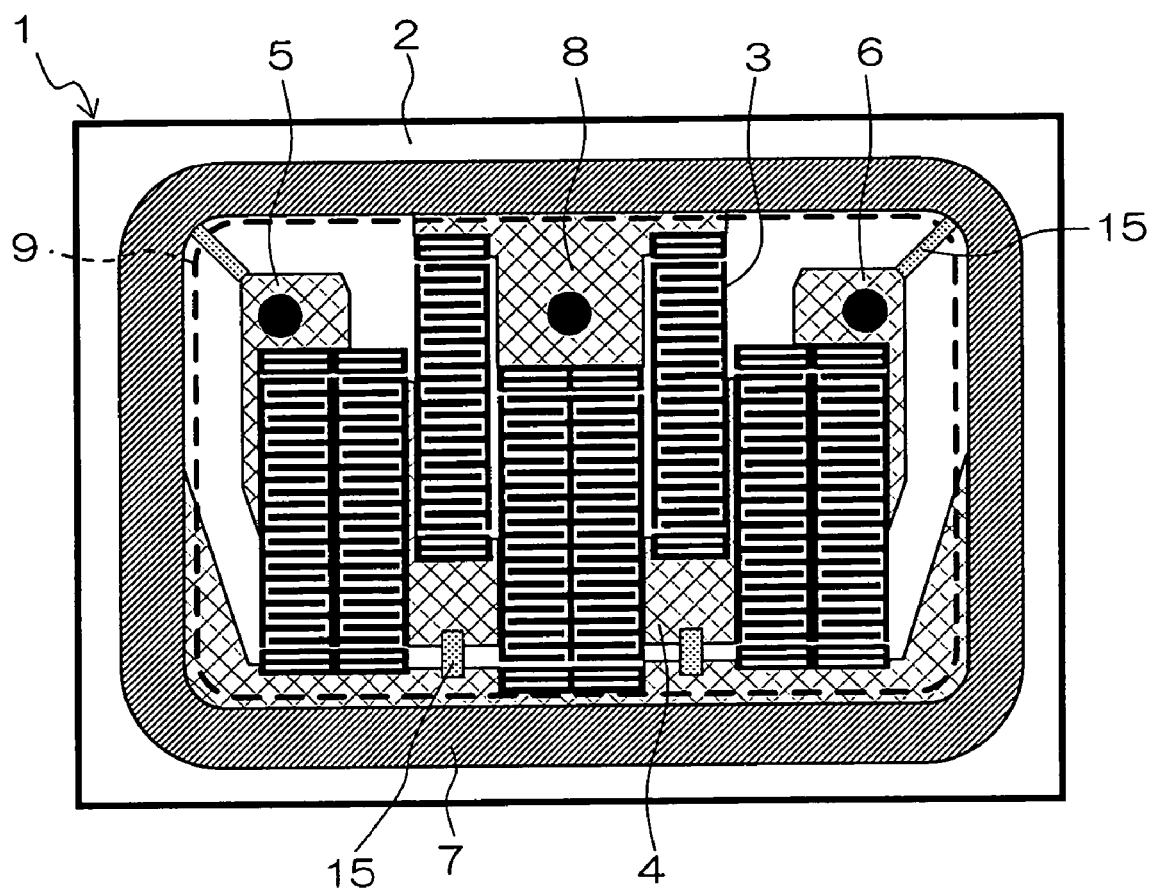
FIG. 3 is a plan view showing a main surface of a piezoelectric substrate in another surface acoustic wave element.

FIG. 3 is a plan view showing a main surface of a piezoelectric substrate 2 in still another example of a surface acoustic wave element 1.

In this example, on the side of the main surface of the piezoelectric substrate 2, IDT electrodes 3 and an annular electrode 7 are connected to each other through a resistor 15 such that the IDT electrodes 3 are rendered non-conductive to the annular electrode 7 in a high-frequency manner, while being rendered conductive thereto directly. The annular electrode 7 is at a ground potential by being connected to a mounting substrate-side annular conductor.

Figure 4:
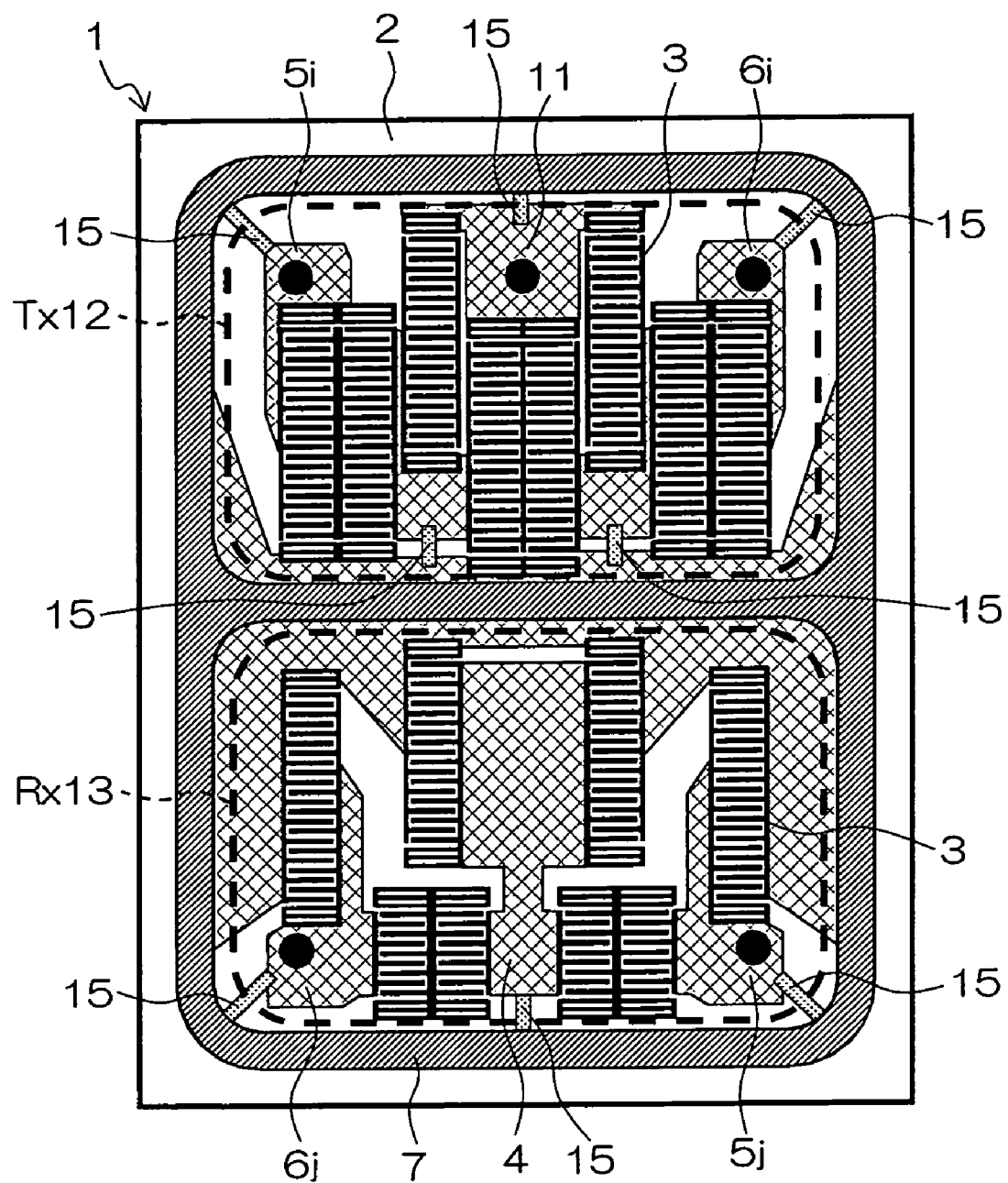
FIG. 4 is a plan view showing a main surface of a piezoelectric substrate in still another surface acoustic wave element.

Furthermore, FIG. 4 is a plan view showing a main surface of a piezoelectric substrate 2 in a surface acoustic wave element 1 having two filter regions formed therein.

Also in this example, IDT electrodes 3 and an annular electrode 7 are connected to each other through a resistor 15 in each of the two filter regions on the side of a main surface of a piezoelectric substrate 2. Further, the annular electrode 7 is at a ground potential by being connected to a mounting substrate-side annular conductor.

In such a manner, the IDT electrodes 3 are electrically connected to the annular electrode 7 through the resistor 15. The annular electrode 7 is at a ground potential. This allows charges to be emitted to a ground electrode in a mounting substrate from the main surface of the piezoelectric substrate 2, thereby making it possible to effectively prevent pyroelectric destruction of the surface acoustic wave element 1.

The resistor 15 has a sufficiently high resistance in a frequency band in which a filter is used, to select a resistance value at which it almost looks like an insulator. High-resistance semiconductors such as silicon and titanium oxide are suitably used as materials for the resistor 15. The resistance value of the material can be controlled to an appropriate value by adding an element such as boron in small amounts or adjusting the composition ratio thereof.

Materials for the above-mentioned surface acoustic wave element will be described.

In order to prevent pyroelectric destruction, a lithium tantalate single crystal or a lithium niobate single crystal or a lithium tetraborate single crystal, the oxygen content of which is lower than a stoichiometric composition ratio, may be used as the piezoelectric substrate 2.

The material has the property of having a sufficiently high resistance in a frequency band in which a filter is used even if it looks like a conductor directly and almost acting as an insulator, similarly to the above-mentioned resistor 15. By using the material for the piezoelectric substrate 2, therefore, charges can be prevented from being stored in the IDT electrode 3 without affecting the pass band characteristics of the filter. Even if there is no conductor layer 10 throughout the other surface of the piezoelectric substrate 2, therefore, pyroelectric destruction of the surface acoustic wave element 1 can be satisfactorily prevented. Moreover, the material is also advantageous in that the number of steps is not increased in the manufacturing process of the surface acoustic wave device in order to prevent the pyroelectric destruction.

In order to reduce a parasitic capacitance, it is also effective to reduce an effective dielectric constant between the IDT electrodes and others on the main surface of the piezoelectric substrate 2 and the conductor layer 10 on the other surface thereof.

Therefore, used as the surface acoustic wave element 1 is one in which a piezoelectric substrate 2 has a double laminated structure that is composed of a piezoelectric material such as a lithium tantalate single crystal or a lithium niobate single crystal on the side of its main surface and is composed of a material having a lower dielectric constant than that of the piezoelectric material on the side of the main surface on the side of the other surface. This configuration makes it feasible to reduce the parasitic capacitance while ensuring necessary piezoelectric characteristics.

Various types of piezoelectric materials used for the surface acoustic wave element may be used as piezoelectric materials having high dielectric constants. Particularly when the above-mentioned lithium tantalate single crystal or lithium niobate single crystal or lithium tetraborate single crystal, the oxygen content of which is lower than a stoichiometric composition ratio, is used, however, both the effect of satisfactorily preventing the pyroelectric destruction and the effect of reducing the effective dielectric constant can be obtained. On the other hand, usable as dielectric materials having low dielectric constants are crystal, silicon, silicon carbide, glass, sapphire, etc.

Such a piezoelectric substrate 2 composed of two types of materials can be obtained by bonding a substrate composed of the piezoelectric material and a substrate composed of the dielectric material.

<Pattern of Conductor Layer>

Figure 5:
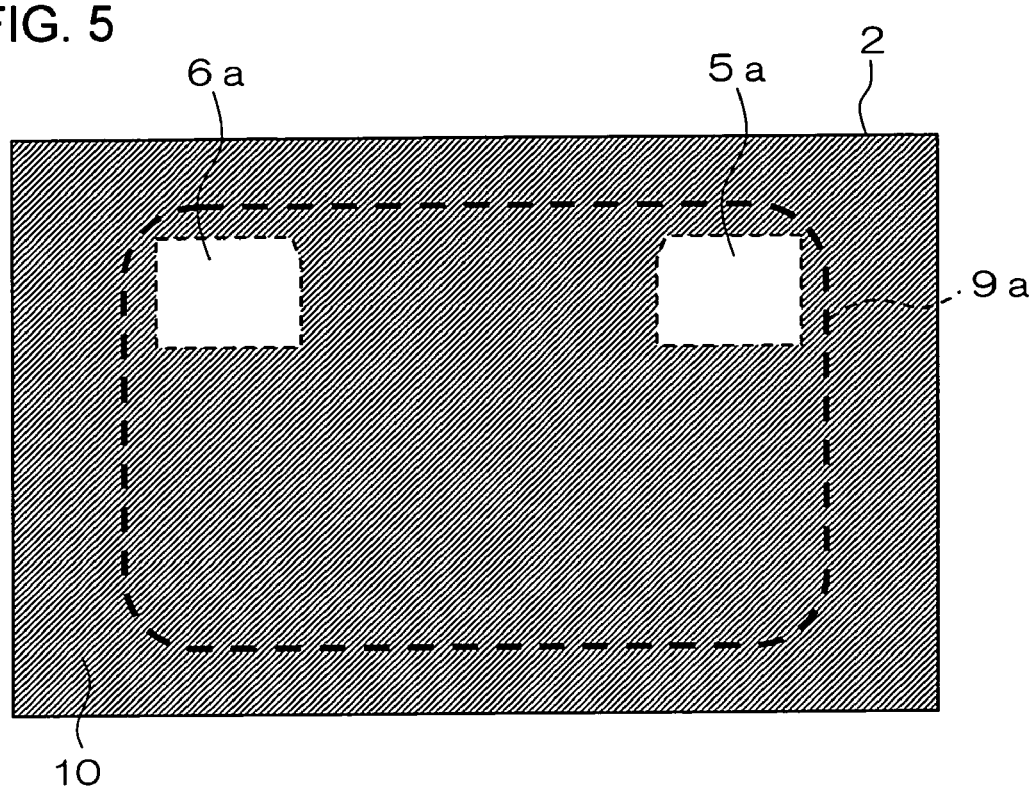
FIG. 5 is a plan view showing an example of a pattern of a conductor layer formed on the other surface of a surface acoustic wave element, except for regions respectively opposed to an input electrode section 5 and an output electrode section 6 in a filter region.

A plan view of the other surface of a surface acoustic wave element is shown in FIG. 5.

Although the configuration on the side of a main surface of a piezoelectric substrate 2 is the same as those shown in FIGS. 1 and 3, a conductor layer 10 is formed on the other surface of the piezoelectric substrate 2, as shown in FIG. 5.

The conductor layer 10 is formed except for a region 5a opposed to an input electrode section 5 in a filter region 9 on the main surface of the piezoelectric substrate 2 and a region 6a opposed to an output electrode section 6 in the filter region 9. The regions 5a and 6a serve as conductor-unformed regions. In FIG. 5, reference numeral 9a denotes a region opposed to the filter region 9.

By thus forming the conductor layer 10 except for the regions 5a and 6a, the input electrode section 5 and the output electrode section 6 in the filter region 9 can be prevented from being capacitive-coupled to each other through a parasitic capacitance generated between the electrode sections and the conductor layer 10. Consequently, out-of-band attenuation characteristics can be improved.

Although a pattern having no conductor layer 10 in both the region 5a opposed to the input electrode section 5 and the region 6a opposed to the output electrode section 6 in the filter region 9 on the other surface of the piezoelectric substrate 2 is illustrated in this example, the effect of improving the out-of-band attenuation characteristics is obtained to some extent even if there is no conductor layer 10 in at least one of the regions 5a and 6a.

Figure 6:
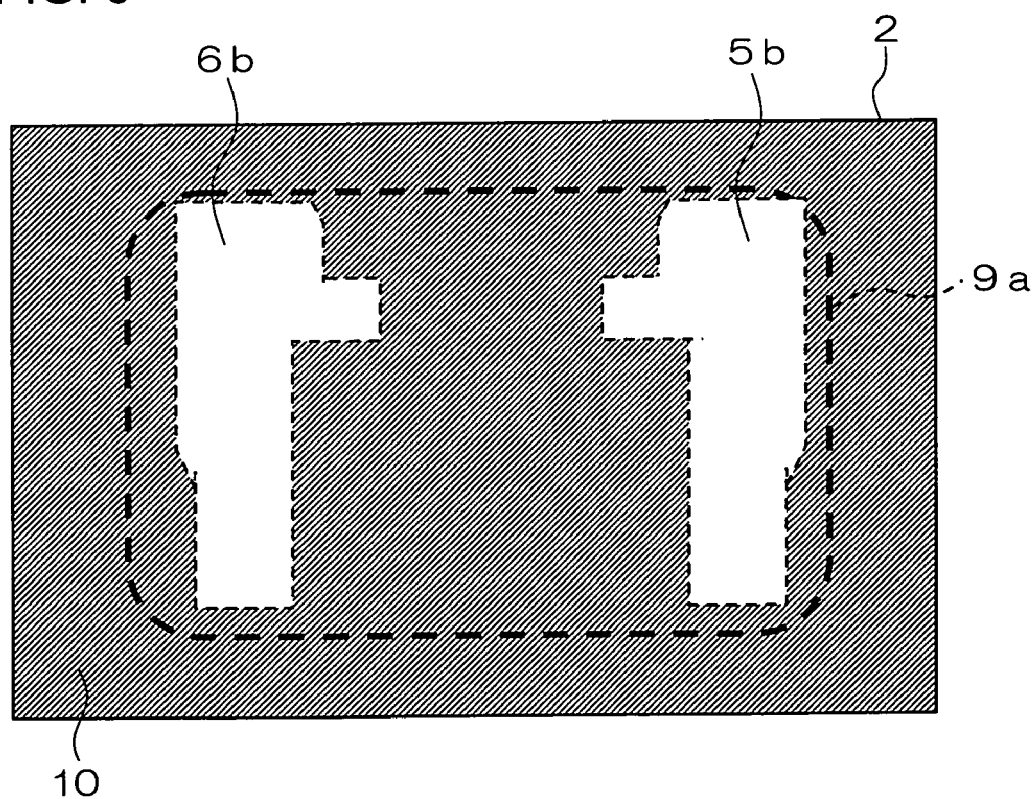
FIG. 6 is a plan view showing an example of another pattern of a conductor layer formed on the other surface of a surface acoustic wave element.

FIG. 6 is a plan view showing another pattern of a conductor layer 10.

In this example, the pattern of the conductor layer 10 on the other surface differs from that shown in FIG. 5.

Although the pattern having no conductor layer 10 in the region 5a opposed to the input electrode section 5 and the region 6a opposed to the output electrode section 6 on the other surface of the piezoelectric substrate 2 is used in FIG. 5, the conductor layer 10 is formed except for a region 5b opposed to a portion connected directly from an input electrode section 5 to IDT electrodes 3 in a filter region 9 on a main surface of a piezoelectric substrate 2 and a region 6b opposed to a portion connected directly from an output electrode section 6 to the IDT electrodes 3 in the filter region 9 in the example shown in FIG. 6.

By thus forming the conductor layer 10 except for the region 5b and the region 6b, a parasitic capacitance can be further reduced, and capacitive coupling through the parasitic capacitance can be reliably restrained.

Figure 7:
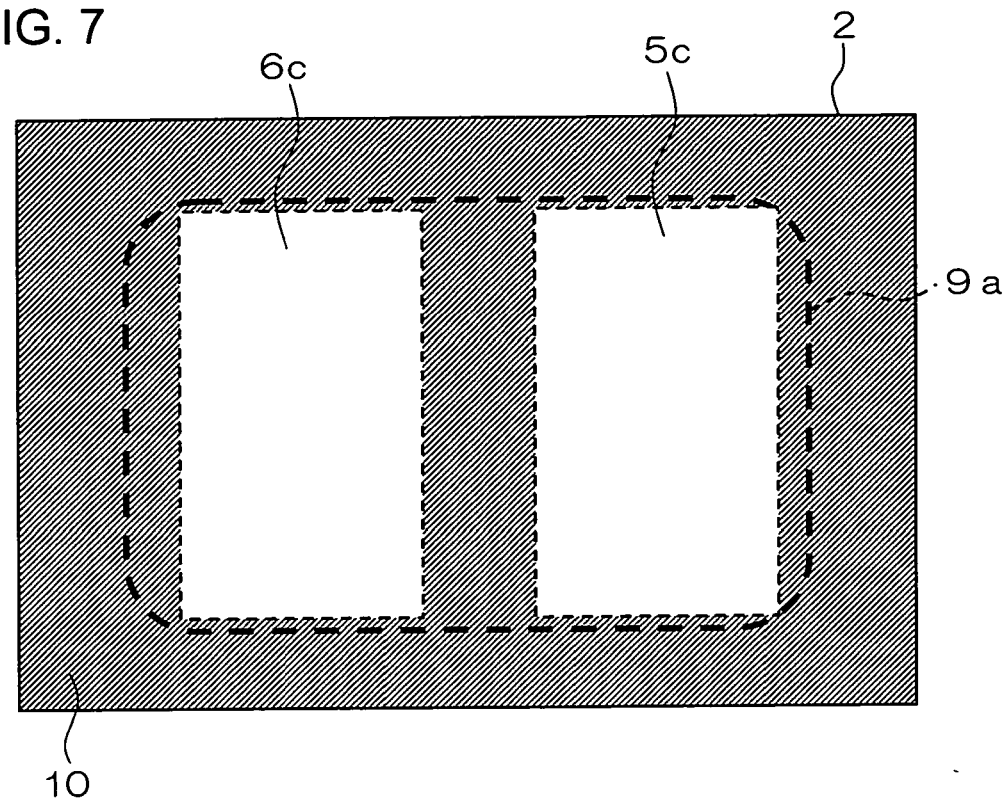
FIG. 7 is a plan view showing an example of still another pattern of a conductor layer formed on the other surface of a surface acoustic wave element.

FIG. 7 is a plan view showing a simple pattern of a region 5c opposed to the whole of the portion connected directly from the input electrode section 5 to the IDT electrodes 3 in the filter region 9 on the main surface of the piezoelectric substrate 2 and a region 6c opposed to the whole of the portion connected directly from the output electrode section 6 to the IDT electrodes 3 in the filter region 9.

Even if conductor-unformed regions are thus composed of a simple rectangular pattern, a higher effect of reducing capacitive coupling through a parasitic capacitance is obtained, as in FIG. 6.

Figure 8:
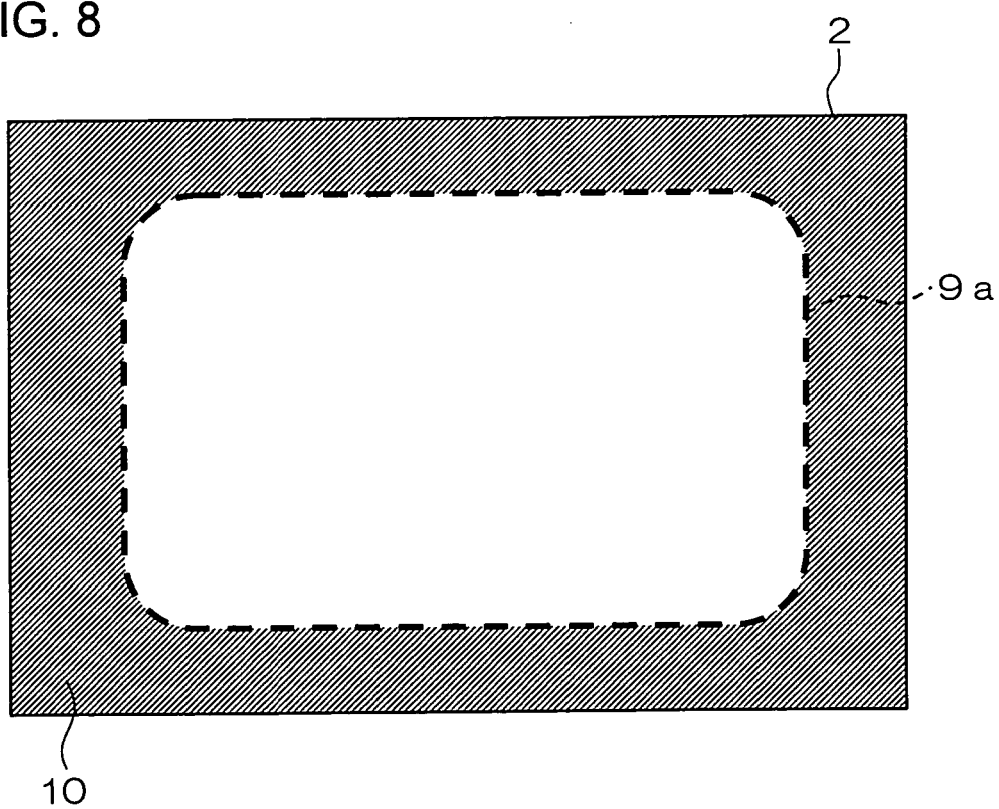
FIG. 8 is a plan view showing an example of a further pattern of a conductor layer formed on the other surface of a surface acoustic wave element.

FIG. 8 is a plan view showing the other surface of a surface acoustic wave element.

In this example, a conductor layer 10 is formed on the other surface of a piezoelectric substrate 2 except for a region 9a opposed to the whole of a filter region 9 on a main surface of the piezoelectric substrate 2 in order to further reliably restrain capacitive coupling through a parasitic capacitance.

In a case where the region 9a, opposed to the filter region 9 on the piezoelectric substrate 2, in the conductor layer 10 is removed, as in the example shown in FIG. 8, the surface roughness of the region 9a from which the conductor layer 10 is removed on the other surface of the piezoelectric substrate 2 may be higher than the surface roughness of a region where the conductor layer 10 is formed.

This allows the propagation of a bulk wave inside the piezoelectric substrate 2 to be more reliably restrained in a wider area. An amount of degradation by the propagation of the bulk wave out of degradation factors of out-of-band attenuation characteristics can be effectively reduced. Therefore, it can be expected that the out-of-band attenuation characteristics are more significantly improved.

The effect of improving the out-of-band attenuation characteristics corresponding to the amount of degradation by the propagation of the bulk wave by making the surface roughness of the region from which the conductor layer 10 is removed higher than the surface roughness of the region where the conductor layer 10 is formed is the same as those in the examples shown in FIGS. 5 to 7.

Figure 9:
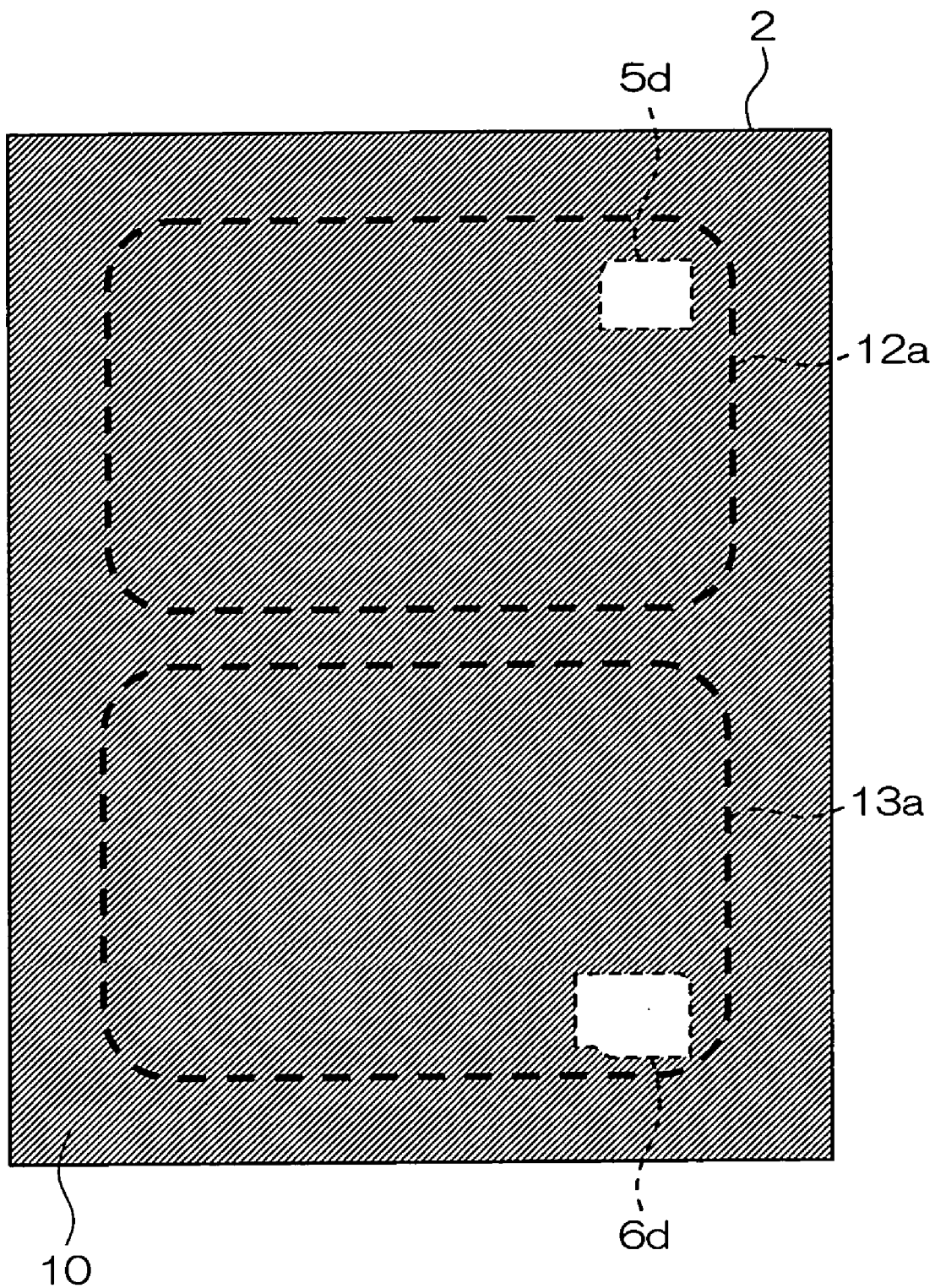
FIG. 9 is a plan view showing a pattern of a conductor layer on the other surface of a surface acoustic wave element in which a transmission-side filter and a receiving-side filter are formed on a piezoelectric substrate.

FIG. 9 is a plan view showing still another example of conductor-unformed regions.

A piezoelectric substrate 2 corresponds to the piezoelectric substrate having the transmission-side filter and the receiving-side filter shown in FIGS. 2 and 4.

In this example, a conductor layer 10, the pattern of which is illustrated in FIG. 9, is formed except for a region 5d opposed to an input electrode section 5i in a transmission-side filter region 12 on a main surface of the piezoelectric substrate 2 and a region 6d opposed to an output electrode section 6j in a receiving-side filter region 13 on the main surface.

By thus forming the conductor layer 10 except for the region 5d and the region 6d, the input electrode section 5i in the transmission-side filter and the output electrode section 6i in the receiving-side filter can be prevented from being capacitive-coupled to each other through a parasitic capacitance generated between the electrode sections and the conductor layer 10. Consequently, isolation characteristics between both the filters can be improved.

Although a pattern having no conductor layer 10 in both the region 5d and the region 6d on the other surface of the piezoelectric substrate 2 is illustrated in this example, the effect of improving the isolation characteristics to some extent is obtained if there is no conductor layer 10 in at least one of the regions 5d and 6d.

Figure 10:
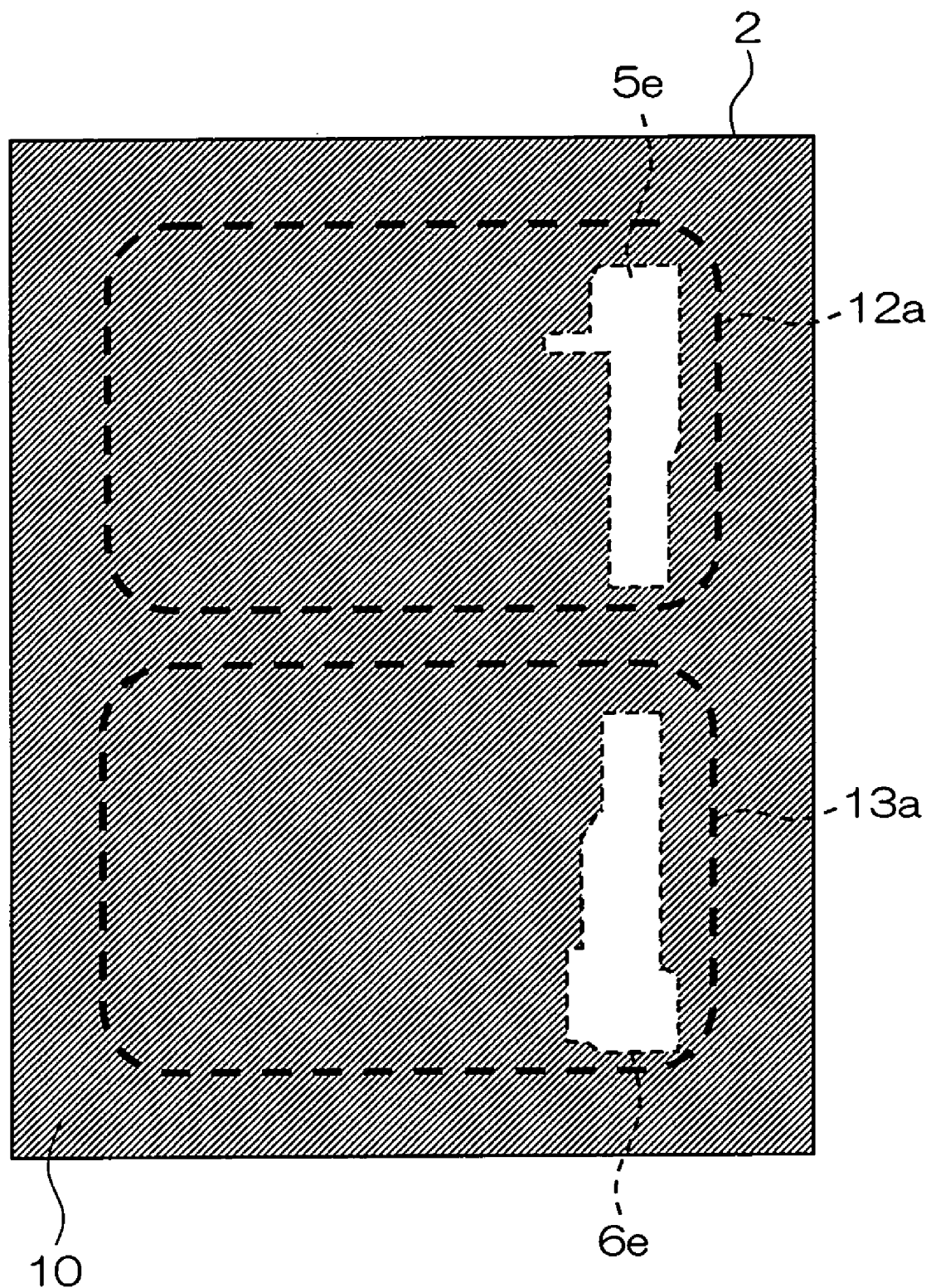
FIG. 10 is a plan view showing another pattern of a conductor layer.

FIG. 10 is a plan view showing a further example of conductor-unformed regions. A piezoelectric substrate 2 corresponds to the piezoelectric substrate having the transmission-side filter and the receiving-side filter shown in FIGS. 2 and 4.

Although the pattern having no conductor layer 10 in only the region 5d opposed to the input electrode section 5i in the transmission-side filter region 12 and the region 6d opposed to the output electrode section 6j in the receiving-side filter region 13 on the other surface of the piezoelectric substrate 2 is used in FIG. 9, a conductor layer 10 is formed except for a region 5e opposed to a portion connected directly from an input electrode section 5i to IDT electrodes 3 in a transmission-side filter region 12 on a main surface of the piezoelectric substrate 2 and a region 6e opposed to a portion connected directly from an output electrode section 6j to IDT electrodes 3 in a receiving-side filter region 13 on the main surface in FIG. 10.

By thus forming the conductor layer 10 except for the region 5e and the region 6e, a parasitic capacitance can be further reduced, and capacitive coupling through the parasitic capacitance can be reliably restrained.

Figure 11:
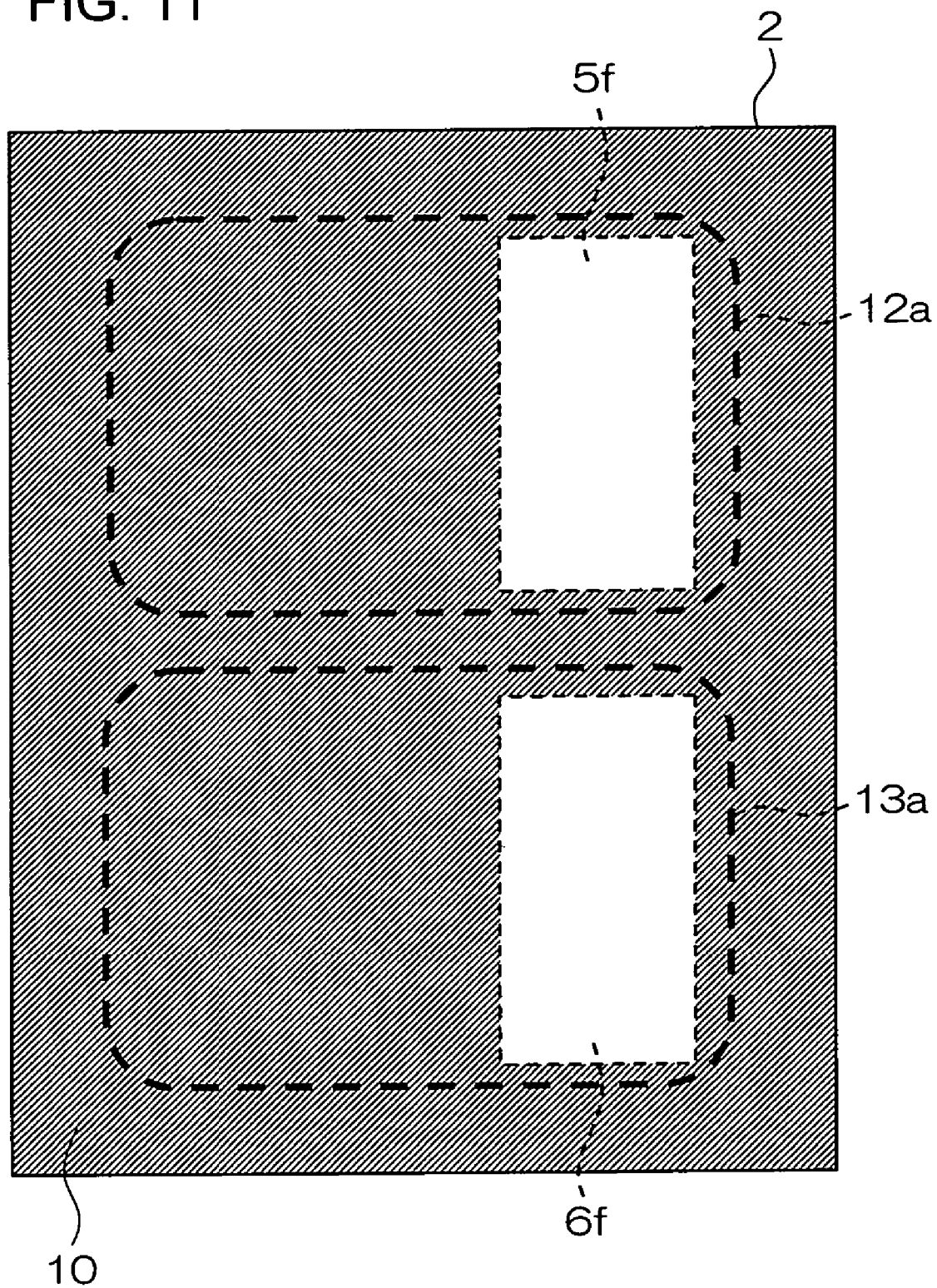
FIG. 11 is a plan view showing still another pattern of a conductor layer.

FIG. 11 is a plan view showing a still further example of conductor-unformed regions.

As shown in FIG. 11, the conductor-unformed regions may be a region 5f having such a simple rectangular pattern shape as to cover the whole of a portion connected directly from an input electrode section 5i to IDT electrodes 3 in a transmission-side filter region 12 on a main surface of a piezoelectric substrate 2.

The conductor-unformed regions may be a region 6f having such a simple rectangular pattern shape as to cover the whole of a portion connected directly from an output electrode section 6j to IDT electrodes 3 in a receiving-side filter region 13 on the main surface.

In order to more reliably restrain capacitive coupling through a parasitic capacitance, the whole of the region opposed to at least one of the transmission-side filter region 12 and the receiving-side filter region 13 on the main surface of the piezoelectric substrate 2 can be also taken as the conductor-unformed region.

Figure 12:
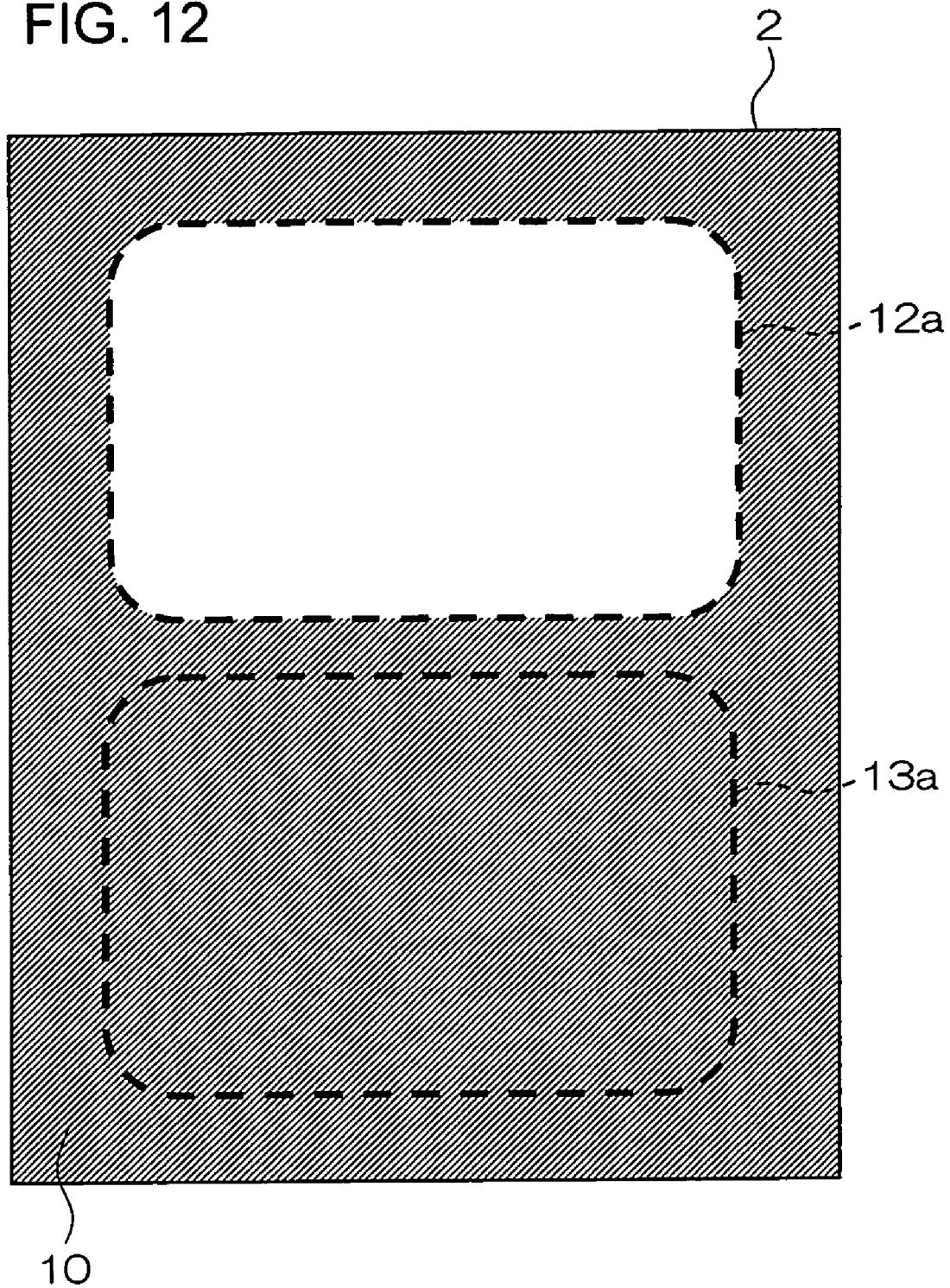
FIG. 12 is a plan view showing a further pattern of a conductor layer.

An example of the pattern of a conductor layer 10 is illustrated in FIG. 12. FIG. 12 illustrates an example in which the conductor layer 10 is formed except for a region 12a opposed to the transmission-side filter region 12.

Figure 13:
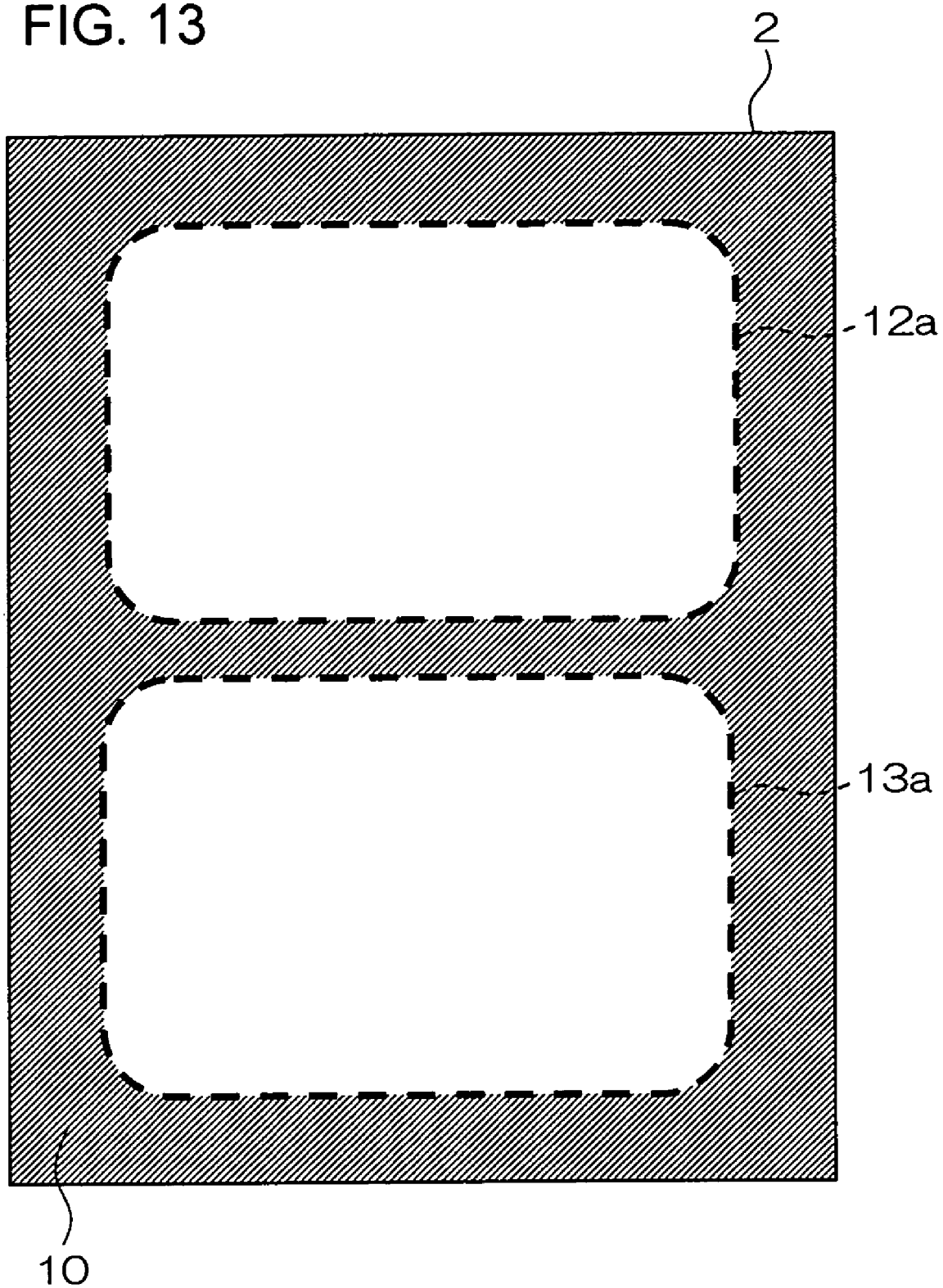
FIG. 13 is a plan view showing a still further pattern of a conductor layer.

As in a plan view of FIG. 13, a conductor layer 10 may have a pattern excluding both regions 12a and 13a opposed to the transmission-side filter region 12 and the receiving-side filter region 13 on the main surface of the piezoelectric substrate 2.

The generation of an unnecessary parasitic capacitance between the transmission-side and receiving-side filters and the conductor layer 10 can be reliably restrained by forming the conductor layer 10 on the other surface of the piezoelectric substrate 2 except for the region 12a opposed to the transmission-side filter region 12 and the region 13a opposed to the receiving-side filter region 13 on the piezoelectric substrate 2, thereby making it possible to more reliably restrain degradation of isolation characteristics caused by the capacitive coupling through the parasitic capacitance.

Consequently, a surface acoustic wave device being significantly superior in isolation characteristics and capable of effectively restraining the occurrence of pyroelectric destruction at the time of manufacture is obtained.

Although the patterns of the conductor-unformed regions having the same shape are respectively provided in the regions 12a and 13a opposed to the transmission-side filter region 12 and the receiving-side filter region 13 on the piezoelectric substrate 2 in the examples shown in FIGS. 11 and 13, they may be different patterns.

When the surface roughness of the regions 12a and 13a from which the conductor layer 10 is removed on the other surface of the piezoelectric substrate 2 is made higher than the surface roughness of a region where the conductor layer 10 is formed in this case, the propagation of a bulk wave can be more reliably restrained. An amount of degradation by the propagation of the bulk wave out of degradation factors of the isolation characteristics can be effectively reduced, which is advantageous in further significantly improving the isolation characteristics. The effect of improving the isolation characteristics by thus making the surface roughness of the regions 12a and 13a from which the conductor layer 10 is removed than the surface roughness of the region where the conductor layer 10 is formed is also the same in the examples shown in FIGS. 9 to 12.

Figure 14:
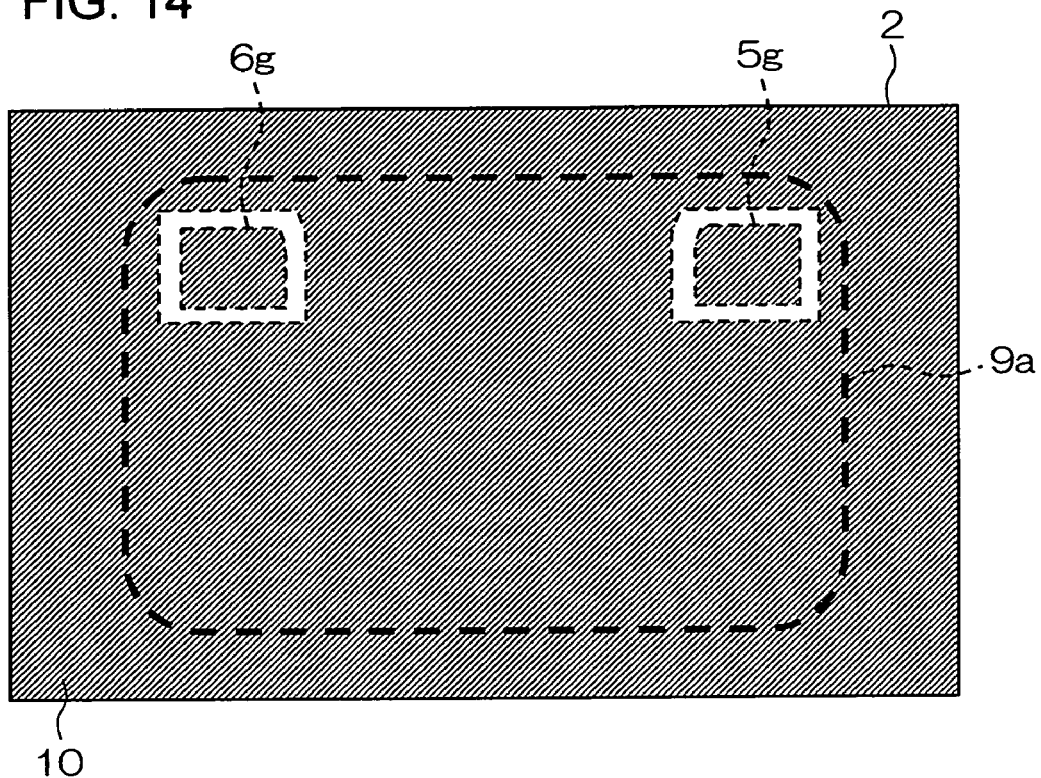
FIG. 14 is a plan view showing a pattern of a conductor layer in which isolated regions are respectively formed in a region opposed to an input electrode section 5 and a region opposed to an output electrode section 6.

A plan view of the other surface of a surface acoustic wave element is shown in FIG. 14.

As shown in FIG. 14, a conductor layer 10 is formed on the other surface of a piezoelectric substrate 2.

Here, the conductor layer 10 is formed with a region 5g opposed to an input electrode section 5 in a filter region 9 on the piezoelectric substrate 2 and a region 6g opposed to an output electrode section 6 in the filter region 9 isolated from the other region. The isolated regions are electrically insulated from the other region of the conductor layer 10.

This makes it possible to prevent the input electrode section 5 and the output electrode section 6 from being capacitive-coupled through a parasitic capacitance generated between the electrode sections and the conductor layer 10. Consequently, out-of-band attenuation characteristics can be improved.

Although the pattern in which both the regions 5g and 6g are isolated from the other region in the conductor layer 10 is illustrated in this example, the effect of improving out-of-band attenuation characteristics to some extent is obtained if at least one of the regions 5g and 6g is isolated from the other region in the conductor layer 10.

Figure 15:
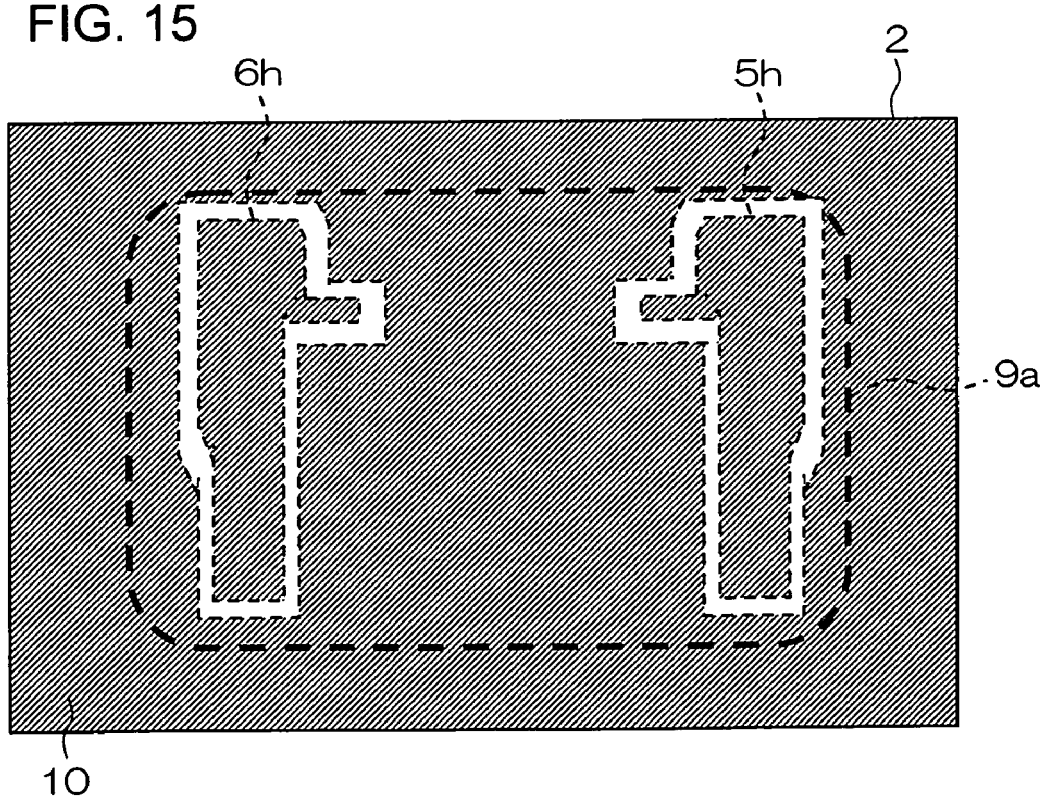
FIG. 15 is a plan view showing another pattern of a conductor layer.

FIG. 15 illustrates the other surface of a surface acoustic wave element having another pattern of a conductor layer 10.

Although the pattern in which only the region 5g opposed to the input electrode section 5 in the filter region 9 and the region 6g opposed to the output electrode section 6 in the filter region 9 are isolated from the other region in the conductor layer 10 is used in FIG. 14, a region 5h opposed to a portion connected directly from an input electrode section 5 to IDT electrodes 3 in a filter region 9 on the piezoelectric substrate 2 and a region 6h opposed to a portion connected directly from an output electrode section 6 to IDT electrodes 3 in the filter region 9 are isolated from the other region to form a conductor layer 10 in FIG. 15.

By thus isolating the region 5h and the region 6h from the other region to form the conductor layer 10, a parasitic capacitance can be further reduced, and capacitive coupling through the parasitic capacitance can be more reliably restrained.

Figure 16:
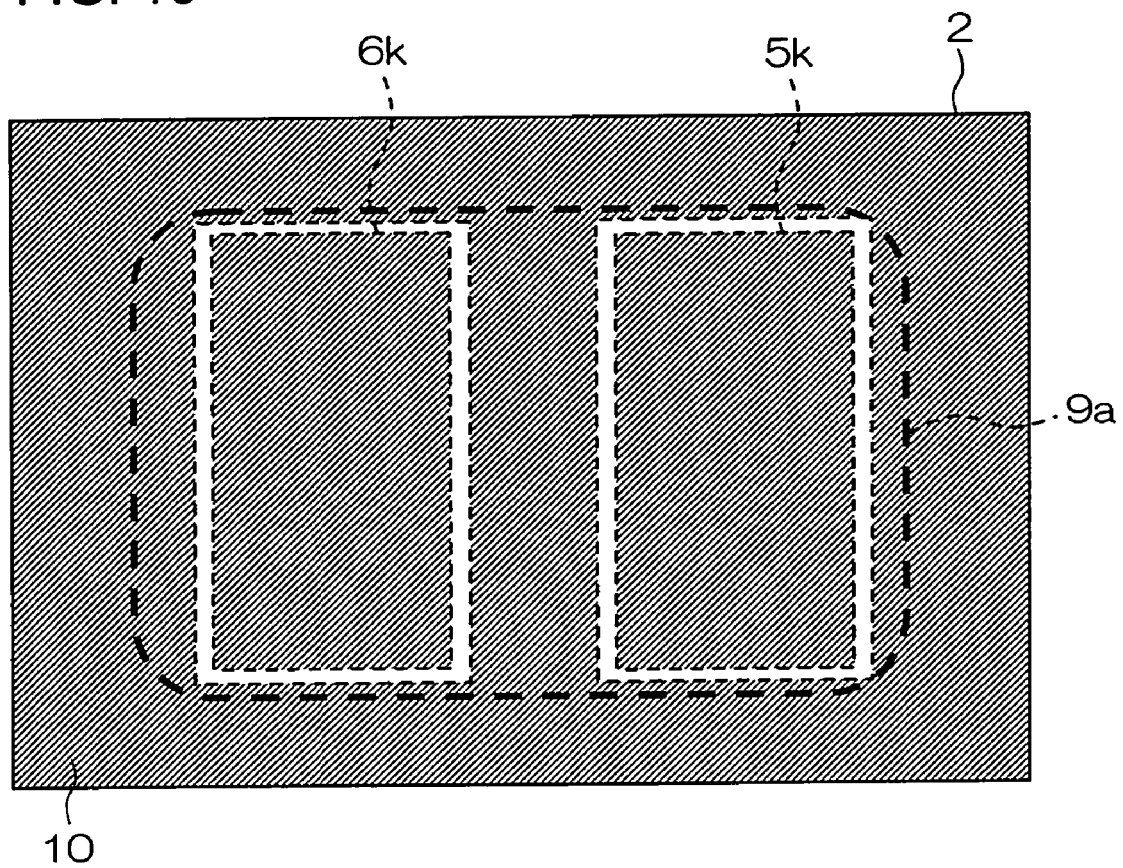
FIG. 16 is a plan view showing still another pattern of a conductor layer.

As shown in FIG. 16, a pattern of a conductor layer 10 in which a region 5k having a rectangular pattern opposed to the whole of a portion connected directly from an input electrode section 5 to IDT electrodes 3 in a filter region 9 and a region 6k having a rectangular pattern opposed to the whole of a portion connected directly from an output electrode section 6 to IDT electrodes 3 in the filter region 9 are isolated from the other region may be employed.

Figure 17:
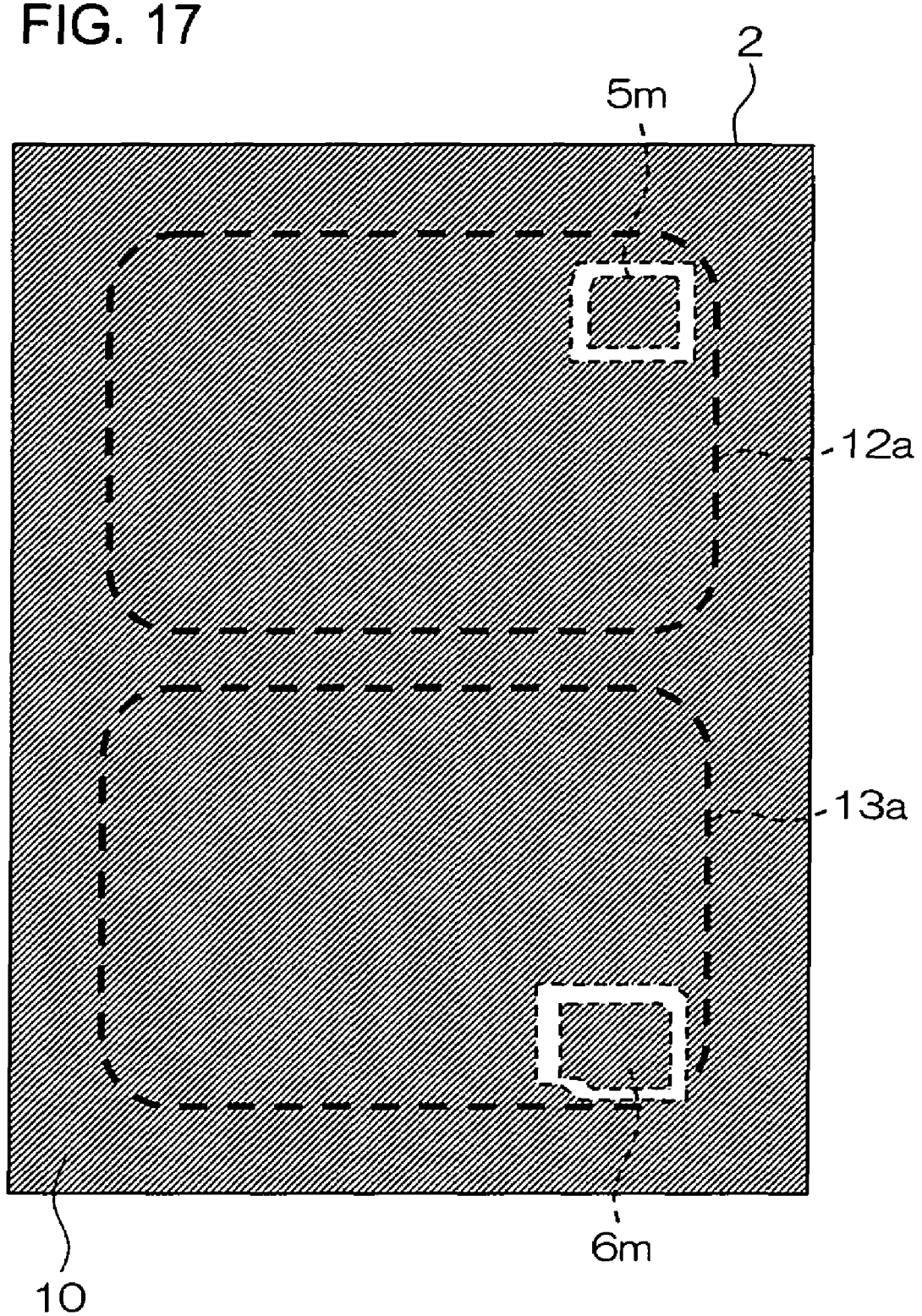
FIG. 17 is a plan view showing, on the other surface of a surface acoustic wave element having a transmission-side filter and a receiving-side filter formed therein, a pattern of a conductor layer in which isolated regions are respectively formed in a region opposed to an output electrode section 6$j$ in the receiving-side filter and a region opposed to an input electrode section 5$i$ in the transmission-side filter.

FIG. 17 is a plan view of a surface acoustic wave element, showing another example of conductor-unformed regions. A piezoelectric substrate 2 corresponds to the surface acoustic wave element having the transmission-side filter and the receiving-side filter shown in FIGS. 2 and 4.

As shown in FIG. 17, a conductor layer 10 formed on the other surface of the piezoelectric substrate 2 is formed with a region 5m opposed to an input electrode section 5i in a transmission-side filter region 12 and a region 6m opposed to an output electrode section 6j in a receiving-side filter region 13 on the piezoelectric substrate 2 respectively isolated from the other region.

By thus forming the pattern in which the regions 5m and the region 6m are isolated from the other region, the input electrode section 5i in the transmission-side filter and the output electrode section 6j in the receiving-side filter can be prevented from being capacitive-coupled through a parasitic capacitance generated between the electrode sections and the conductor layer 10, thereby allowing isolation characteristics to be improved.

Although the pattern in which both the region 5m and the region 6m are isolated from the other region in the conductor layer 10 is illustrated in this example, the effect of improving the isolation characteristics to some extent is obtained if at least one of the regions 5m and 6m is isolated from the other region in the conductor layer 10.

Figure 18:
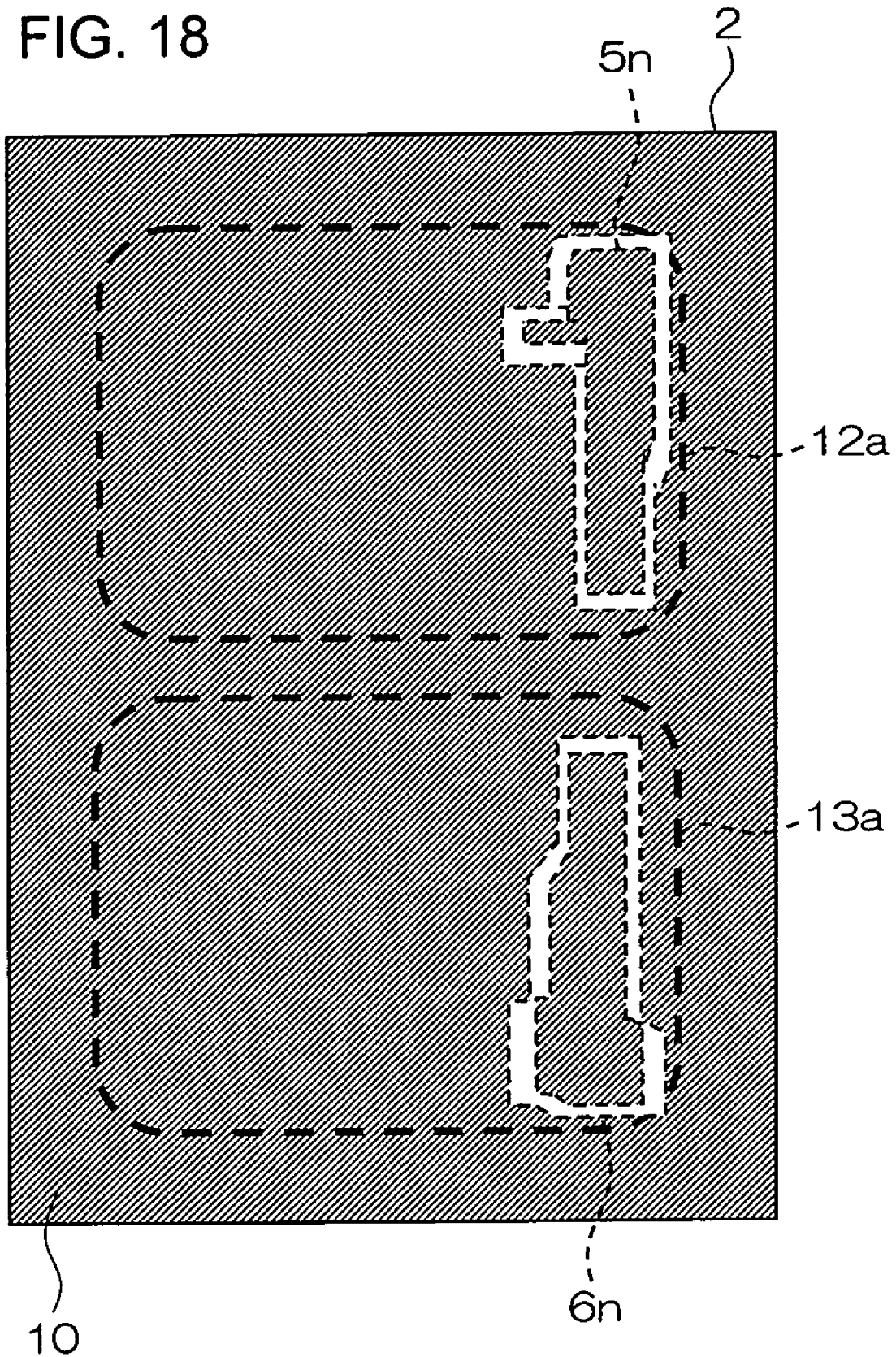
FIG. 18 is a plan view showing another pattern of a conductor layer.

FIG. 18 is a plan view showing another example of a pattern of a conductor layer 10 on the other surface of a piezoelectric substrate 2.

Although the pattern in which the region 5m opposed to the input electrode section 5i in the transmission-side filter region 12 and the region 6m opposed to the output electrode section 6j in the receiving-side filter region 13 on the piezoelectric substrate 2 are isolated from the other region in the conductor layer 10 is used in FIG. 17, a region 5n opposed to a portion connected directly from an input electrode section 5i to IDT electrodes 3 in a transmission-side filter region 12 on a main surface of the piezoelectric substrate 2 and a region 6n opposed to a portion connected directly from an output electrode section 6j to IDT electrodes 3 in a receiving-side filter region 13 on the main surface are isolated from the other region to form a conductor layer 10 in an example shown in FIG. 18.

By thus isolating the region 5n and the region 6n from the other region to form the conductor layer 10, a parasitic capacitance can be further reduced, and capacitive coupling through the parasitic capacitance can be reliably restrained.

Figure 19:
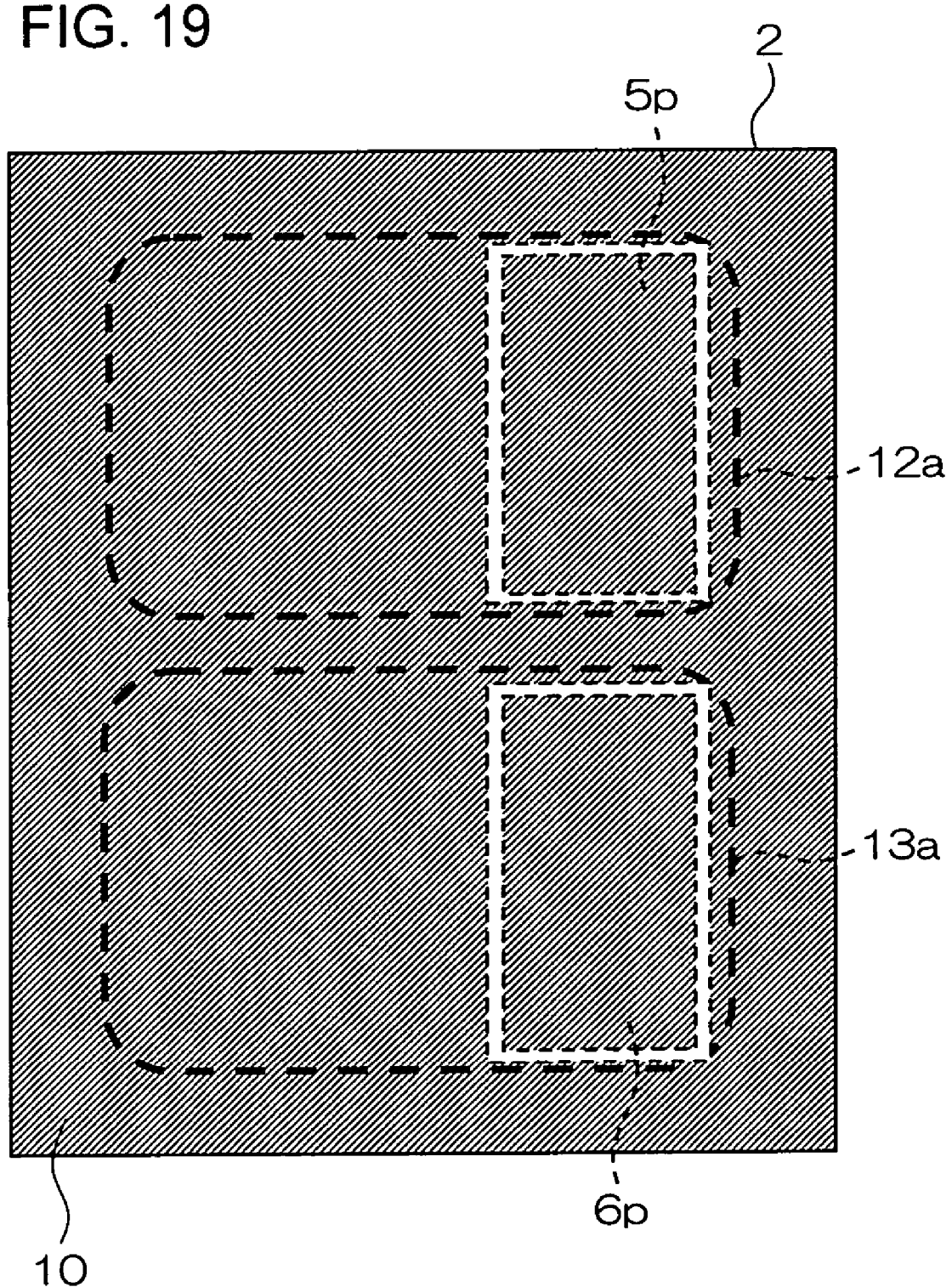
FIG. 19 is a plan view showing still another pattern of a conductor layer.

An isolating pattern may be simple rectangular patterns of a region 5p opposed to the whole of a portion connected directly from an input electrode section 5i to IDT electrodes 3 in a filter region 9 on the piezoelectric substrate 2 and a region 6p opposed to the whole of a portion connected directly from an output electrode section 6j to IDT electrodes 3 in the filter region 9, as shown in FIG. 19.

Figure 20:
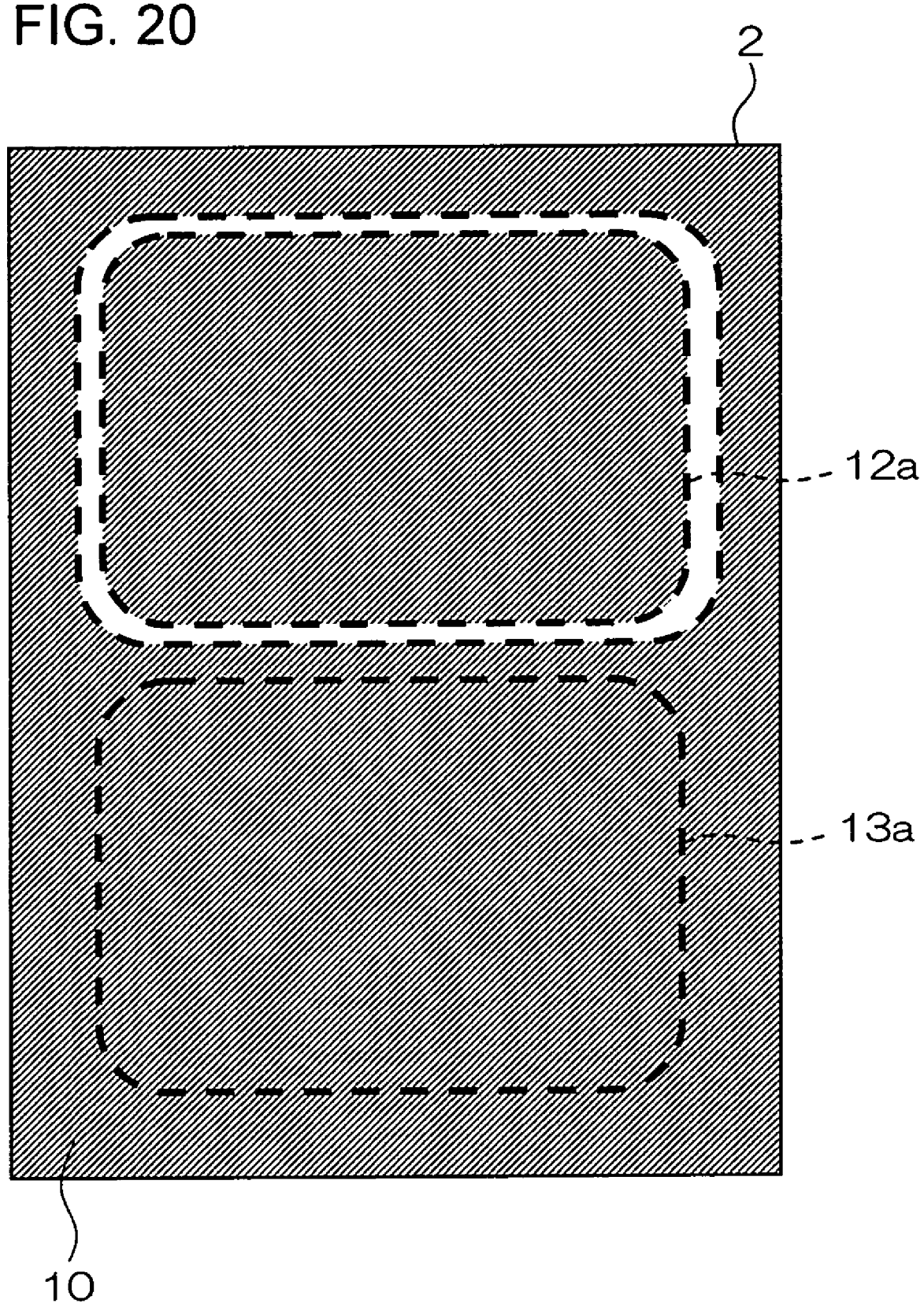
FIG. 20 is a plan view showing a further pattern of a conductor layer.

FIG. 20 illustrates still another pattern of a conductor layer 10.

In this example, a region 12a opposed to the whole of a transmission-side filter region 12 on a piezoelectric substrate 2 is isolated from the other region, to form the conductor layer 10 on the other surface of the piezoelectric substrate 2 in order to further reliably restrain capacitive coupling through a parasitic capacitance.

A pattern in which a region 13a opposed to a receiving-side filter region 13 is isolated from the other region may be used. A pattern in which both the region 12a and the region 13a are isolated from the other region may be used.

By isolating the region 12a opposed to the transmission-side filter region 12 and/or the region 13a opposed to the receiving-side filter region 13 on the piezoelectric substrate 2 from the other region, to form the conductor layer 10 on the other surface of the piezoelectric substrate 2, as shown in FIG. 20, degradation of isolation characteristics caused by the capacitive coupling between the transmission-side filter and the receiving-side filter can be more reliably restrained.

Consequently, a surface acoustic wave device being significantly superior in isolation characteristics and capable of effectively restraining the occurrence of pyroelectric destruction at the time of manufacture can be obtained.

When the region 12a opposed to the transmission-side filter region 12 and/or the region 13a opposed to the receiving-side filter region 13 in the conductor layer 10 are isolated from the other region, as shown in FIG. 20, it is preferable that the surface roughness of a region, from which the conductor layer 10 is removed, on the piezoelectric substrate 2 due to the isolation is higher than the surface roughness of a region where the conductor layer 10 is formed.

At this time, the propagation of a bulk wave can be more reliably restrained by increasing the surface roughness on the other surface of the piezoelectric substrate 2. An amount of degradation by the propagation of the bulk wave out of degradation factors of the isolation characteristics can be effectively reduced, which is advantageous in more significantly improving the isolation characteristics.

The effect of improving the isolation characteristics by making the surface roughness of the portion from which the conductor layer 10 is partially removed in order to isolate a predetermined region of the conductor layer 10 from the other region higher than the surface roughness of the other region where the conductor layer 10 is formed is also the same as those in the examples shown in FIGS. 14 to 19.

Figure 21:
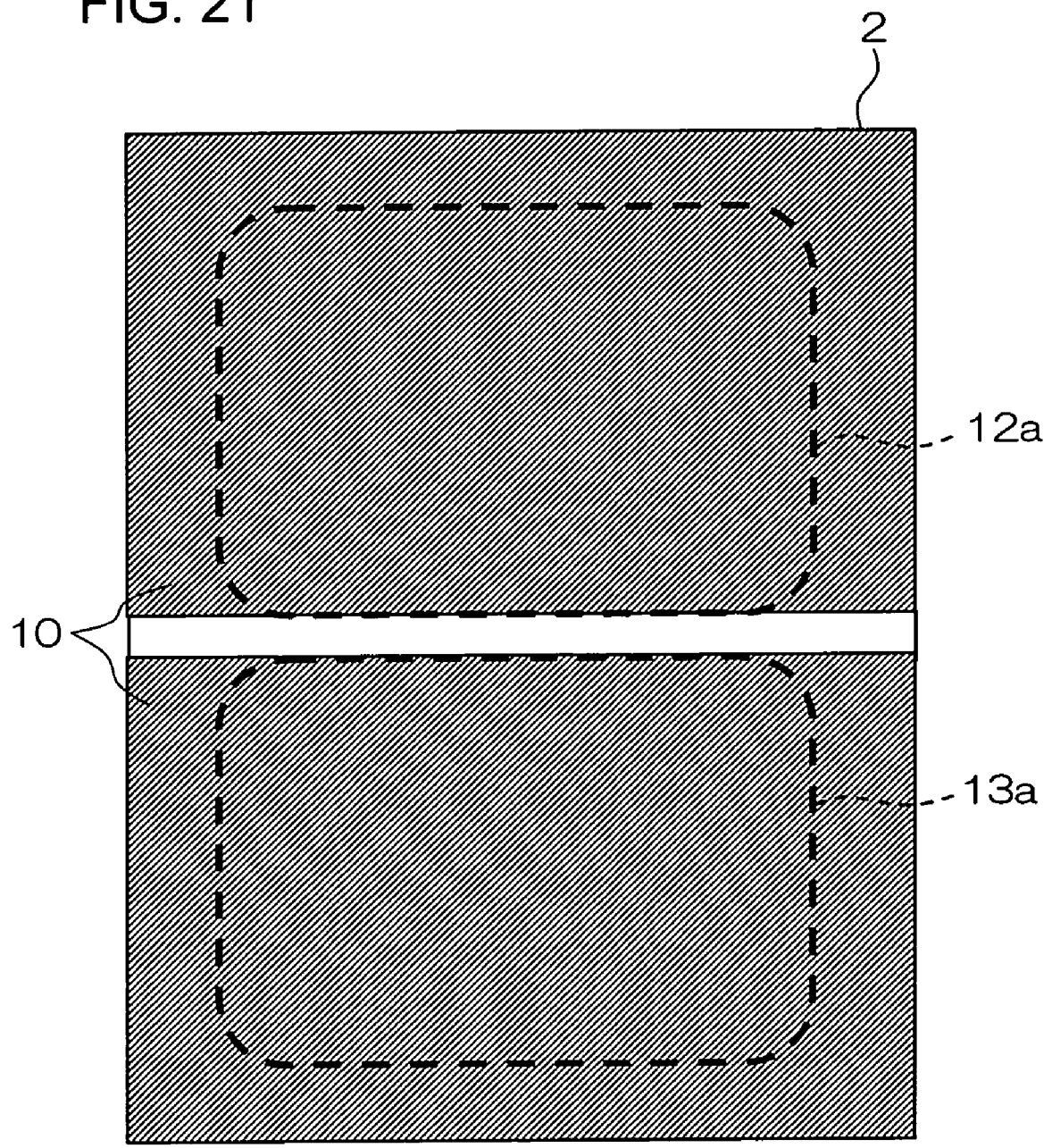
FIG. 21 is a plan view showing a pattern of a conductor layer in which a region opposed to a transmission-side filter region and a region opposed to a receiving-side filter region in a piezoelectric substrate 2 are isolated from each other.

An example of still another pattern of a conductor layer 10 is illustrated in FIG. 21.

In this example, a region 12a opposed to a transmission-side filter region 12 on a main surface of a piezoelectric substrate 2 and a region 13a opposed to a receiving-side filter region 13 on the main surface are isolated from each other, to form conductor layers 10 on the other surface of the piezoelectric substrate 2 in order to further reliably restrain capacitive coupling through a parasitic capacitance.

This causes the respective patterns of the conductor layers 10 to be continuous in an electrically wide area. Since each of the patterns does not have an isolated region having an area extremely smaller than that in the periphery thereof, locally non-uniform storage of charges in the piezoelectric substrate 2, which is one cause of pyroelectric destruction, can be more effectively prevented.

Figure 22:
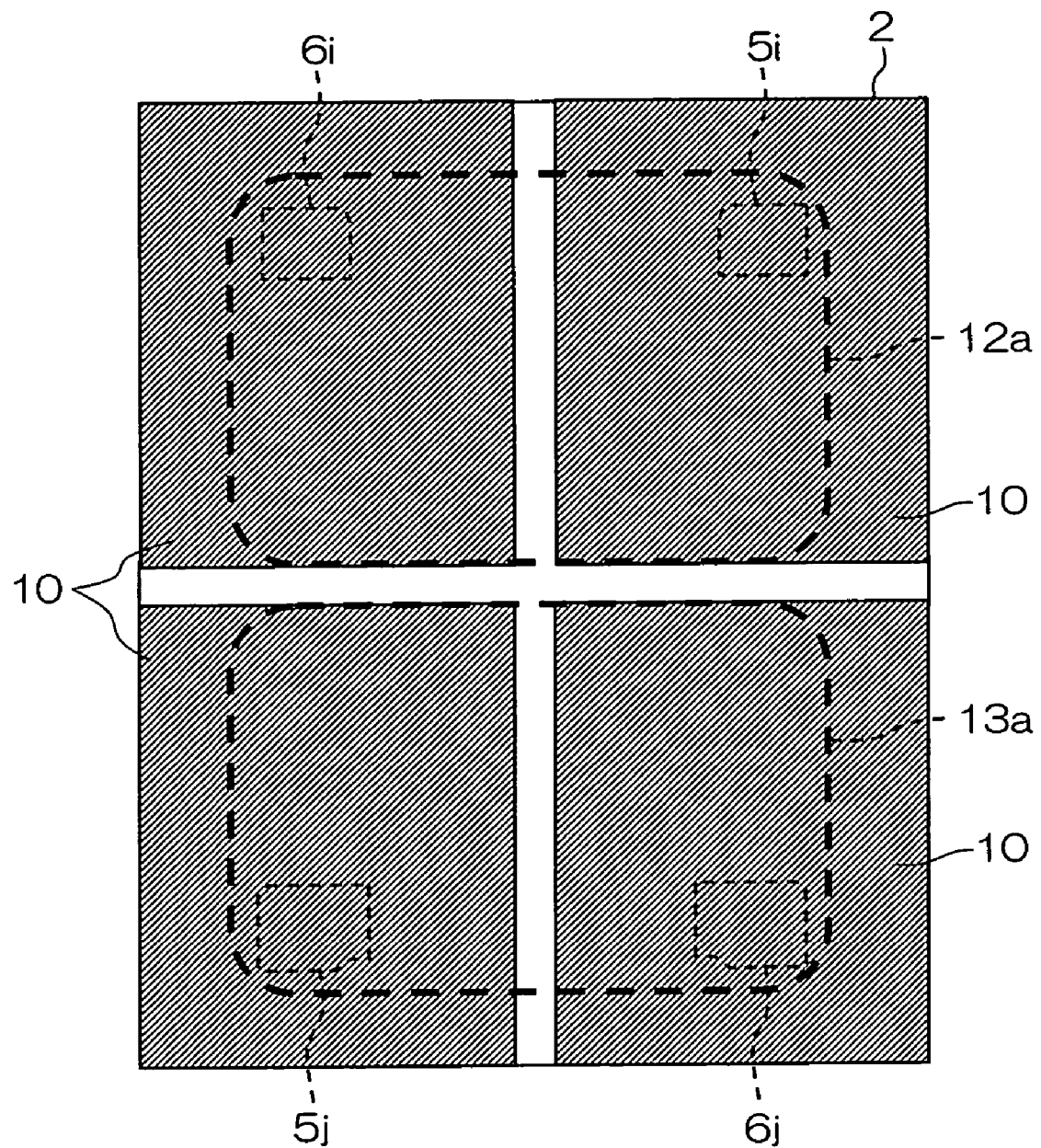
FIG. 22 is a plan view showing another pattern of a conductor layer.

As shown in FIG. 22, a pattern in which a region opposed to an input electrode section 5i, 5j and a region opposed to an output electrode section 6i, 6j are formed in an isolated manner in at least one of a region 12a opposed to a transmission-side filter region 12 and a region 13a opposed to a receiving-side filter region 13 may be used.

This pattern makes it possible to restrain coupling through a parasitic capacitance between the input electrode section 5i and the output electrode section 6i in the transmission-side filter, thereby allowing attenuation characteristics in the vicinity of the pass band to be made steeper.

Similarly, coupling through a parasitic capacitance between the input electrode section 5j and the output electrode section 6j in the receiving-side filter can be restrained, thereby allowing attenuation characteristics in the vicinity of the pass band to be improved. Consequently, isolation characteristics between the filters can be improved.

Although the region opposed to the input electrode section 5i, 5j and the region opposed to the output electrode section 6i, 6j are formed in an isolated manner in each of the regions 12a and 13a in the example shown in FIG. 22, they may be formed in an isolated manner in either one of the regions.

Although a conductor layer 10 is isolated at a portion intermediate between the region opposed to the input electrode section 5i, 5j and the region opposed to the output electrode section 6i, 6j in this example, only the respective regions corresponding to the input and output electrode sections may be isolated from the other region, as in the example shown in FIG. 17.

By also making the surface roughness of conductor-unformed regions for the isolation higher than the surface roughness of a region where the conductor layer 10 is formed in the cases shown in FIGS. 21 and 22, the propagation of a bulk wave can be more reliably restrained in a wider area. An amount of degradation by the propagation of the bulk wave out of degradation factors of the isolation characteristics can be also effectively reduced, which is advantageous in more significantly improving the isolation characteristics.

Figure 23:
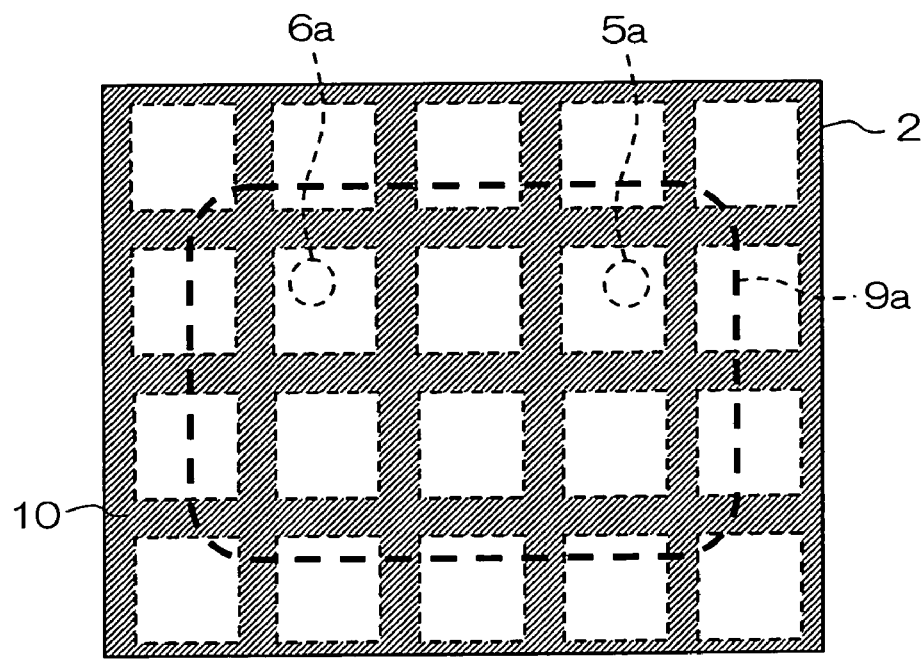
FIG. 23 is a plan view showing an example of a pattern of a conductor layer having a large number of conductor-unformed regions dispersed therein.

An example of still another pattern of a conductor layer 10 is illustrated in FIG. 23.

In the conductor layer 10, the pattern of which is illustrated in FIG. 23, a large number of conductor-unformed regions are dispersed. In this example, the conductor layer 10 is formed so as to have a lattice shape.

The conductor layer 10 is thus shaped, thereby making it possible to make the area of the conductor layer 10 smaller than that in a case where the conductor layer 10 is formed throughout the other surface of a piezoelectric substrate 2 and to reduce a parasitic capacitance generated between an input electrode section 5 and an output electrode section 6 in a filter region 9. Consequently, out-of-band attenuation characteristics can be improved.

Although a pattern in which a large number of conductor-unformed regions are dispersed on the other surface of the piezoelectric substrate 2 including a region 5a opposed to the input electrode section 5 in the filter region 9 on the piezoelectric substrate 2 and a region 6a opposed to the output electrode section 6 in the filter region 9 is illustrated in this example, the effect of improving the out-of-band attenuation characteristics is obtained to some extent if a large number of conductor-unformed regions are dispersed in a region including at least one of the regions 5a and 6a.

Since the pattern itself of the conductor layer 10 is continuously formed throughout the other surface of the piezoelectric substrate 2, charges can be prevented from being stored in a part of the other surface, thereby making it possible to reliably prevent the occurrence of pyroelectric destruction.

Figure 24:
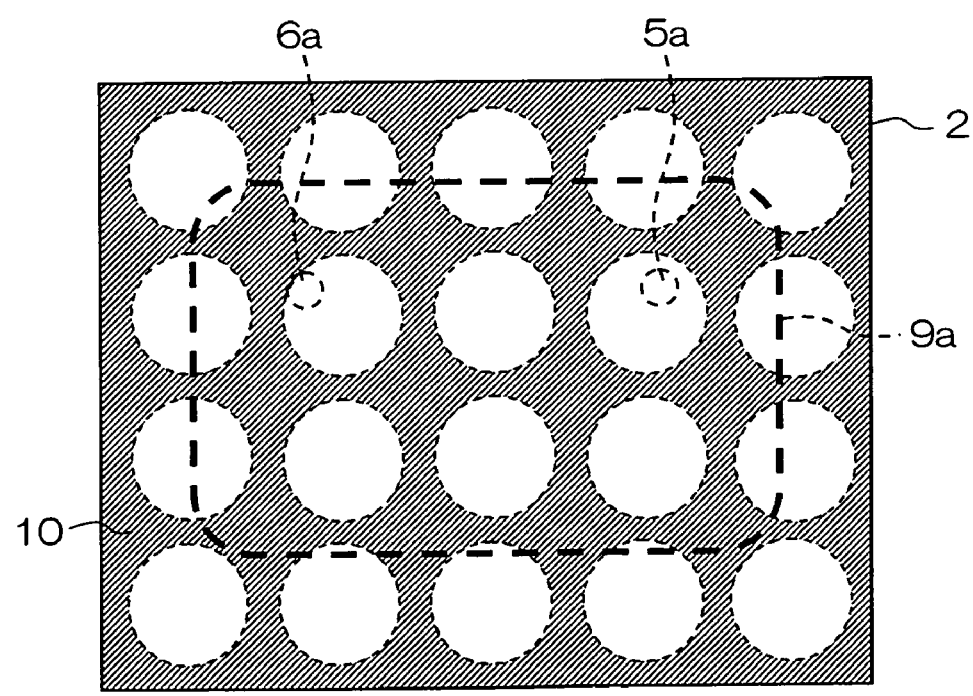
FIG. 24 is a plan view showing another example of a pattern of a conductor layer.

Although a simple lattice-shaped pattern in which squares are arranged in a crosswise direction is illustrated as an example of conductor-unformed regions in FIG. 23, a pattern in which circles are arranged in a crosswise direction may be used as conductor-unformed regions, as shown in FIG. 24, for example, in which case the same effect is obtained. Further, the lattice-shaped pattern may be inclined at an angle of 45 degrees, for example.

Figure 25:
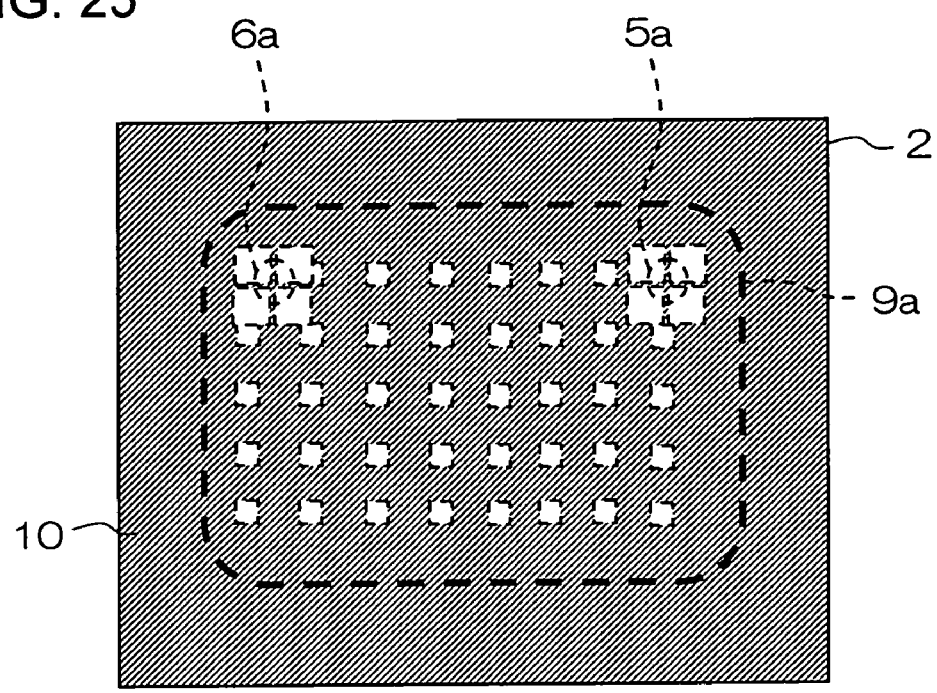
FIG. 25 is a plan view showing an example of a pattern of a conductor layer in which the percentage of an area occupied by conductor-unformed regions is made higher in both a region opposed to an input electrode section 5 and a region opposed to an output electrode section 6.

FIG. 25 illustrates another pattern of a conductor layer 10.

In this example, the pattern of the conductor layer 10 is a lattice-shaped pattern in which small conductor-unformed regions in a square shape are arranged in a crosswise direction except for a region 5a opposed to an input electrode section 5 in a filter region 9 on a piezoelectric substrate 2 and its periphery and a region 6a opposed to an output electrode section 6 in the filter region 9 and its periphery.

In the region 5a and the region 6a, the area of the conductor-unformed region in a square shape is increased, to make the percentage of an area occupied by the conductor-unformed regions higher than that of an area occupied by the other Since capacitive coupling through a parasitic capacitance generated between the input electrode section 5 and the output electrode section 6 in the filter region 9 increases the percentage of the area occupied by the conductor-unformed regions, therefore, the pyroelectric destruction can be more reliably prevented, thereby allowing out-of-band attenuation characteristics to be further significantly improved.

Although the percentage of the area occupied by the conductor-unformed regions is made higher than that of the area occupied by the other region in the region 5a opposed to the input electrode section 5 in the filter region 9 and the region 6a opposed to the output electrode section 6 in the filter region 9 in the example shown in FIG. 25, the percentage of the area occupied by the conductor-unformed regions may be made higher in either one of the regions. In the case, the capacitive coupling between the input electrode section 5 and the output electrode section 6 in the filter region 9 can be also reduced, so that the out-of-band attenuation characteristics can be improved.

Although the area of the conductor-unformed regions in a square shape is increased in the region 5a opposed to the input electrode section 5 and the region 6a opposed to the output electrode 6 in the filter region 9 in this example, to make the percentage of the area occupied by the conductor-unformed regions higher than that of the area occupied by the other region, the percentage of an area occupied by the conductor-unformed regions may be made higher than that of an area occupied by the other region by making the area of the conductor-unformed regions equal to that of the other region and arranging the conductor-unformed regions at high density.

Figure 26:
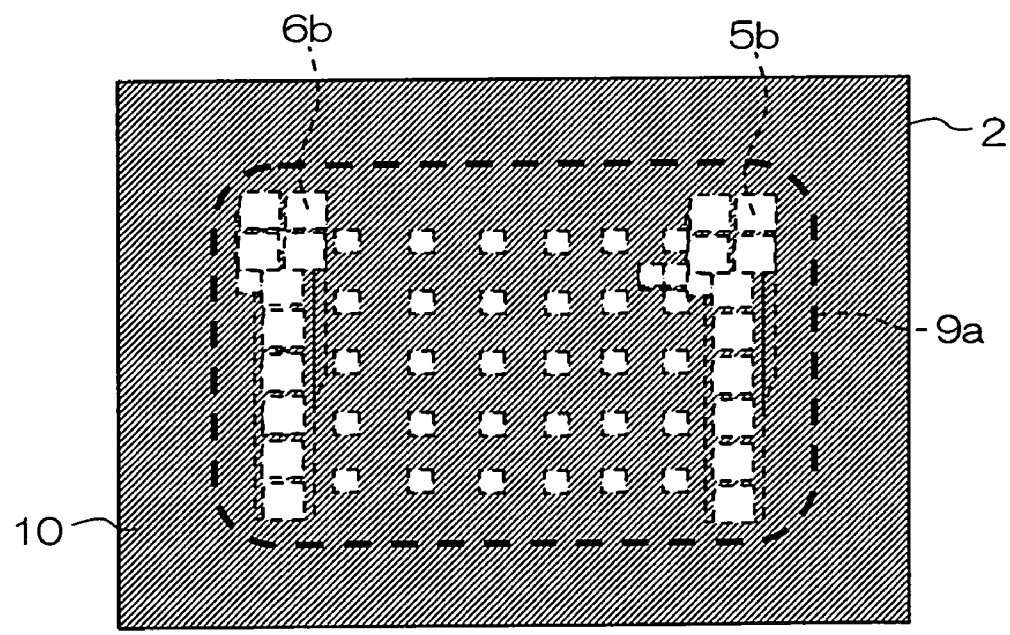
FIG. 26 is a plan view showing another example of a pattern of a conductor layer.

FIG. 26 illustrates an example of another pattern of conductor-unformed regions.

In this example, conductor-unformed regions in a square shape are enlarged and are closely arranged in a region 5b opposed to a portion connected directly from an input electrode section 5 to IDT electrodes 3 in a filter region 9 on the piezoelectric substrate 2 and a region 6b opposed to a portion connected directly from an output electrode section 6 to IDT electrodes 3 in the filter region 9.

Consequently, the percentage of an area occupied by the conductor-unformed regions becomes higher than that of an area occupied by the other region, so that capacitive coupling between the input electrode section 5 and the output electrode section 6 in the filter region 9 can be more reliably restrained, thereby allowing out-of-band attenuation characteristics to be improved.

Although the percentage of the area occupied by the conductor-unformed regions is made higher than that of the area occupied by the other region in the region 5b opposed to the portion connected directly from the input electrode section 5 to the IDT electrode 3 in the filter region 9 and the region 6b opposed to the portion connected directly from the output electrode section 6 to the IDT electrode 3 in the filter region 9 in the example shown in FIG. 26, the percentage of the area occupied by the conductor-unformed regions may be made higher in either one of the regions. Since capacitive coupling between the input electrode section 5 and the output electrode section 6 in the filter region 9 can be prevented in the case, the out-of-band attenuation characteristics can be improved.

Also in the example shown in FIG. 26, assuming that the surface roughness of the conductor-unformed regions and particularly, the conductor-unformed regions whose area accounts for a high percentage is higher than the surface roughness of a region where a conductor layer 10 is formed, the propagation of a bulk wave can be more reliably restrained. An amount of degradation by the propagation of the bulk wave out of degradation factors of the out-of-band attenuation characteristics can be effectively reduced, which is advantageous in further significantly improving the out-of-band attenuation characteristics. The foregoing bulk wave restraining effect is also the same in FIGS. 23 to 25.

Figure 27:
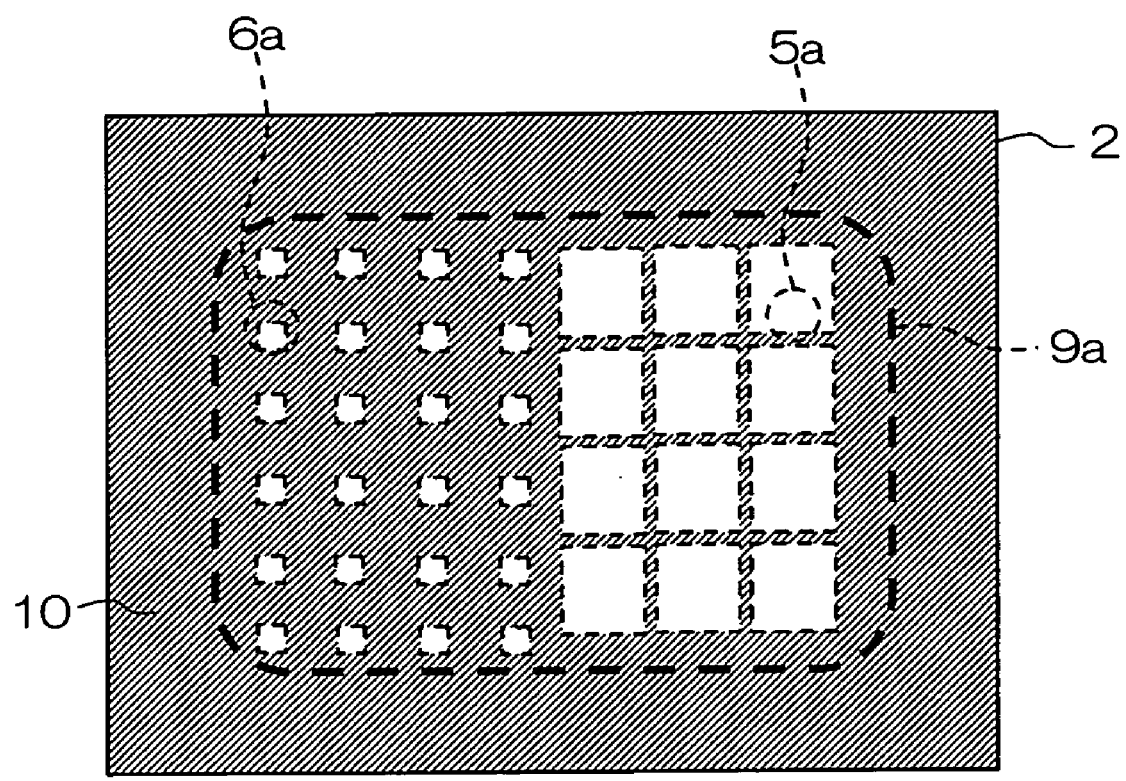
FIG. 27 is a plan view showing still another example of a pattern of a conductor layer.

FIG. 27 illustrates still another pattern of conductor-unformed regions.

In this example, in order to further reliably restrain capacitive coupling between an input electrode section 5 and an output electrode section 6 in a filter region 9, the percentage accounted for by the area of a large number of conductor-unformed regions that are dispersed in a conductor layer 10 is made higher than that accounted for by the area of the other region in a region including a region 5a opposed to the input electrode section 5 in the filter region 9, as compared with that in a region including a region 6a opposed to the output electrode section 6. A pattern of the conductor layer 10 is illustrated in FIG. 27.

In an example shown in FIG. 27, the percentage accounted for by the area of the conductor-unformed regions including the region 5a opposed to the input electrode section 5 in the filter region 9 is made higher than that accounted for by the area of the other region, i.e., the conductor-unformed regions including the region 6a opposed to the output electrode section 6 in the filter region 9.

Contrary to the foregoing, the percentage accounted for by the area of the conductor-unformed regions in the region 6a opposed to the output electrode section 6 in the filter region 9 may be made higher than the percentage accounted for by the area of the conductor-unformed regions in the region 5a opposed to the input electrode section 5 in the filter region 9. Alternatively, the percentage accounted for by the area of the conductor-unformed regions in both the regions 5a and 6a opposed to the input electrode section 5 and the output electrode section 6 in the filter region 9 may be made higher than that accounted for by the area of the other region.

In either case, capacitive coupling between the input electrode section 5 and the output electrode section 6 in the filter region 9 can be prevented, thereby allowing out-of-band attenuation characteristics to be improved.

Also in the case shown in FIG. 27, by making the surface roughness of the conductor-unformed regions higher than the surface roughness of a region where the conductor layer 10 is formed, the surface roughness is increased in a wide area, thereby allowing the propagation of a bulk wave to be more reliably restrained.

Figure 28:
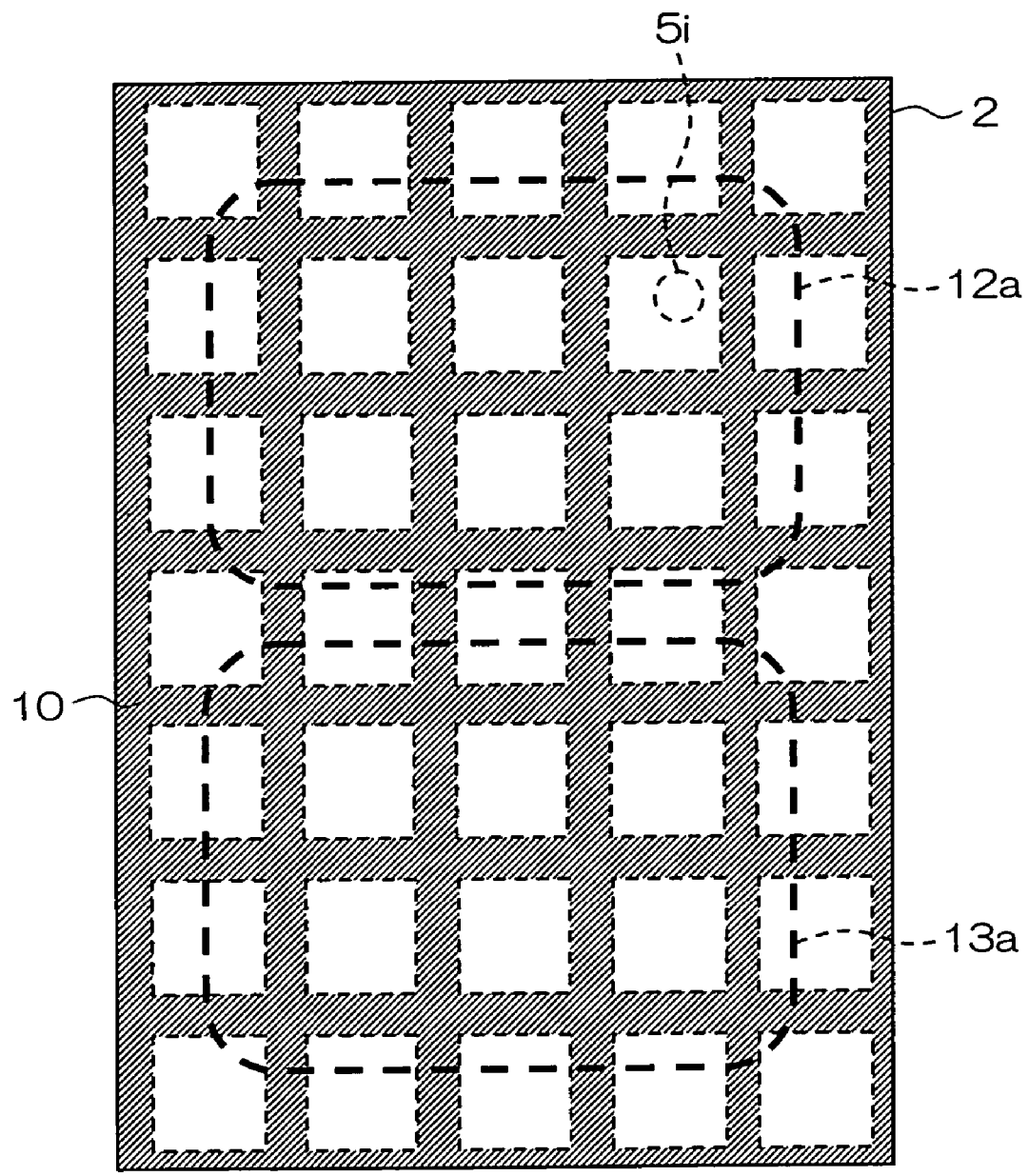
FIG. 28 is a plan view showing an example of a pattern of a conductor layer in which a large number of conductor-unformed regions are dispersed on the other surface of a surface acoustic wave element having a transmission-side filter and a receiving-side filter formed therein.

Furthermore, a plan view of the other surface of a surface acoustic wave element having another pattern is illustrated in FIG. 28.

A piezoelectric substrate 2 corresponds to the piezoelectric substrate having the transmission-side filter and the receiving-side filter shown in FIGS. 2 and 4.

As shown in FIG. 28, a conductor layer 10 is formed on the other surface of a piezoelectric substrate 2 with a large number of conductor-unformed regions dispersed. In this example, the conductor layer 10 is formed so as to have a lattice shape.

By thus shaping the conductor layer 10, the area of the conductor layer 10 can be made smaller than that in a case where the conductor layer 10 is formed throughout the surface, as in the conventional example. A parasitic capacitance generated between the conductor layer 10 and an input electrode section 5i, 5j and an output electrode section 6i, 6j can be reduced.

Since the pattern of the conductor layer 10 is continuously formed over a wide region on the other surface of the piezoelectric substrate 2, charges can be prevented from being locally stored in the other surface of the piezoelectric substrate 2, thereby making it possible to reliably prevent the occurrence of pyroelectric destruction.

Figure 29:
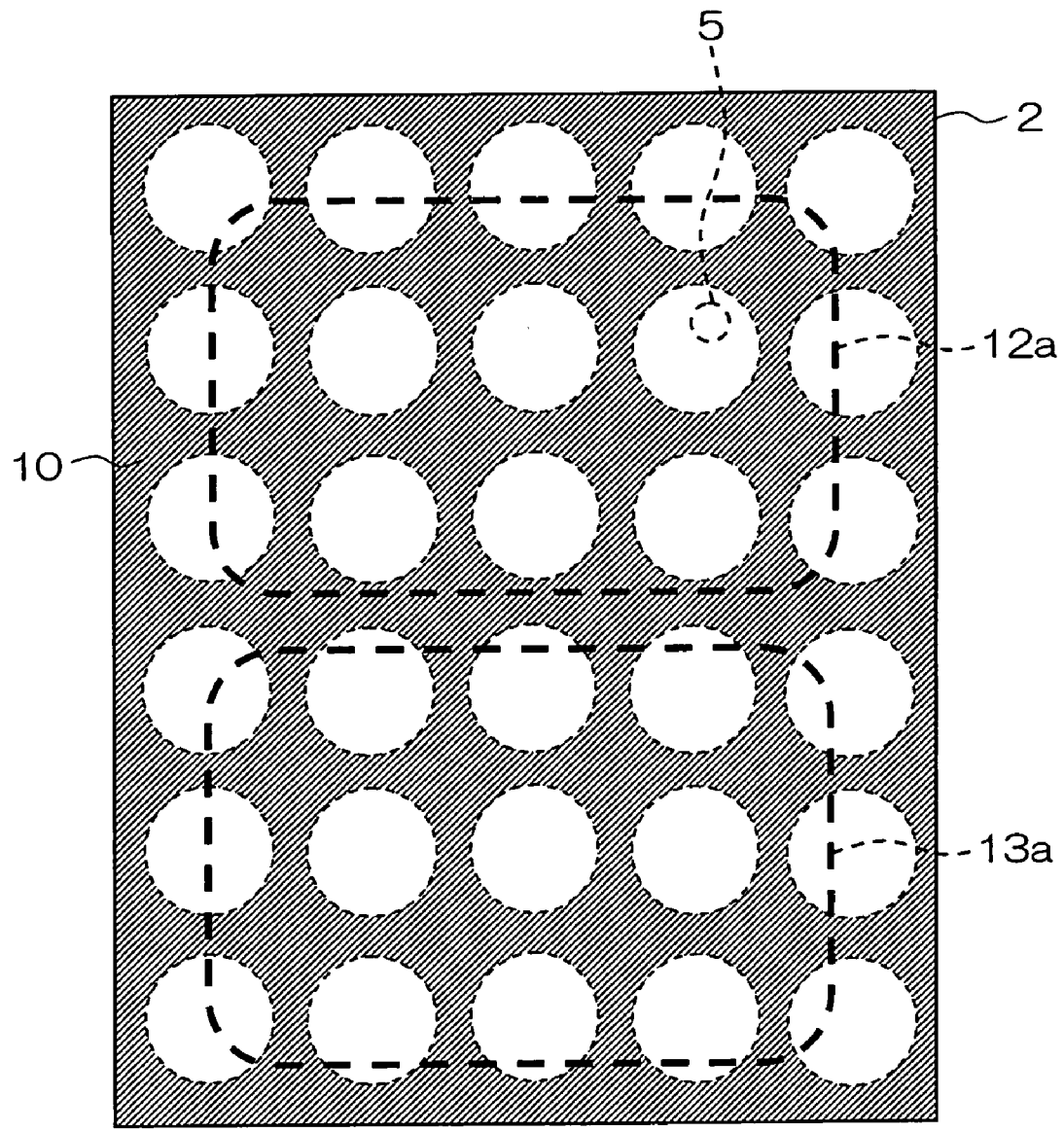
FIG. 29 is a plan view showing another example of a pattern of a conductor layer.

Although a simple lattice-shaped pattern in which squares are arranged in a crosswise direction as the conductor-unformed regions is illustrated as an example of the conductor layer 10 in FIG. 28, a pattern in which circles are arranged in a crosswise direction as the conductor-unformed regions, as shown in FIG. 29, for example, may be used, in which case the same effect is also obtained. Further, the lattice-shaped pattern may be inclined at an angle of 45 degrees, for example.

Figure 30:
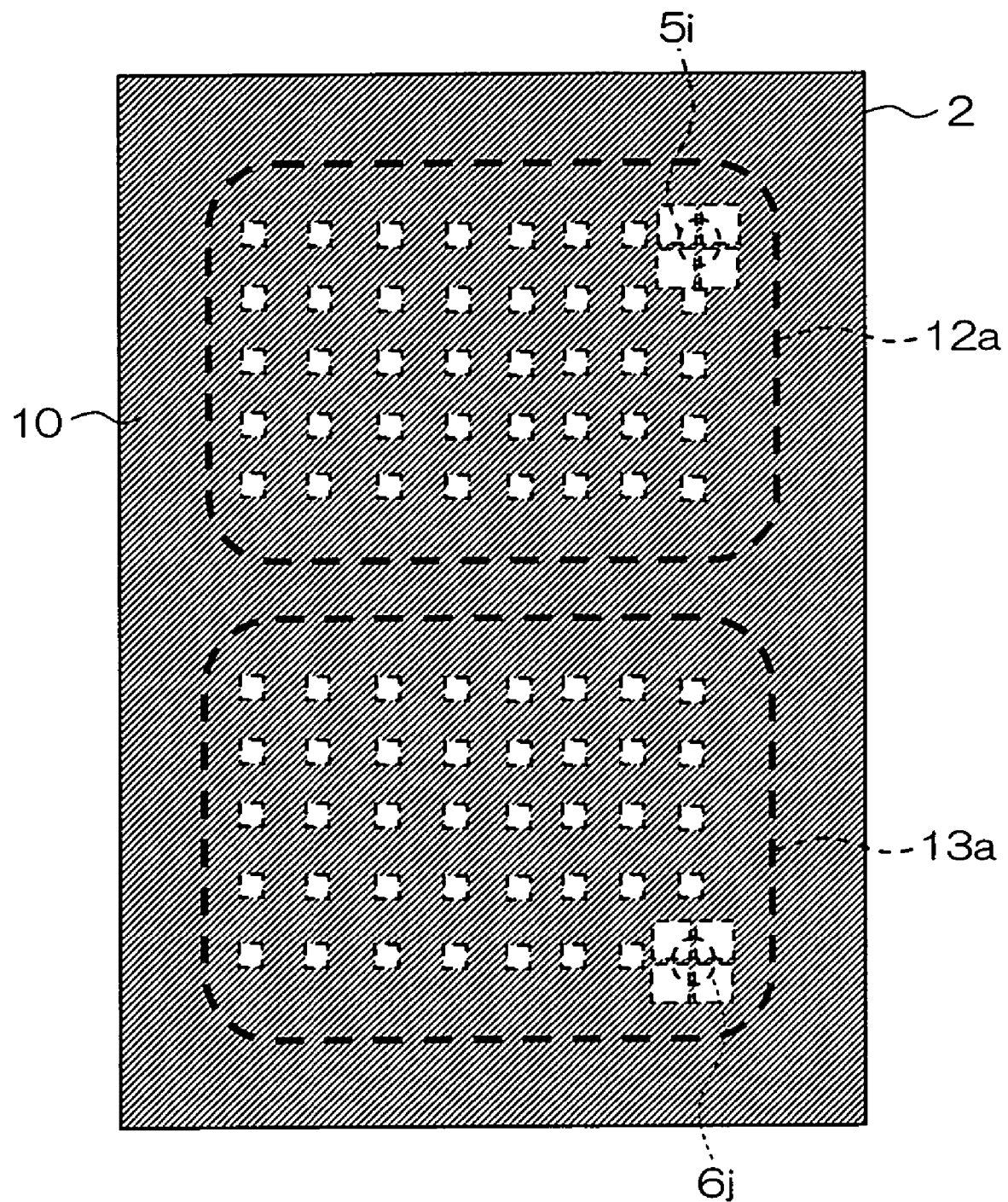
FIG. 30 is a plan view showing an example of a pattern of a conductor layer in which the percentage of an area occupied by conductor-unformed regions is made higher in both a region opposed to an input electrode section 5 and a region opposed to an output electrode section 6.

FIG. 30 is a plan view showing another pattern of conductor-unformed regions.

In this example, the pattern of the conductor-unformed regions is a lattice-shaped pattern in which small conductor-unformed regions in a square shape are arranged in a crosswise direction in a region 12a opposed to the transmission-side filter region 12 and a region 13a opposed to the receiving-side filter region 13 on the piezoelectric substrate 2.

Furthermore, in a region opposed to an input electrode section 5i in the transmission-side filter region 12 and a region opposed to an output electrode section 6j in the receiving-side filter region 13, the area of the conductor-unformed regions in a square shape is increased, to make the percentage accounted for by the area of the conductor-unformed regions higher than that accounted for by the area of the other region.

By thus arranging the pattern, capacitive coupling generated between the input electrode section 5i in the transmission-side filter region 12 and the output electrode section 6j in the receiving-side filter region 13 increases the percentage accounted for by the area of the conductor-unformed regions. Therefore, the pyroelectric destruction can be more reliably prevented, thereby allowing isolation characteristics to be further significantly improved.

Although the percentage accounted for by the area of the conductor-unformed regions is made higher than that accounted for by the area of the other region in both the region opposed to the input electrode section 5i in the transmission-side filter region 12 and the region opposed to the output electrode section 6j in the receiving-side filter region 13 in the example shown in FIG. 30, the percentage accounted for by the area of the conductor-unformed regions may be made higher in either one of the regions. In the case, capacitive coupling through a parasitic capacitance between the input electrode section 5i in the transmission-side filter region 12 and the output electrode section 6j in the receiving-side filter region 13 can be also prevented, thereby allowing the isolation characteristics to be improved.

Figure 31:
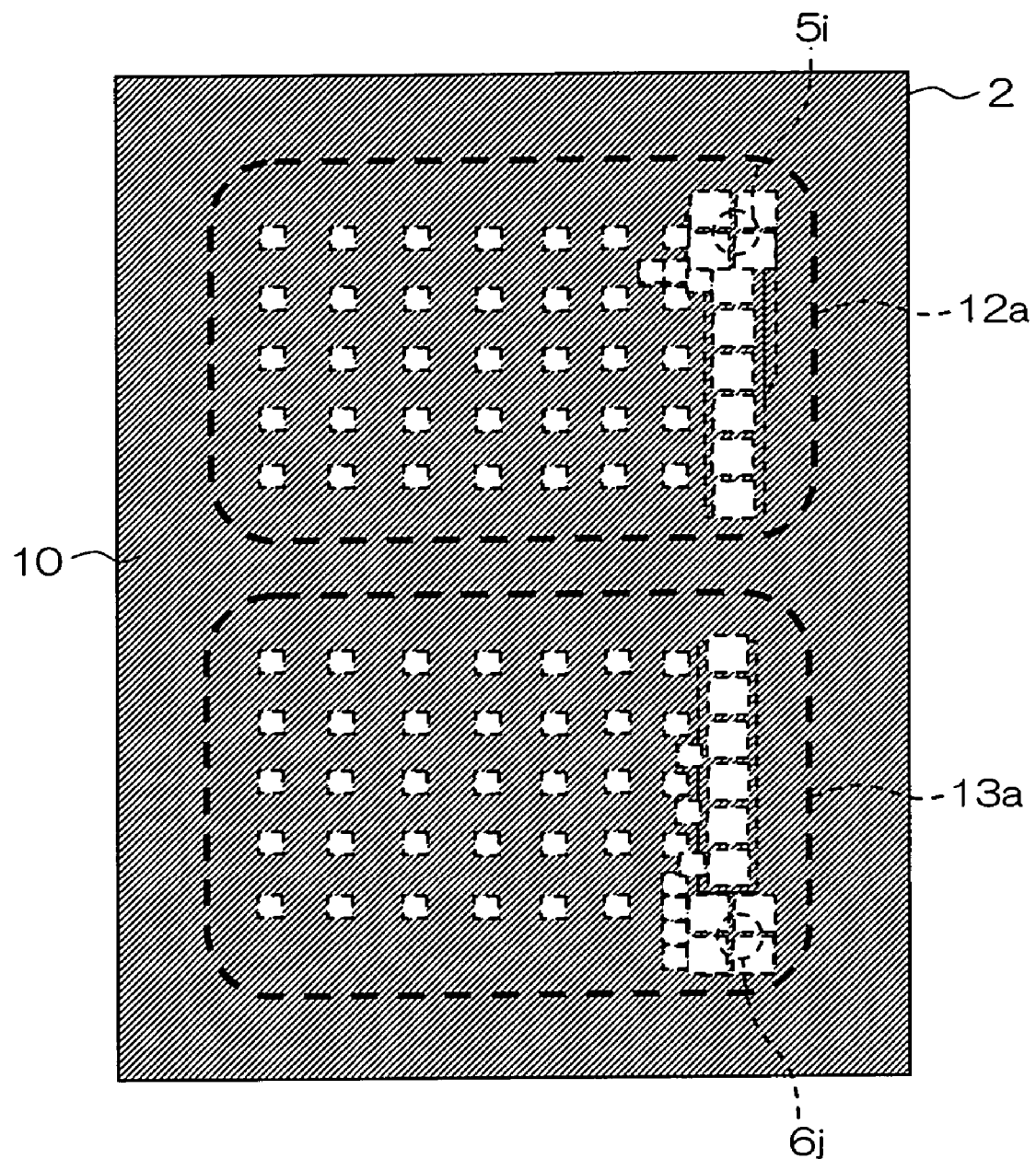
FIG. 31 is a plan view showing another example of a pattern of a conductor layer.

FIG. 31 is a plan view showing still another pattern of conductor-unformed regions.

In this example, in a region opposed to a portion connected directly from an input electrode section 5i to IDT electrodes 3 in a transmission-side filter region 12 on a main surface of a piezoelectric substrate 2 and a region opposed to a portion connected directly from an output electrode section 6j to IDT electrodes 3 in a receiving-side filter region 13 on the main surface, the conductor-unformed regions in a square shape are enlarged and are closely arranged.

Such an arrangement causes the percentage accounted for by the area of the conductor-unformed regions to be higher than that accounted for by the area of the other region. Consequently, capacitive coupling between the input electrode section 5i in the transmission-side filter region 12 and the output electrode section 6j in the receiving-side filter region 13 can be more reliably restrained, thereby allowing isolation characteristics to be improved.

Although the percentage accounted for by the area of the conductor-unformed regions is made higher than that accounted for by the area of the other region in both the region opposed to the portion connected directly from the input electrode section 5i to the IDT electrodes 3 in the transmission-side filter region 12 and the region opposed to the portion connected directly from the output electrode section 6j to the IDT electrodes 3 in the receiving-side filter region 13 in the example shown in FIG. 31, the percentage accounted for by the area of the conductor-unformed regions may be made higher in either one of the regions. In the case, capacitive coupling between the input electrode section 5i in the transmission-side filter region 12 and the output electrode section 6j in the receiving-side filter region 13 can be also prevented, thereby allowing the isolation characteristics to be improved.

Also in the example shown in FIG. 31, by making the surface roughness of the conductor-unformed regions and particularly, the conductor-unformed regions whose area accounts for a high percentage higher than the surface roughness of a region where the conductor layer 10 is formed, the propagation of a bulk wave can be more reliably prevented.

The effect of improving the isolation characteristics by thus making the surface roughness of the conductor-unformed regions higher than the surface roughness of the region where the conductor layer 10 is formed is also the same in the examples shown in FIGS. 28 to 30.

Figure 32:
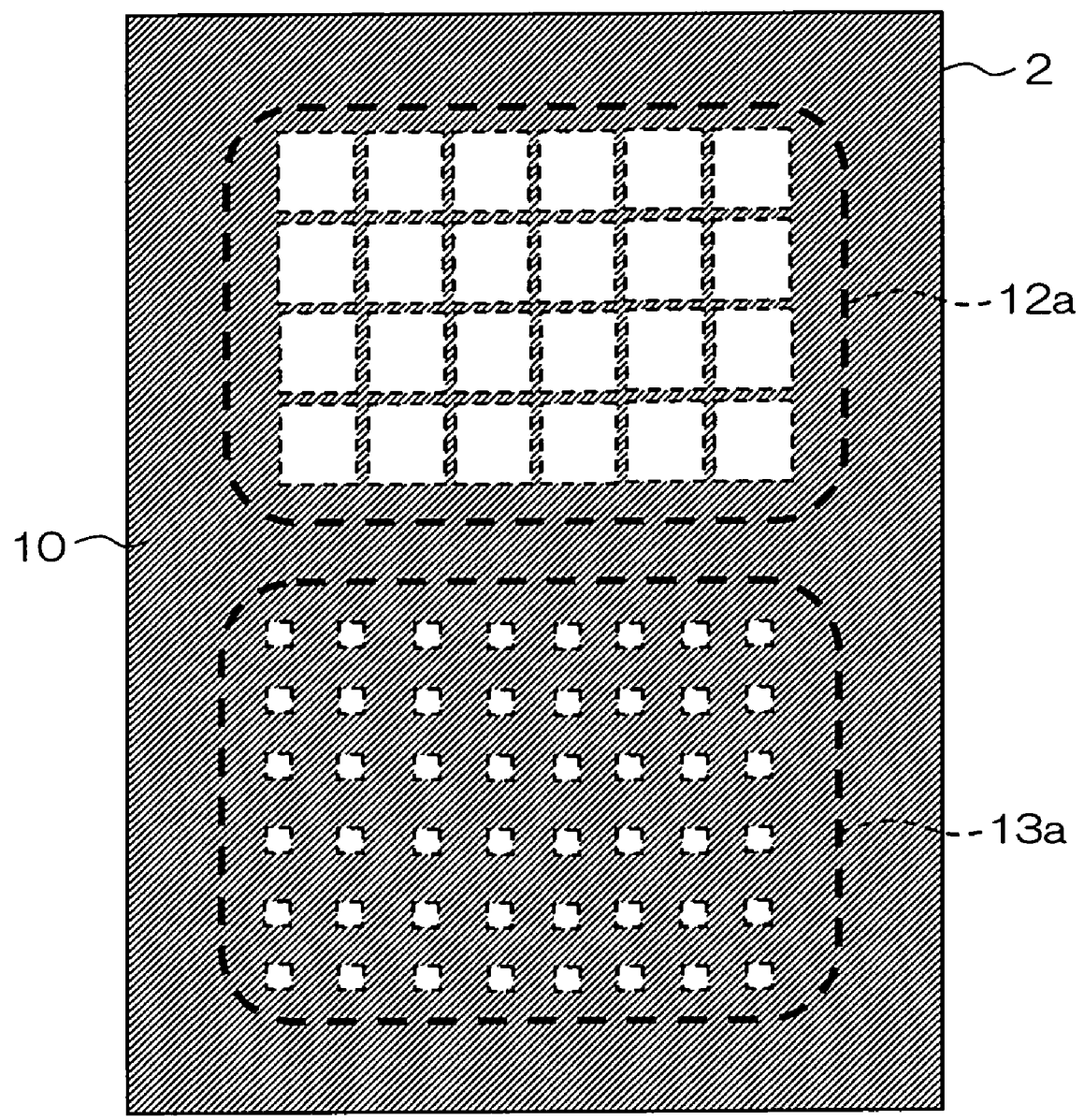
FIG. 32 is a plan view showing still another example of a pattern of a conductor layer.

Still another example of a pattern of a conductor layer 10 is illustrated in FIG. 32.

In this example, in order to further reliably restrain capacitive coupling between a transmission-side filter region 12 and a receiving-side filter region 13, the percentage accounted for by the area of a large number of conductor-unformed regions that are dispersed in the conductor layer 10 is made higher than that accounted for by the area of the other region in a region 12a opposed to the transmission-side filter region 12 on the other surface of a piezoelectric substrate 2.

As shown in FIG. 32, the percentage accounted for by the area of the conductor-unformed regions in the region 12a opposed to the transmission-side filter region 12 is made higher than that accounted for by the area of the other region, i.e., a region 13a opposed to the receiving-side filter region 13 in this case.

On the other hand, the percentage accounted for by the area of the conductor-unformed regions in the region 13a opposed to receiving-side filter region 13 may be made higher than that accounted for by the area of the region 12a opposed to the transmission-side filter region 12. The percentage accounted for by the area of the conductor-unformed regions in both the respective regions 12a and 13a opposed to the transmission-side filter region 12 and the receiving-side filter region 13 may be made higher than that accounted for by the area of the other region. In either case, capacitive coupling between the input electrode section 5i in the transmission-side filter region 12 and the output electrode section 6j in the receiving-side filter region 13 can be also prevented, thereby allowing isolation characteristics to be improved.

Also in the case of this example, by making the surface roughness of the conductor-unformed regions higher than the surface roughness of a region where the conductor layer 10 is formed, the surface roughness is increased in a wider area, thereby allowing the propagation of a bulk wave to be more reliably restrained.

<Manufacturing Method>

FIGS. 33(*a*) to 33(*j*) are cross-sectional views showing an example of the steps of a method of manufacturing a surface acoustic wave device according to the present invention.

As shown in FIG. 33(*a*), an electrode layer 14 is formed on a main surface of a piezoelectric substrate 2.

As shown in FIG. 33(*b*), the electrode layer 14 on the main surface of the piezoelectric substrate 2 is patterned, to form a large number of filter regions each comprising an IDT electrode, an input electrode section, and an output electrode section.

As shown in FIG. 33(*c*), a conductor layer 10 is formed on the other surface of the piezoelectric substrate 2.

The foregoing steps may be carried out in an order other than the foregoing order. For example, the steps 33(*a*), 33(*c*), and 33(*b*) or the steps 33(*c*), 33(*a*), and 33(*b*) may be carried out in this order.

Here, usable as the piezoelectric substrate 2 are a lithium tantalate single crystal, a lithium niobate single crystal, a lithium tetraborate single crystal, etc.

Usable as the electrode layer 14 on the main surface are aluminum, an aluminum alloy, copper, a copper alloy, gold, a gold alloy, tantalum, a tantalum alloy, or laminated films of layers composed of the materials or laminated films of the materials and layers composed of material such as titanium and chromium. Examples of a method of forming the electrode layer 14 are a sputtering method and an electron beam evaporation method.

Examples of a method of patterning the electrode layer 14 include a method of depositing the electrode layer 14, followed by photolithography, and then making RIE (Reactive Ion Etching) or wet etching. Alternatively, a lift-off process for forming a resist on the main surface of the piezoelectric substrate 2 before depositing the electrode layer 14, followed by photolithography, to open a desired pattern, then depositing the electrode layer 14, and removing the resist and the electrode layer 14 deposited in an unnecessary portion may be carried out.

Usable as materials for the conductor layer 10 on the other surface of the piezoelectric substrate 2 are aluminum and others. Examples of a method of depositing the conductor layer 10 are a sputtering method and an electron beam evaporation method.

As shown in FIG. 33(*d*), a protective film 17 for protecting the IDT electrode is then deposited. Usable as materials for the protective film 17 are silicon, silica, etc. Usable as a film deposition method are a sputtering method, a CVD (Chemical Vapor Deposition) method, an electron beam evaporation method, etc. In the protective film deposition step, even in a case where the piezoelectric substrate 2 is heated to deposit the protective film 17 in order to obtain a good film quality and adhesive properties or a case where the piezoelectric substrate 2 is not positively heated, the surface of the piezoelectric substrate 2 is exposed to plasma. Therefore, the temperature of the piezoelectric substrate 2 becomes approximately 50 to 300° C. In such a case, however, the conductor layer 10 on the other surface effectively serves to prevent pyroelectric destruction.

As shown in FIG. 33(*e*), a new electrode layer is then laminated on the input electrode section and the output electrode section, to respectively form an input electrode pad and an output electrode pad. The new electrode layer is for electrically and/or structurally connecting a surface acoustic wave element and a mounting substrate 16 to each other with high reliability. For example, the electrode layer has the function of ensuring the wettability of a solder and the function of preventing diffusion in a case where the solder is used for the connection, while having the function of adjusting the hardness of the pad such that it can be made to bond using ultrasonic waves or the like in a case where a gold bump is used for the connection. Usable as materials and structures of such a new electrode layer are a laminated film of chromium, nickel and gold or a laminated film of chromium, silver, and gold and a thick film of gold or aluminum. Examples of a film deposition method are a sputtering method and an electron beam evaporation method. Even in a case where the piezoelectric substrate 2 is heated to deposit the electrode layer in order to also obtain a good film quality and adhesive properties in this new electrode layer deposition process or even a case where the piezoelectric substrate 2 is not positively heated, the surface of the piezoelectric substrate 2 is also exposed to plasma. Therefore, the temperature of the piezoelectric substrate 2 becomes approximately 50 to 300° C. Also in such a case, however, the conductor layer 10 on the other surface effectively serves to prevent pyroelectric destruction.

The patterns of the IDT electrode, the input electrode section, the output electrode section, etc. on the main surface of the piezoelectric substrate 2 manufactured in the foregoing steps are as shown in the plan views of FIGS. 1, 3, 2, and 4. However, the protective film is not illustrated in each of the drawings.

Here, as shown in FIG. 33(*f*), the conductor layer 10 on the other surface (reverse surface) of the piezoelectric substrate 2 is partially removed. A region to be removed is a predetermined region including region or regions opposed to the input electrode section in the filter region and/or the output electrode section in the filter region, as described using FIGS. 5 to 13.

As shown in FIGS. 14 to 20, the portion to be removed may be a region having a small width for isolating the region or regions opposed to the input electrode section in the filter region and/or the output electrode section in the filter region from the periphery.

Furthermore, the region may be removed in order to separate the conductor layer 10 on the other surface of the piezoelectric substrate 2 into two or four portions, as shown in FIGS. 21 and 22.

As shown in FIGS. 23 to 32, the conductor layer 10 on the other surface of the piezoelectric substrate 2 may be partially removed so as to have a lattice shape, for example, to provide a large number of conductor-unformed regions in a dispersed manner.

As a method of partially removing the conductor layer 10, the conductor layer 10 may be removed by protecting the main surface of the piezoelectric substrate 2 by a photoresist or the like, then forming the photoresist on the other surface of the piezoelectric substrate 2, followed by photolithography, opening the photoresist in a necessary portion, and then removing the conductor layer in an opened portion using methods such as wet etching, RIE (Reactive Ion Etching), and sand blasting.

At this time, when a method of etching away the conductor layer mainly by a chemical action is used, the conductor layer on the other surface can be partially reliably removed without greatly damaging the piezoelectric substrate.

When a method of grinding and removing the conductor layer mainly by a physical action is used, at the same time that the conductor layer is removed, the other surface of the piezoelectric substrate 2 in a removed portion can be made coarser than that in the original state. Consequently, a bulk wave that propagates in the piezoelectric substrate 2 from one of the filter regions, is reflected on the other surface of the piezoelectric substrate 2, and is coupled to the IDT electrode formed in the other filter region to degrade out-of-band attenuation characteristics can be scattered in this portion on the other surface of the piezoelectric substrate 2, thereby allowing the out-of-band attenuation characteristics to be further improved.

Thereafter, the photoresist on the side of the main surface of the piezoelectric substrate 2 and the photoresist on the side of the other surface thereof are removed.

In the steps, the piezoelectric substrate 2 having a plurality of surface acoustic wave elements formed thereon can be subjected to each processing. Therefore, a plurality of surface acoustic wave elements can be collectively processed, which is efficient.

When the surface acoustic wave device has been manufactured by a so-called multiple sampling method in which a large number of filter regions are formed on one piezoelectric substrate 2, the piezoelectric substrate 2 is then separated for each filter region, to obtain a large number of surface acoustic wave elements, as shown in FIG. 33(*g*). Examples of an separating method are a dicing method using a dicing blade and a laser cutting method by laser processing.

As shown in FIG. 33(*h*), the surface acoustic wave elements are then mounted on the mounting substrate 16 with their main surfaces opposed thereto.

The surface acoustic wave elements mounted on the mounting substrate 16 are resin-molded using sealing resin, as shown in FIG. 33(*i*), and the mounting substrate 16, together with the surface acoustic wave elements and molding resin, is then separated by dicing or the like, as shown in FIG. 33(*j*), to obtain the surface acoustic wave device according to the present invention.

Although an example in which a step of depositing the protective film 17 and a step of forming the input-output electrode pads are also carried out during the manufacturing steps is illustrated, the steps may not be particularly carried out. Further, other steps such as measurement of the film thickness of the electrode layer or the like on the main surface, the inspection of electrical properties, and annealing may be provided.

As described in the foregoing, the conductor layer 10 is formed on the other surface of the piezoelectric substrate 2. Therefore, it is possible to reliably prevent pyroelectric destruction of the surface acoustic wave elements that may occur by giving a hysteresis of temperature in the step of mounting surface acoustic wave element regions of the piezoelectric substrate 2 on the mounting substrate (FIG. 33(*h*)), for example.

Another example of a method of manufacturing the surface acoustic wave device according to the present invention is shown in FIGS. 34(*a*) to 34(*j*).

In the above-mentioned manufacturing method, the piezoelectric substrate 2 having a large number of surface acoustic wave elements formed thereon is mounted on the mounting substrate 16 in the mounting step (FIG. 33(*h*)) after passing through the step of separating for each filter region the piezoelectric substrate 2 having a large number of surface acoustic wave elements formed thereon to obtain the large number of surface acoustic wave elements in FIG. 33(*g*)

In this example, a piezoelectric substrate 2 having a large number of filter regions formed thereon is mounted on a mounting substrate 16 with its main surface opposed thereto in a mounting step shown in FIG. 34(*f*) before being separated for each filter region.

The piezoelectric substrate 2 that is integrated into the mounting substrate 16 is separated for each filter region by so-called half-dicing, as shown in FIG. 34(*h*), surface acoustic wave elements mounted on the mounting substrate 16 are then resin-molded using sealing resin, as shown in FIG. 34(*i*), and the mounting substrate 16, together with the molding resin, is then separated for each surface acoustic wave element (FIG. 34(*j*)). Consequently, the surface acoustic wave device is obtained.

In the manufacturing method, the step of partially removing a conductor layer 10 on the other surface of the piezoelectric substrate 2 is carried out after the mounting step shown in FIG. 34(*f*). After the mounting, the piezoelectric substrate 2 has already been arranged with its main surface opposed to the mounting substrate 16, thereby allowing the step of protecting the main surface to be omitted. Particularly when the surface acoustic wave elements are sealed using an annular electrode, they are firmly fixed to the mounting substrate 16, and the filter regions are also cut off from the outside air. Therefore, a part of the conductor layer 10 on the other surface can be efficiently removed using methods such as wet etching, RIE (Reactive Ion Etching), and sand blasting, as described above.

In this example, the step of partially removing the conductor layer 10 on the other surface of the piezoelectric substrate 2 may be carried out before the mounting step shown in FIG. 34(*f*)

<Communications Equipment>

A surface acoustic wave device according to the present invention can be applied to a communications equipment.

That is, in a communications equipment comprising at least one of a receiving circuit and a transmission circuit, the surface acoustic wave device according to the present invention is used as a band-pass filter included in the circuit.

For example, the surface acoustic wave device is applicable to a communications equipment comprising a transmission circuit capable of attenuating an unnecessary signal using a band-pass filter with a transmission signal on a carrier frequency using a mixer and then, amplifying the transmission signal using a power amplifier, to transmit the transmission signal from an antenna through a duplexer. Also it is applicable to a communications equipment comprising such a receiving circuit as to receive a signal using an antenna, to pass the received signal through a duplexer and to amplify the received signal by a low-noise amplifier, and then to attenuate unnecessary signals by a band-pass filter, to separate the signal from the carrier frequency by a mixer.

If the surface acoustic wave device according to the present invention is employed for at least one of the receiving circuit and the transmission circuit, there can be provided a superior communications equipment having improved transmission characteristics according to the present invention.

A duplexer composed of the surface acoustic wave device according to the present invention can be applied to a front-end SAW-DPX in a communications equipment, as shown in a circuit diagram of FIG. 35(*a*)

Figure 36:
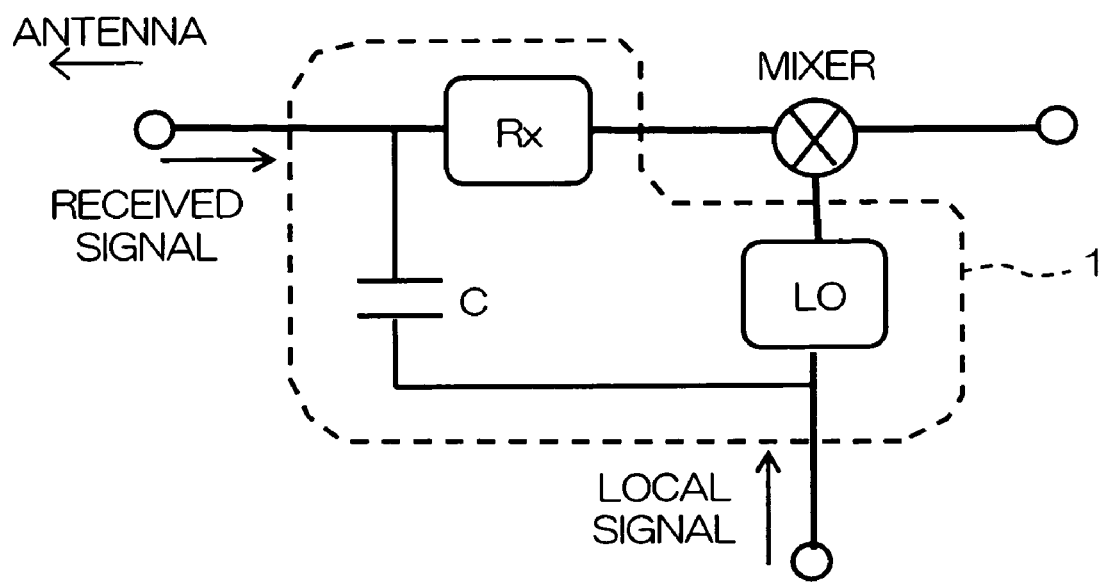
FIG. 36 is a circuit diagram showing an example in which a surface acoustic wave device 1 according to the present invention is applied to a branching filter in which an Rx filter between stages and a filter having the property of passing a frequency band of a local signal are integrated with each other.

As shown in a circuit diagram of FIG. 36, the duplexer can be also applied to a branching filter that is an integration of a receiving-side filter for preventing a local signal to a mixer from leaking out toward an antenna in converting a receiving signal into an intermediate frequency as well as transmitting only the receiving signal and a filter having the property of passing a frequency band of the local signal.

FIG. 36 is a circuit diagram showing the configuration of a mixer peripheral section in a communications equipment. In FIG. 36, a parasitic capacitance C generated by a conductor layer on the other surface of a piezoelectric substrate is together illustrated.

MODIFIED EXAMPLE

The present invention is not limited to the foregoing examples of the non-formed regions. Various modifications can be made without departing from the scope of the present invention.

Although a case where a ladder-type filter is used is illustrated in FIGS. 1 to 4, the present invention does not limit the configuration of the filter. For example, a DMS (Dual Mode) type filter and an IIDT (Interdigitated IDT) type filter may be used.

The arrangement of input-output terminals is not limited to those shown in FIGS. 1 to 5. For example, input-output terminals may be positioned at diagonal corners of a piezoelectric substrate.

Two or more sets of branching filters may be provided on the same piezoelectric substrate. Further, another filter that does not affect the isolation characteristics of the branching filters may be provided on the same piezoelectric substrate. In the case, the area of the whole surface acoustic wave device can be made smaller, as compared with that in a case where a plurality of surface acoustic wave elements are separately manufactured.

Furthermore, although description was mainly made of a case where the conductor layer in a desired region is removed after it is formed once on the other surface of the piezoelectric substrate in the foregoing examples, desired conductor-unformed regions may be arranged in such a manner that a region where no conductor layer is formed is previously set and a conductor layer is formed in a region other than the previously set region.

The pattern of the conductor layer 10 on the other surface is not limited to those shown in FIGS. 5 to 32, but is changed in conformity with the shape of a filter formed on a main surface.

The outer periphery of the conductor-unformed region in a conductor layer 10 on the other surface is not limited to a smooth shape as illustrated. For example, it may be in a shape having irregularities such as a wavy line shape or a serrated shape. The conductor-unformed region has the effect of restraining the stripping of the conductor layer 10 from the other surface when it has such a shape having irregularities on the outer periphery.

Although the patterns in which the conductor layer 10 is left in the outer periphery of the piezoelectric substrate 2 are illustrated in FIGS. 5 to 32, the conductor layer 10 may not be particularly left in the outer periphery of the piezoelectric substrate 2. Although the pattern in which one conductor-unformed region is provided in each of the filter regions is illustrated in FIG. 11, for example, a plurality of conductor-unformed regions may be provided in each of the filter regions.

Although description was made by taking the low frequency-side filter as the transmission-side filter and taking the high frequency-side filter as the receiving-side filter, the low frequency-side filter may be taken as the receiving-side filter and the high frequency-side filter may be taken as the transmission-side filter.

It is also effective to introduce the step of forming a conductor layer having a conductor-unformed region on the reverse surface of the piezoelectric substrate according to the present invention in directly flip-chip mounting on a PCB (Printed Circuit Board) in a portable communications equipment or the like an element manufactured using a so-called wafer-level-packaging (hereinafter referred to as WLP) technique for ensuring a vibration space on a surface of a piezoelectric substrate to form a sealed structure. In this case, the PCB corresponds to the mounting substrate.

Figure 37:
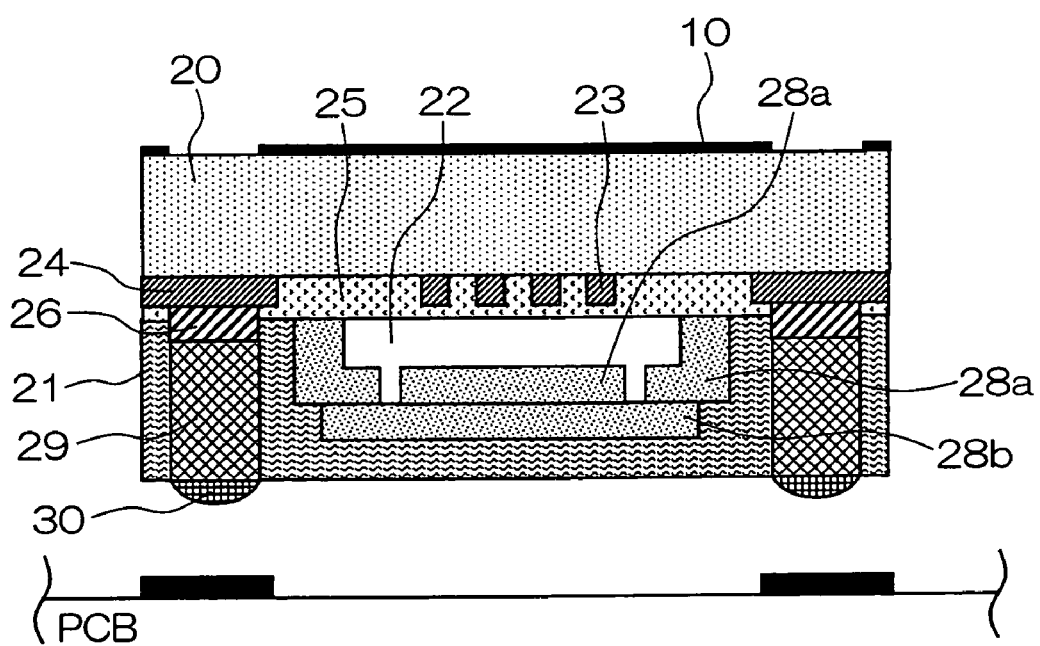
FIG. 37 is a cross-sectional view showing an example of a surface acoustic wave element manufactured using a WLP (Wafer-Level-Packaging) technique.

An example of a surface acoustic wave element manufactured using the WLP technique is illustrated in FIG. 37. An IDT electrode 23, an input-output electrode 24, and so forth are formed on a main surface of a piezoelectric substrate 20, and a vibration space 22 is ensured by cavity structures 28a and 28b. A pad electrode 26 is formed on the input-output electrode 24, and serves as a plating seed layer. Reference numeral 29 denotes a post electrode produced by plating. A terminal electrode 30, a protective film 25, sheathing resin 21, etc. may be formed as required. In the case of such a surface acoustic wave element, a very small surface acoustic wave device can be realized.

Furthermore, the size of each of the electrodes and the distance between the electrodes, for example, or the number of electrode fingers and spacing between the electrode fingers are schematically illustrated for description and hence, the present invention is not limited to the same.

EXAMPLE 1

On a main surface of a piezoelectric substrate 2 (substrate thickness is 250 μm) composed of a 38.7-degree Y-cut X-propagation lithium tantalate single crystal substrate, four layers respectively composed of Ti, Al-1 mass percent Cu, Ti, and Al-1 mass percent Cu were deposited in this order on the side of the substrate by a sputtering method. The thicknesses of the four layers were respectively 6 nm, 209 nm, 6 nm, and 209 nm.

As shown in FIG. 1, the electrode layers were then patterned by photolithography and RIE, to form filter regions each comprising an IDT electrode 3, an input electrode section 5, and an output electrode section 6, to form a large number of surface acoustic wave element regions. At the same time, a ground electrode section 8, a connection electrode 4, and an annular electrode 7 were also formed.

Used as etching gas at this time was mixed gas of $BCl_3$ and $Cl_2$. Both the line width of comb-shaped electrodes forming the IDT electrode 3 and the distance between the adjacent comb-shaped electrodes were approximately 1 μm.

A conductor layer 10 composed of pure Al was then formed on the other surface of a piezoelectric substrate 2 by a sputtering method. The thickness of the conductor layer 10 was 200 nm.

A protective film composed of silica was then deposited on a main surface of the piezoelectric substrate 2 by a plasma CVD method. The deposition temperature was 300° C., and the film thickness was 20 nm.

A part of the protective film was then removed by photolithography and RIE, and new electrode layers respectively composed of Cr, Ni, and Au were laminated on the input electrode section 5, the output electrode section 6, and the ground electrode section 8, to respectively form an input electrode pad, an output electrode pad, and a ground electrode pad. Further, electrode layers having the same structure were also formed on the annular electrode 7. The thicknesses of the new electrode layers were respectively 6 nm, 1000 nm, and 100 nm.

The main surface of the piezoelectric substrate 2 was then protected by a photoresist, the photoresist was then also applied to the other surface thereof, followed by photolithography, and the conductor layer 10 on the other surface of the piezoelectric substrate 2 was then patterned, as shown in FIG. 5, by wet etching using a mixed acid of a nitric acid, a phosphoric acid, and an acetic acid.

After the photoresist was removed, the piezoelectric substrate 2 was then separated by dicing for each of the surface acoustic wave element regions, to obtain a large number of surface acoustic wave elements 1.

The surface acoustic wave element 1 was then mounted on a mounting substrate composed of an LTCC (Low Temperature Co-fired Ceramics) substrate with its main surface opposed thereto.

Here, the LTCC substrate had a mounting substrate-side annular conductor corresponding to the annular electrode 7 formed on the main surface of the piezoelectric substrate 2 and a pad electrode connected to the input-output electrode pads and the ground electrode pad (the pad is indicated by a black circle) in the surface acoustic wave element 1. A solder was previously printed on the mounting substrate-side annular conductor and the pad electrode.

In mounting the surface acoustic wave element 1, the surface acoustic wave element 1 was arranged so as to coincide with a solder pattern and was temporarily fixed by applying ultrasonic waves, and the solder was then melted by heating, to connect the annular electrode 7 and the mounting substrate-side annular conductor to each other and to connect the input-output electrode pads and the pad electrode to each other. Consequently, a filter region 9 in the surface acoustic wave element 1 was completely hermetically sealed by the mounting substrate-side annular conductor in the LTCC substrate and the annular electrode 7 connected thereto. The mounting process of the surface acoustic wave element 1 was carried out under a nitrogen atmosphere.

Resin molding was then performed, to protect the other surface (reverse surface) of the surface acoustic wave element 1 by molding resin. Finally, the mounting substrate was diced between the surface acoustic wave elements 1 to obtain a surface acoustic wave device according to the present invention.

As a comparative example, a surface acoustic wave element in which a filter region comprising an IDT electrode, an input electrode section, and an output electrode section is formed on a main surface of a piezoelectric substrate, as in the conventional example, and a conductor layer is formed throughout the other surface thereof was mounted on a mounting substrate with its main surface opposed thereto, to manufacture a surface acoustic wave device. A plan view of the comparative example was the same as that shown in FIG. 1.

With respect to the example and the comparative example of the present invention thus manufactured, frequency characteristics thereof were measured. The frequency characteristics are shown in a graph of FIG. 38.

Figure 38:
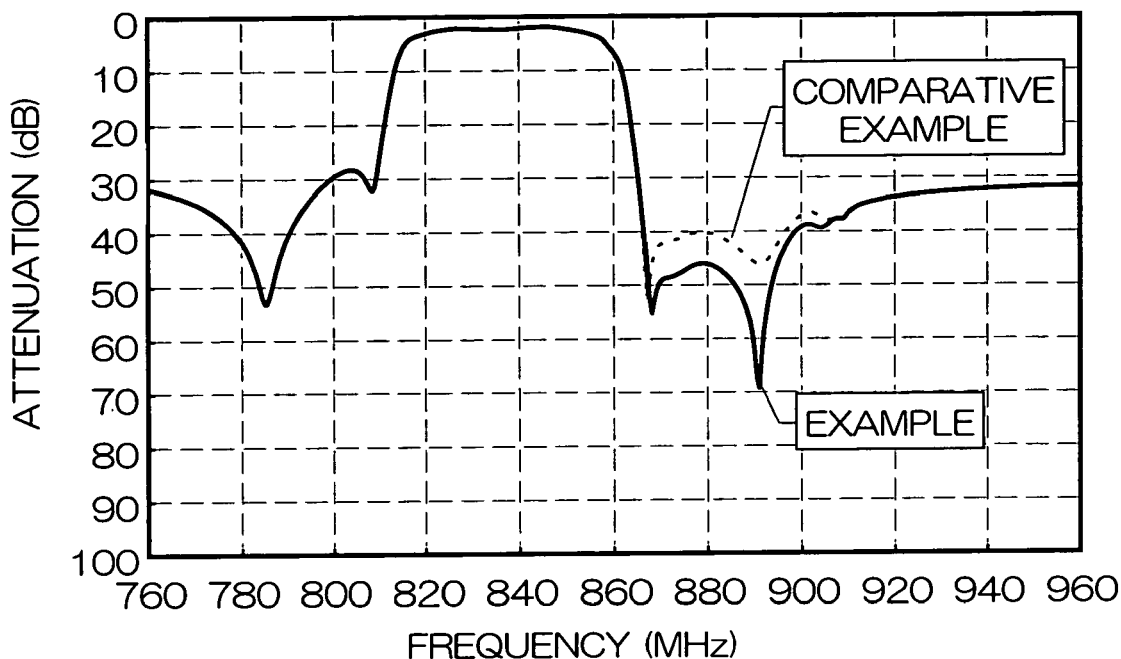
FIG. 38 is a graph showing the pass band characteristics of a surface acoustic wave device manufactured in an example 1 of the present invention.

In FIG. 38, a frequency (unit:MHz) is used to enter the horizontal axis, and an attenuation (unit:dB) is used to enter the vertical axis. A characteristic curve indicated by a broken line shows the results of the comparative example in which the conductor layer was formed throughout the other surface of the piezoelectric substrate, and a characteristic curve indicated by a solid line shows the results of the example in which regions opposed to the input electrode section and the output electrode section in the filter region were removed from the conductor layer on the other surface of the piezoelectric substrate.

As apparent from the results shown in FIG. 38, the surface acoustic wave device according to the present invention in this example had a much better out-of-band attenuation, as compared with that in the comparative example. Particularly, out-of-band attenuation characteristics in the vicinity of the pass band was more significantly improved, as compared with those in the comparative example.

When a surface acoustic wave device in which a conductor layer 10 was patterned, as shown in FIGS. 6 to 8, was also manufactured, and the frequency characteristics thereof were similarly evaluated, it could be also confirmed that out-of-band attenuation characteristics in the vicinity of the pass band were significantly improved.

EXAMPLE 2

EXAMPLE 2-1

As in the example 1, four electrode layers were deposited on a main surface of a lithium tantalate single crystal substrate.

As shown in FIG. 2, the electrode layers were then patterned by photolithography and RIE, to form a large number of surface acoustic wave element regions each having a transmission-side filter region 12 and a receiving-side filter region 13 respectively comprising IDT electrodes 3, input electrode sections 5i and 5j, and output electrode sections 6i and 6j. At the same time, a ground electrode section 11, a connection electrode 4, and an annular electrode 7 were also formed.

Used as etching gas at this time was mixed gas of $BCl_3$ and $Cl_2$. Both the line width of comb-shaped electrodes forming the IDT electrode 3 and the distance between the adjacent comb-shaped electrodes were approximately 1 μm.

A conductor layer 10 composed of pure Al was then formed on the other surface of a piezoelectric substrate 2 by a sputtering method. The thickness of the conductor layer 10 was 200 nm.

A protective film composed of silica was then deposited on a main surface of the piezoelectric substrate 2 by a plasma CVD method. The deposition temperature was 300° C., and the film thickness was 20 nm.

A part of the protective film was then removed by photolithography and RIE, and new electrode layers respectively composed of Cr, Ni, and Au were laminated on the input electrode section 5, the output electrode section 6, and the ground electrode section 11, to respectively form an input electrode pad, an output electrode pad, and a ground electrode pad. Further, electrode layers having the same structure were also formed on the annular electrode 7. The thicknesses of the new electrode layers were respectively 6 nm, 1000 nm, and 100 nm.

The main surface of the piezoelectric substrate 2 was then protected by a photoresist, the photoresist was then also applied to the other surface thereof, followed by photolithography, and the conductor layer 10 on the other surface of the piezoelectric substrate 2 was patterned, as shown in FIG. 13, by wet etching using a mixed acid of a nitric acid, a phosphoric acid, and an acetic acid.

After the photoresist was removed, the piezoelectric substrate 2 was then separated by dicing for each of the surface acoustic wave element regions, to obtain a large number of surface acoustic wave elements 1.

The surface acoustic wave element 1 was then mounted on a mounting substrate composed of an LTCC (Low Temperature Co-fired Ceramics) substrate with its main surface opposed thereto. The mounting method was the same as that in the example 1.

Resin molding was then performed, to protect the other surface (reverse surface) of the surface acoustic wave element 1 by molding resin. Finally, the mounting substrate was diced between the surface acoustic wave elements 1, to obtain a surface acoustic wave device according to the present invention.

With respect to the surface acoustic wave device according to the present invention thus manufactured, isolation characteristics thereof were measured. The results thereof are shown in a graph of FIG. 39.

The isolation characteristics were found by applying an RF signal to an input terminal of a transmission-side filter and measuring a signal from an output terminal of a receiving-side filter (measured in a state where a matching network generally inserted between the transmission-side filter and the receiving-side filter when the surface acoustic wave device was employed as a branching filter was not incorporated).

Figure 39:
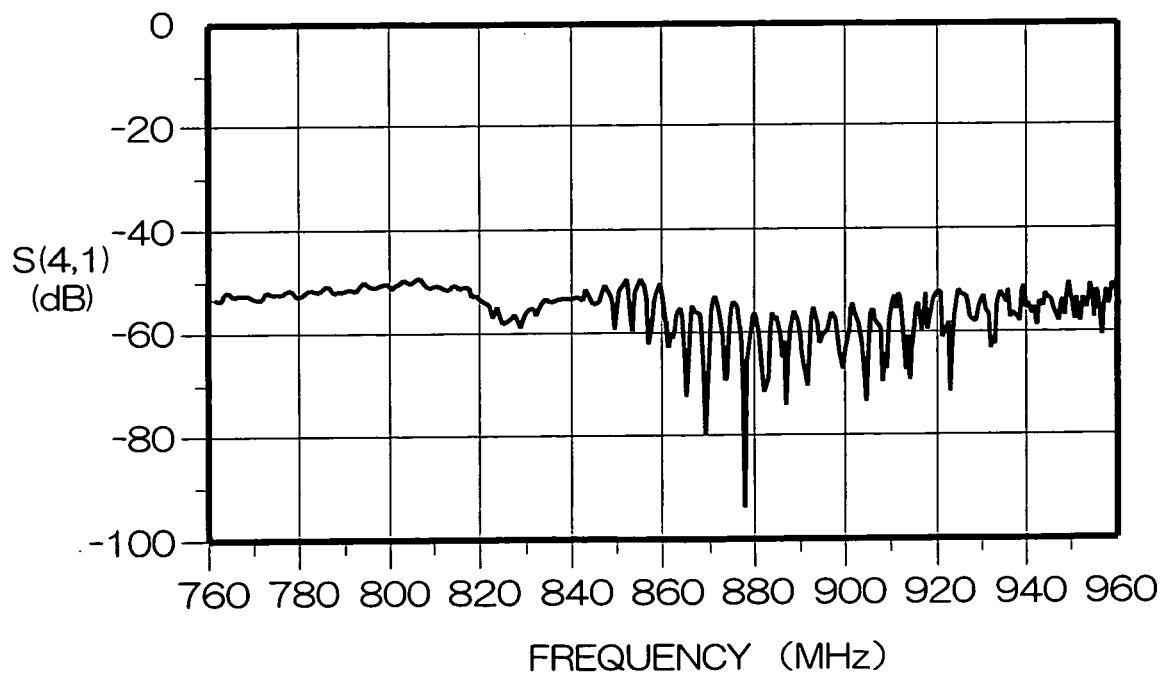
FIG. 39 is a graph showing the isolation characteristics of a surface acoustic wave device manufactured in an example 2 of the present invention.

As apparent from the results shown in FIG. 39, the surface acoustic wave device according to the present invention in this example had significantly good isolation characteristics.

EXAMPLE 2-2

As in the example 1, four electrode layers were deposited on a main surface of a lithium tantalate single crystal substrate.

A conductor layer 10 composed of pure Al was then formed on the other surface of a piezoelectric substrate 2 by a sputtering method. The thickness of the conductor layer 10 was 200 nm.

As shown in FIG. 4, the electrode layers on a main surface of the piezoelectric substrate 2 were then patterned by photolithography and RIE, to form a large number of surface acoustic wave element regions each having a transmission-side filter region 12 and a receiving-side filter region 13 respectively comprising IDT electrodes 3, input electrode sections 5i and 5j, and output electrode sections 6i and 6j. At the same time, a ground electrode section 11, a connection electrode 4, and an annular electrode 7 were also formed.

Used as etching gas in the RIE was $BCl_3$ and $Cl_2$. Both the line width of comb-shaped electrodes forming the IDT electrode 3 and the distance between the adjacent comb-shaped electrodes were approximately 1 µm.

A protective film composed of silica was then deposited on a main surface of the piezoelectric substrate 2 by a plasma CVD method. The deposition temperature was 300° C., and the film thickness was 20 nm.

A portion of the protective film was then removed by photolithography and RIE, a resistor 15 composed of silicon to which boron was added in small amounts was deposited in the removed portion by a sputtering method, and the IDT electrode 3 was connected to the annular electrode 7 through the resistor 15.

A part of the protective film was then removed by photolithography and RIE, and new electrode layers respectively composed of Cr, Ni, and Au were laminated on the input electrode section 5, the output electrode section 6, and the ground electrode section 11, to respectively form an input electrode pad, an output electrode pad, and a ground electrode pad. Further, electrode layers having the same structure were also formed on the annular electrode 7. The thicknesses of the new electrode layers were respectively 6 nm, 1000 nm, and 100 nm.

The main surface of the piezoelectric substrate 2 was then protected by a photoresist, the photoresist was then also applied to the other surface thereof, followed by photolithography, to respectively form openings corresponding to a region 12a opposed to the transmission-side filter region 12 and a region 13a opposed to the receiving-side filter region 13, and the conductor layer 10 on the other surface of the piezoelectric substrate 2 was then patterned, as shown in FIG. 13, by wet etching using a mixed acid of a nitric acid, a phosphoric acid, and an acetic acid.

After the photoresist was removed, the piezoelectric substrate 2 was then separated by dicing for each of the surface acoustic wave element regions, to obtain a large number of surface acoustic wave elements 1. The subsequent mounting step was the same as that in the example 2-1.

Although destruction by sparks might occur during the mounting step in the example 2-1, no destruction by sparks occurred by connecting the IDT electrode 3 to a ground potential directly by the resistor 15 in the example 2-2.

EXAMPLE 2-3

Although wet etching was used in the step of removing the conductor layer 10 on the other surface in the examples 2-1 and 2-2, mechanical grinding using sand paper was used in this example.

Although manufacturing steps of a surface acoustic wave element 1 were the same as those in the examples 2-1 and 2-2, a conductor layer 10 on the other surface was removed after the surface acoustic wave element 1 was mounted on an LTCC substrate serving as a mounting substrate.

Here, used as the sand paper were ones respectively having roughnesses of #1500, #400, and #220. After removing the conductor layer 10 using each sand paper, the surface roughness on the other surface of a piezoelectric substrate 2 corresponded to the roughness of the sand paper.

With respect to a surface acoustic wave device thus manufactured, the change in isolation characteristics relative to the roughness of each sand paper used was measured.

Figure 35A:
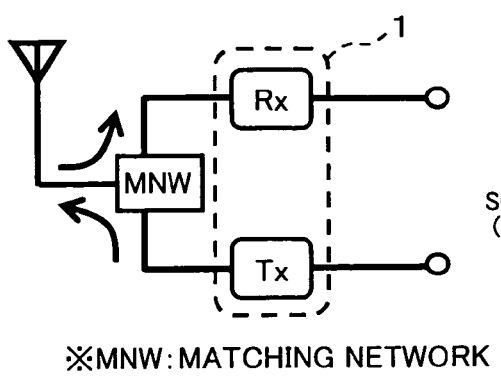
FIG. 35($a$) is a circuit diagram of a communications equipment in a case where there is no parasitic capacitance.
Figure 35B:
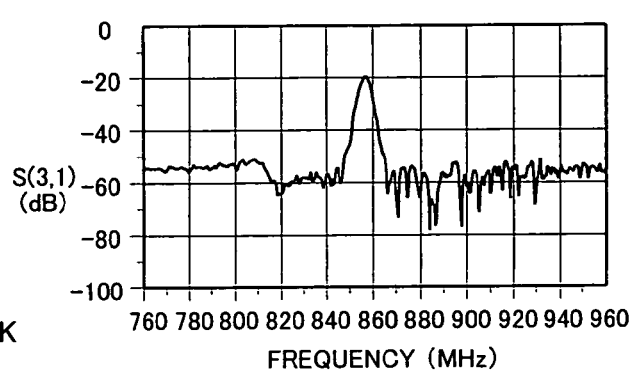
Figure 35C:
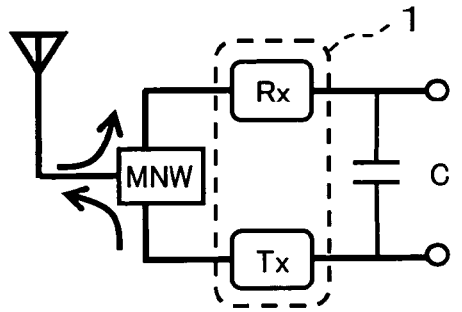
Figure 35D:
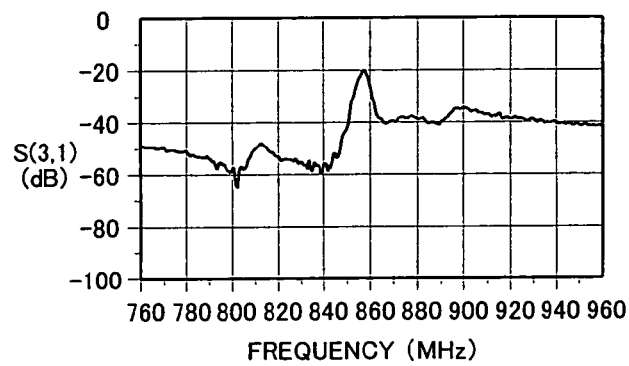

The isolation characteristics were measured in the state of a circuit shown in FIG. 35(a) in which a matching network was inserted. The change in isolation characteristics relative to the roughness of each sand paper used is shown in graphs of FIGS. 44(a) to 44(c).

Figure 44A:
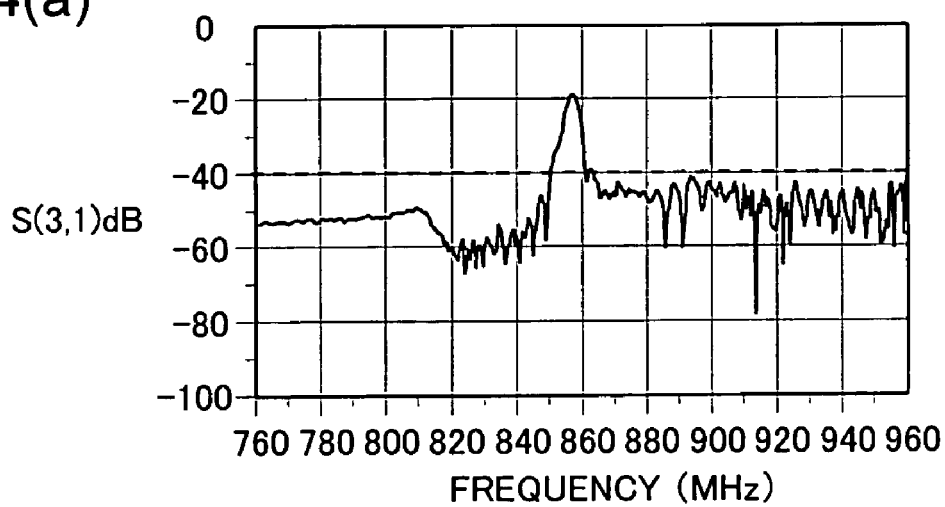
FIGS. 44($a$) to 44($c$) are graphs showing the isolation characteristics of a surface acoustic wave device from which a conductor layer on the other surface is mechanically removed.
Figure 44B:
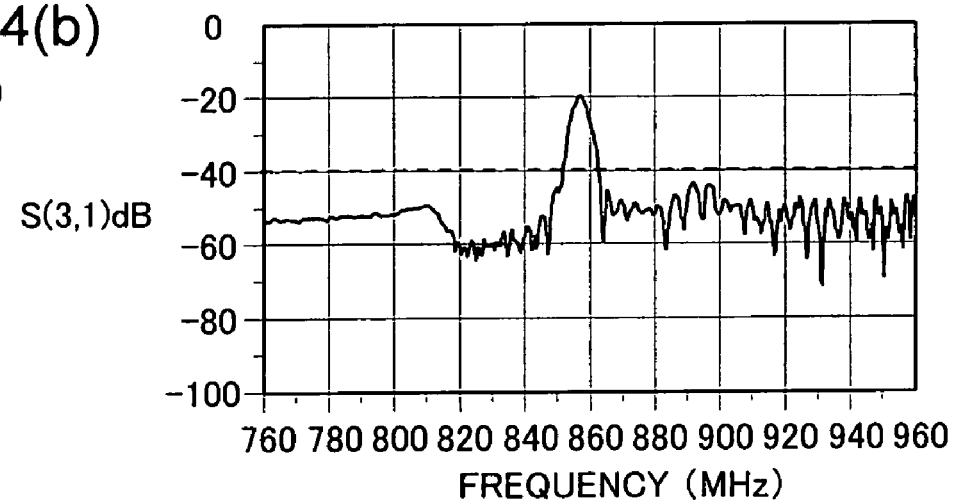
Figure 44C:
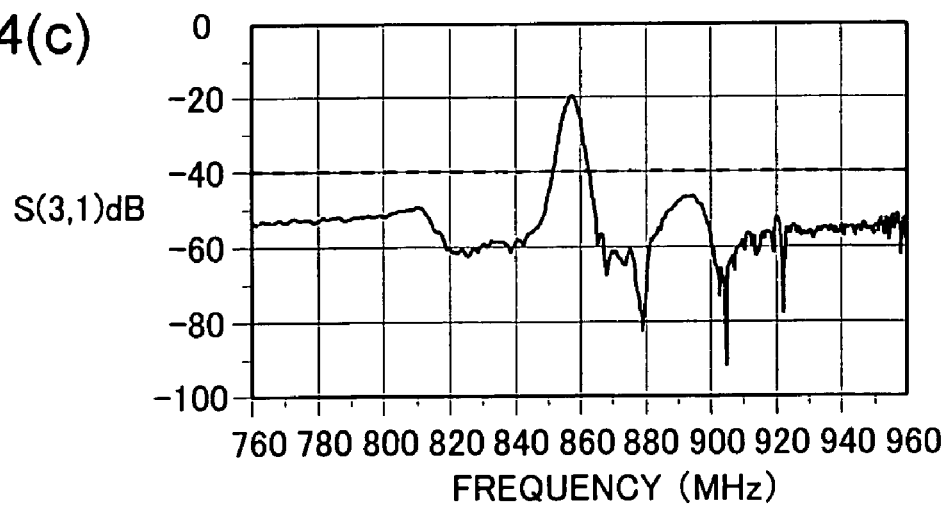
Figure 45:
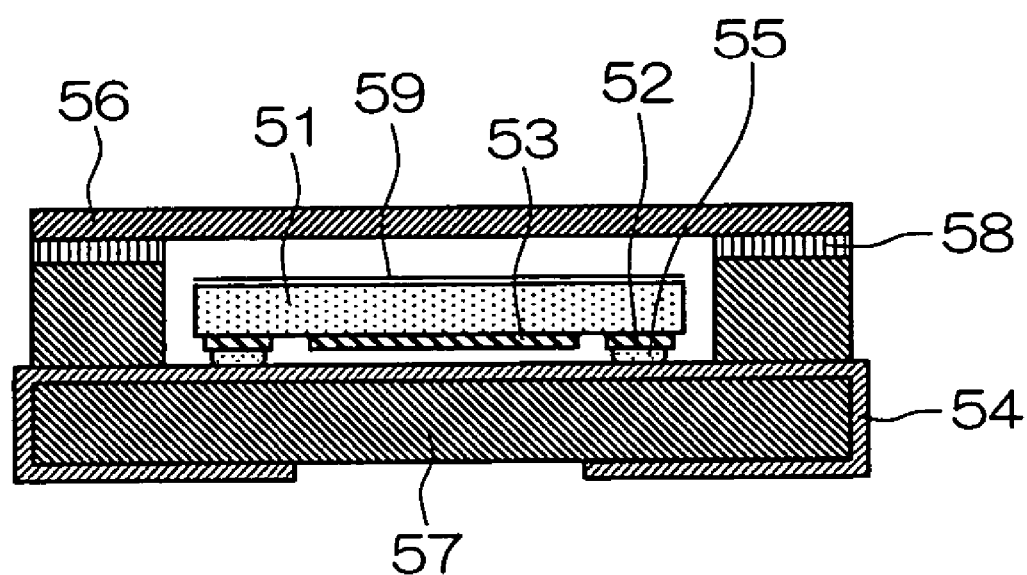
FIG. 45 is a cross-sectional view schematically showing a mounting structure of a conventional surface acoustic wave device.

As apparent from the results shown in FIGS. 44(a) to 44(c), the higher the roughness of the sand paper was, the more the isolation characteristics were improved. In a case where the sand paper having the roughness #220 was used, it was found that the isolation characteristics were significantly improved.

The higher the roughness of the sand paper was, the higher the surface roughness on the other surface of the piezoelectric substrate 2 became. Therefore, it was found that fine ripples caused by a bulk wave seen in the waveform of the isolation characteristics were small.

EXAMPLE 3

As in the example 1, four electrode layers were deposited on a main surface of a lithium tantalate single crystal substrate.

As shown in FIG. 1, the electrode layers were then patterned by photolithography and RIE, to form filter regions each comprising an IDT electrode 3, an input electrode section 5, and an output electrode section 6, to form a large number of surface acoustic wave element regions. At the same time, a ground electrode section 8, a connection electrode 4, and an annular electrode 7 were also formed.

Used as etching gas at this time was mixed gas of $BCl_3$ and $Cl_2$. Both the line width of comb-shaped electrodes forming the IDT electrode 3 and the distance between the adjacent comb-shaped electrodes were approximately 1 μm.

A conductor layer 10 composed of pure Al was then formed on the other surface of a piezoelectric substrate 2 by a sputtering method. The thickness of the conductor layer 10 was 200 nm.

A protective film composed of silica was then deposited on a main surface of the piezoelectric substrate 2 by a plasma CVD method. The deposition temperature was 300° C., and the film thickness was 20 nm.

A part of the protective film was then removed by photolithography and RIE, and new electrode layers respectively composed of Cr, Ni, and Au were laminated on the input electrode section 5, the output electrode section 6, and the ground electrode section 8, to respectively form an input electrode pad, an output electrode pad, and a ground electrode pad. Further, electrode layers having the same structure were also formed on the annular electrode 7. The thicknesses of the new electrode layers were respectively 6 nm, 1000 nm, and 100 nm.

The main surface of the piezoelectric substrate 2 was then protected by a photoresist, the photoresist was then also applied to the other surface thereof, followed by photolithography, and the conductor layer 10 on the other surface of the piezoelectric substrate 2 was patterned, as shown in FIG. 14, by wet etching using a mixed acid of a nitric acid, a phosphoric acid, and an acetic acid.

After the photoresist was removed, the piezoelectric substrate 2 was then separated by dicing for each of the surface acoustic wave element regions, to obtain a large number of surface acoustic wave elements 1.

The surface acoustic wave element 1 was then mounted on a mounting substrate composed of an LTCC (Low Temperature Co-fired Ceramics) substrate with its main surface opposed thereto. The mounting method was the same as that in the example 1.

Resin molding was then performed, to protect the other surface (reverse surface) of the surface acoustic wave element 1 by molding resin. Finally, the mounting substrate was diced between the surface acoustic wave elements 1, to obtain a surface acoustic wave device according to the present invention.

As a comparative example, a surface acoustic wave element in which a filter region comprising an IDT electrode, an input electrode section, and an output electrode section is formed on a main surface of a piezoelectric substrate, as in the conventional example, and a conductor layer is formed throughout the other surface was mounted on a mounting substrate with its main surface opposed thereto, to manufacture a surface acoustic wave device. A plan view of the comparative example was the same as that shown in FIG. 1.

With respect to the example and the comparative example of the present invention thus manufactured, frequency characteristics thereof were measured.

Figure 40:
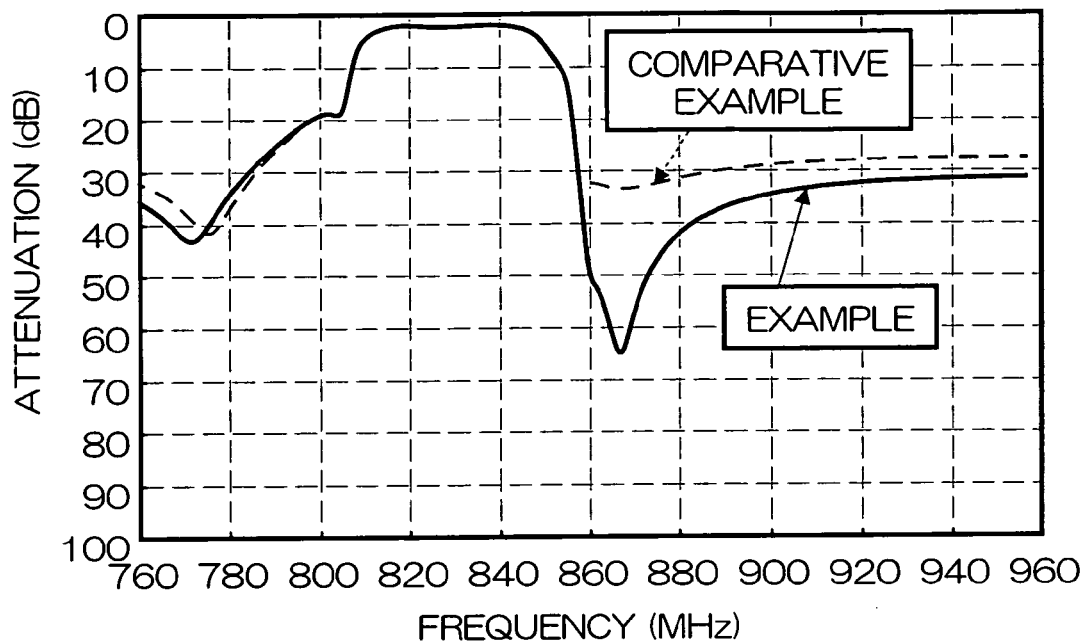
FIG. 40 is a graph showing the pass band characteristics of a surface acoustic wave device manufactured in an example 3 of the present invention.

The frequency characteristics is shown in a graph of FIG. 40. In FIG. 40, a frequency (unit:MHz) is used to enter the horizontal axis, and an attenuation (unit:dB) is used to enter the vertical axis. A characteristic curve indicated by a broken line shows the results of the comparative example in which the conductor layer was formed throughout the other surface of an LT substrate, and a characteristic curve indicated by a solid line shows the results of the example in which a region where the conductor layer on the other surface of the LT substrate was opposed to the input electrode section and the output electrode section in the filter region was isolated from the other region.

As apparent from the results shown in FIG. 40, the surface acoustic wave device according to the present invention in this example had a much better out-of-band attenuation, as compared with that in the comparative example. Particularly, out-of-band attenuation characteristics in the vicinity of the pass band was more significantly improved, as compared with those in the comparative example.

When a surface acoustic wave device in which a conductor layer 10 was patterned, as shown in FIGS. 15 and 16, was also manufactured, and the frequency characteristics thereof were similarly evaluated, it could be also confirmed that out-of-band attenuation characteristics in the vicinity of the pass band were significantly improved.

EXAMPLE 4

EXAMPLE 4-1

As in the example 1, four electrode layers were deposited on a main surface of a lithium tantalate single crystal substrate.

As shown in FIG. 2, the electrode layers were then patterned by photolithography and RIE, to form a large number of surface acoustic wave element regions each having a transmission-side filter region 12 and a receiving-side filter region 13 respectively comprising IDT electrodes 3, input electrode sections 5$i$ and 5$j$, and output electrode sections 6$i$ and 6$j$. At the same time, a ground electrode section 11, a connection electrode 4, and an annular electrode 7 were also formed.

Used as etching gas at this time was mixed gas of $BCl_3$ and $Cl_2$. Both the line width of comb-shaped electrodes forming the IDT electrode 3 and the distance between the adjacent comb-shaped electrodes were approximately 1 μm.

A conductor layer 10 composed of pure Al was then formed on the other surface of a piezoelectric substrate 2 by a sputtering method. The thickness of the conductor layer 10 was 200 nm.

A protective film composed of silica was then deposited on a main surface of the piezoelectric substrate 2 by a plasma CVD method. The deposition temperature was 300° C., and the film thickness was 20 nm.

A part of the protective film was then removed by photolithography and RIE, and new electrode layers respectively composed of Cr, Ni, and Au were laminated on the input electrode section 5, the output electrode section 6, and the ground electrode section 11, to respectively form an input electrode pad, an output electrode pad, and a ground electrode pad. Further, electrode layers having the same structure were also formed on the annular electrode 7. The thicknesses of the new electrode layers were respectively 6 nm, 1000 nm, and 100 nm.

The main surface of the piezoelectric substrate 2 was then protected by a photoresist, and the conductor layer 10 on the other surface of the piezoelectric substrate 2 was then patterned, as shown in FIG. 22, by wet etching using a mixed acid of a nitric acid, a phosphoric acid, and an acetic acid.

After the photoresist was removed, the piezoelectric substrate 2 was then separated by dicing for each of the surface acoustic wave element regions, to obtain a large number of surface acoustic wave elements 1.

The surface acoustic wave element 1 was then mounted on a mounting substrate composed of an LTCC (Low Temperature Co-fired Ceramics) substrate with its main surface opposed thereto. The mounting method was the same as that in the example 1.

Resin molding was then performed, to protect the other surface (reverse surface) of the surface acoustic wave element 1 by molding resin. Finally, the mounting substrate was diced between the surface acoustic wave elements 1, to obtain a surface acoustic wave device according to the present invention.

With respect to the surface acoustic wave device according to the present invention thus manufactured, isolation characteristics thereof were measured. The results thereof are shown in a graph of FIG. 41.

The isolation characteristics were found by applying an RF signal to an input terminal of a transmission-side filter and measuring a signal from an output terminal of a receiving-side filter (measured in a state where a matching network generally inserted between the transmission-side filter and the receiving-side filter when the surface acoustic wave device was employed as a branching filter was not incorporated).

As apparent from the results shown in

Figure 41:
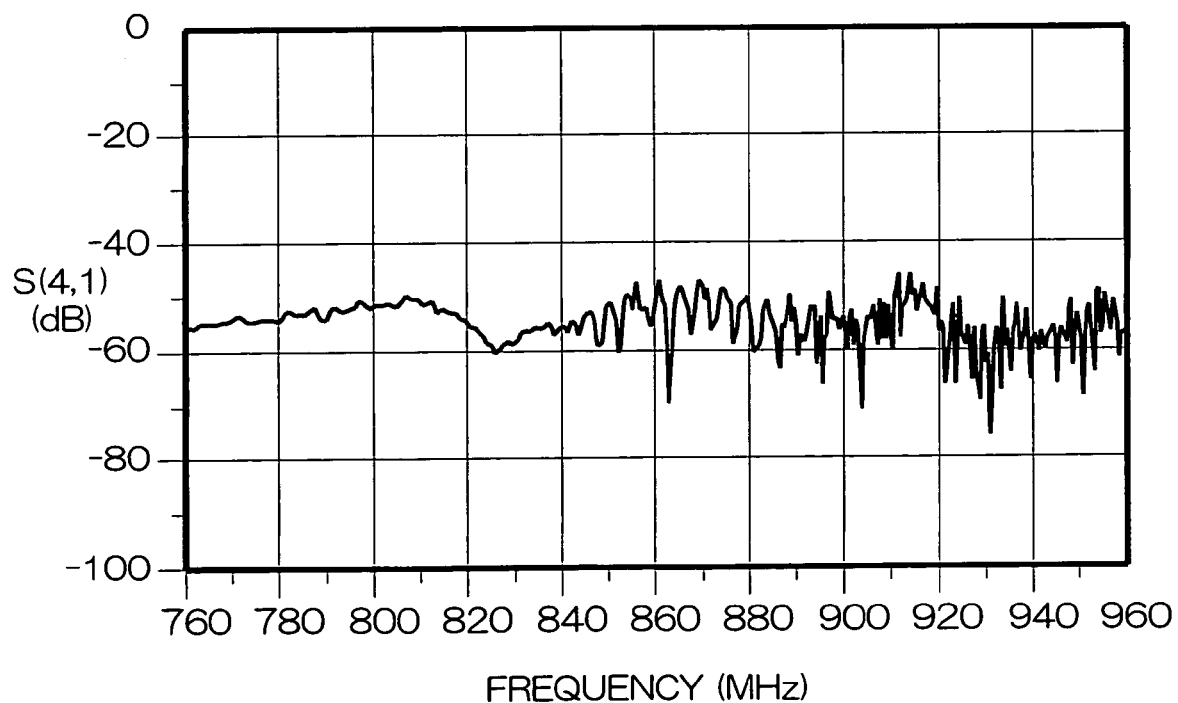
FIG. 41 is a graph showing the isolation characteristics of a surface acoustic wave device manufactured in an example 4 of the present invention.

FIG. 41, the surface acoustic wave device according to the present invention in this example had significantly good isolation characteristics.

EXAMPLE 4-2

As in the example 1, four electrode layers were deposited on a main surface of a lithium tantalate single crystal substrate.

A conductor layer 10 composed of pure Al was then formed on the other surface of a piezoelectric substrate 2 by a sputtering method. The thickness of the conductor layer 10 was 200 nm.

As shown in FIG. 4, the electrode layers on a main surface of the piezoelectric substrate 2 were then patterned by photolithography and RIE, to form a large number of surface acoustic wave element regions each having a transmission-side filter region 12 and a receiving-side filter region 13 respectively comprising IDT electrodes 3, input electrode sections 5*i* and 5*j*, and output electrode sections 6*i* and 6*j*. At the same time, a ground electrode section 11, a connection electrode 4, and an annular electrode 7 were also formed.

Used as etching gas in the RIE was $BCl_3$ and $Cl_2$. Both the line width of comb-shaped electrodes forming the IDT electrode 3 and the distance between the adjacent comb-shaped electrodes were approximately 1 µm.

A protective film composed of silica was then deposited on a main surface of the piezoelectric substrate 2 by a plasma CVD method. The deposition temperature was 300° C., and the film thickness was 20 nm.

A part of the protective film was then removed by photolithography and RIE, a resistor 15 composed of silicon to which boron was added in small amounts was deposited in a removed portion by a sputtering method, and the IDT electrode 3 was connected to the annular electrode 7 through the resistor 15.

Mixed gas of $Cl_2$ was used. Both the line width of comb-shaped electrodes forming the IDT electrode 3 and the distance between the adjacent comb-shaped electrodes were approximately 1 µm.

A conductor layer 10 composed of pure Al was then formed on the other surface of the piezoelectric substrate 2 by a sputtering method. The thickness of the conductor layer 10 was 200 nm.

A protective film composed of silica was then deposited on a main surface of the piezoelectric substrate 2 by a plasma CVD method. The deposition temperature was 300° C., and the film thickness was 20 nm.

A part of the protective film was then removed by photolithography and RIE, and new electrode layers respectively composed of Cr, Ni, and Au were laminated on the input electrode section 5, the output electrode section 6, and the ground electrode section 11, to respectively form an input electrode pad, an output electrode pad, and a ground electrode pad. Further, electrode layers having the same structure were also formed on the annular electrode 7. The thicknesses of the new electrode layers were respectively 6 nm, 1000 nm, and 100 nm.

The main surface of the piezoelectric substrate 2 was then protected by a photoresist, the photoresist was then also applied to the other surface thereof, to respectively form openings corresponding to the surface acoustic wave element regions, and the conductor layer 10 on the other surface of the piezoelectric substrate 2 corresponding to the surface acoustic wave element region was patterned, as shown in FIG. 22, by wet etching using a mixed acid of a nitric acid, a phosphoric acid, and an acetic acid.

After the photoresist was removed, the piezoelectric substrate 2 was then separated by dicing for each of the surface acoustic wave element regions, to obtain a large number of surface acoustic wave elements 1. The subsequent mounting step was the same as that in the example 4-1.

Although destruction by sparks might occur during the mounting step in the example 4-1, no destruction by sparks occurred by connecting the IDT electrode 3 to a ground potential directly by the resistor 15 in the example 4-2.

EXAMPLE 4-3

Although wet etching was used in the step of partially removing the conductor layer 10 on the other surface in order to isolate a predetermined region in the examples 4-1 and 4-2, mechanical grinding by sand paper was used in this example.

Although manufacturing steps of a surface acoustic wave element 1 were the same as those in the examples 1 and 2, partial removal for isolating a conductor layer 10 on the other surface was performed after the surface acoustic wave element 1 was mounted on an LTCC substrate serving as a mounting substrate.

Here, used as the sand paper were ones respectively having roughnesses of #1500, #400, and #220. After partially removing the conductor layer 10 using each sand paper, the surface roughness on the other surface of a piezoelectric substrate 2 in a removed portion corresponded to the roughness of the sand paper.

With respect to a surface acoustic wave device thus manufactured, the change in isolation characteristics relative to the roughness of each sand paper used was measured, as in the example 4-1. The isolation characteristics were measured in the state of a circuit shown in FIG. 35(*a*) in which a matching network was inserted.

As a result, the higher the roughness of the sand paper was, the more the isolation characteristics were improved. In a case where the sand paper having the roughness "220" was used, the isolation characteristics were significantly improved.

The higher the roughness of the sand paper was, the higher the surface roughness on the other surface of the piezoelectric substrate 2 became. Therefore, it was found that fine ripples caused by a bulk wave seen in the waveform of the isolation characteristics were small.

EXAMPLE 5

As in the example 1, four electrode layers were deposited on a main surface of a lithium tantalate single crystal substrate.

As shown in FIG. 1, the electrode layers were then patterned by photolithography and RIE, to form filter regions each comprising an IDT electrode 3, an input electrode section 5, and an output electrode section 6, to form a large number of surface acoustic wave element regions.

Used as etching gas at this time was mixed gas of $BCl_3$ and $Cl_2$. Both the line width of comb-shaped electrodes forming the IDT electrode 3 and the distance between the adjacent comb-shaped electrodes were approximately 1 μm.

A conductor layer 10 composed of pure Al was then formed on the other surface of a piezoelectric substrate 2 by a sputtering method. The thickness of the conductor layer 10 was 200 nm.

A protective film composed of silica was then deposited on the main surface of the piezoelectric substrate 2 by a plasma CVD method. The deposition temperature was 300° C., and the film thickness was 20 nm.

A part of the protective film was then removed by photolithography and RIE, and new electrode layers respectively composed of Cr, Ni, and Au were laminated on the input electrode section 5 and the output electrode section 6, to respectively form an input electrode pad and an output electrode pad. The thicknesses of the new electrode layers were respectively 6 nm, 1000 nm, and 100 nm.

The main surface of the piezoelectric substrate 2 was then protected by a photoresist, the photoresist was then also applied to the other surface thereof, followed by photolithography, and the conductor layer 10 on the other surface of the piezoelectric substrate 2 was patterned, as shown in FIG. 23, by wet etching using a mixed acid of a nitric acid, a phosphoric acid, and an acetic acid.

After the photoresist was removed, the piezoelectric substrate 2 was then separated by dicing for each of the surface acoustic wave element regions, to obtain a large number of surface acoustic wave elements 1.

The surface acoustic wave element 1 was then mounted on a mounting substrate composed of an LTCC (Low Temperature Co-fired Ceramics) substrate with its main surface opposed thereto. The mounting method was the same as that in the example 1

Resin molding was then performed, to protect the other surface (reverse surface) of the surface acoustic wave element 1 by molding resin. Finally, the mounting substrate was diced between the surface acoustic wave elements 1, to obtain a surface acoustic wave device according to the present invention.

As a comparative example, a surface acoustic wave element in which a filter region comprising an IDT electrode, an input electrode section, and an output electrode section is formed on a main surface of a piezoelectric substrate, as in the conventional example, and a conductor layer is formed throughout the other surface was mounted on a mounting substrate with its main surface opposed thereto, to manufacture a surface acoustic wave device. A plan view of the comparative example was the same as that shown in FIG. 1.

Figure 42:
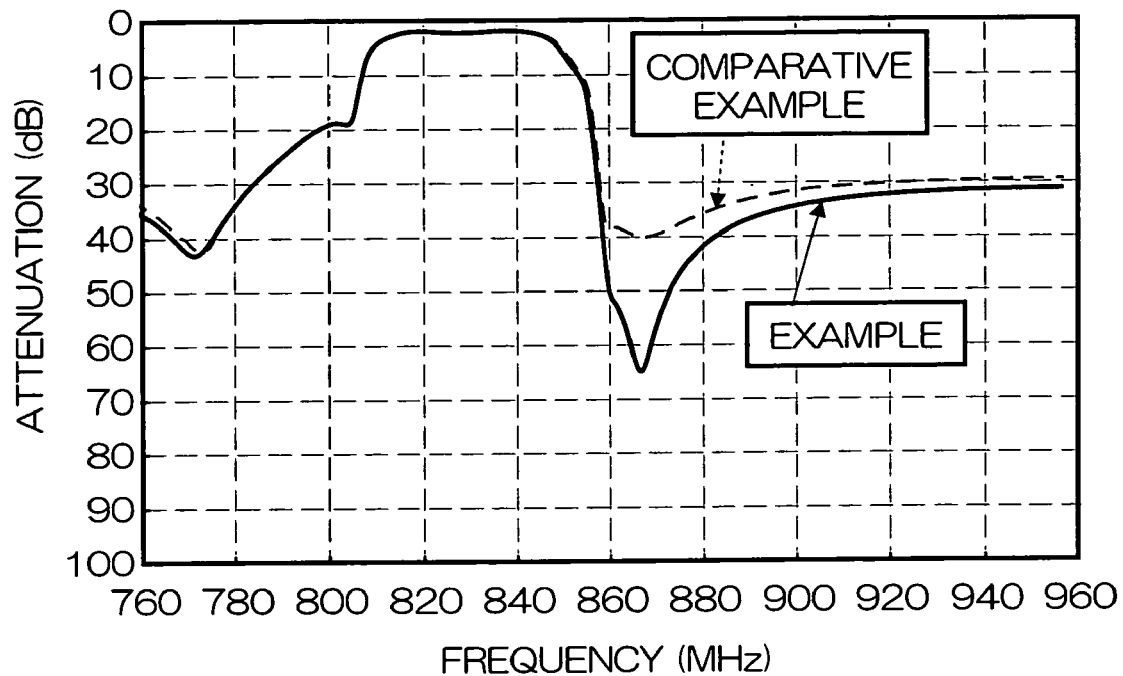
FIG. 42 is a graph showing the pass band characteristics of a surface acoustic wave device manufactured in an example 5 of the present invention.

With respect to the example and the comparative example of the present invention thus manufactured, frequency characteristics thereof were measured. The frequency characteristics are shown in a graph of FIG. 42. In FIG. 42, a frequency (unit:MHz) is used to enter the horizontal axis, and an attenuation (unit:dB) is used to enter the vertical axis. A characteristic curve indicated by a broken line shows the results of the comparative example in which a conductor layer was formed throughout the other surface of an LT substrate, and a characteristic curve indicated by a solid line shows the results of the example in which the conductor layer on the other surface of the LT substrate was formed by dotting a large number of conductor-unformed regions.

As apparent from the results shown in FIG. 42, the surface acoustic wave device according to the present invention in this example had a much better out-of-band attenuation, as compared with that in the comparative example. Particularly, out-of-band attenuation characteristics in the vicinity of the pass band was more significantly improved, as compared with those in the comparative example.

When a surface acoustic wave device in which a conductor layer 10 was patterned, as shown in FIGS. 24 and 25, was also manufactured, and the frequency characteristics thereof were similarly evaluated, it could be also confirmed that out-of-band attenuation characteristics in the vicinity of the pass band were significantly improved.

EXAMPLE 6

EXAMPLE 6-1

As in the example 1, four electrode layers were deposited on a main surface of a lithium tantalate single crystal substrate.

As shown in FIG. 2, the electrode layers were then patterned by photolithography and RIE, to form a large number of surface acoustic wave element regions each having a transmission-side filter region 12 and a receiving-side filter region 13 respectively comprising IDT electrodes 3, input electrode sections 5i and 5j, and output electrode sections 6i and 6j. Used as etching gas at this time was mixed gas of $BCl_3$ and $Cl_2$. Both the line width of comb-shaped electrodes forming the IDT electrode 3 and the distance between the adjacent comb-shaped electrodes were approximately 1 μm. At the same time, a ground electrode section 11, a connection electrode 4, and an annular electrode 7 were also formed.

A conductor layer 10 composed of pure Al was then formed on the other surface of a piezoelectric substrate 2 by a sputtering method. The thickness of the conductor layer 10 was 200 nm.

A protective film composed of silica was then deposited on a main surface of the piezoelectric substrate by a plasma CVD method. The deposition temperature was 300° C., and the film thickness was 20 nm.

A part of the protective film was then removed by photolithography and RIE, and new electrode layers respectively composed of Cr, Ni, and Au were laminated on the input electrode section 5, the output electrode section 6, and the ground electrode section 11, to respectively form an input electrode pad, an output electrode pad, and a ground electrode pad. Further, electrode layers having the same structure were also formed on the annular electrode 7. The thicknesses of the new electrode layers were respectively 6 nm, 1000 nm, and 100 nm.

The main surface of the piezoelectric substrate 2 was then protected by a photoresist, the photoresist was then also applied to the other surface thereof, followed by photolithography, and the conductor layer 10 on the other surface of the piezoelectric substrate 2 was then patterned in a lattice shape, as shown in FIG. 28, by wet etching using a mixed acid of a nitric acid, a phosphoric acid, and an acetic acid.

After the photoresist was removed, the piezoelectric substrate 2 was then separated by dicing for each of the surface acoustic wave element regions, to obtain a large number of surface acoustic wave elements 1.

The surface acoustic wave element 1 was then mounted on a mounting substrate composed of an LTCC (Low Temperature Co-fired Ceramics) substrate with its main surface opposed thereto. The mounting method was the same as that in the example 1.

Resin molding was then performed, to protect the other surface (reverse surface) of the surface acoustic wave element 1 by molding resin. Finally, the mounting substrate was diced between the surface acoustic wave elements 1, to obtain a surface acoustic wave device according to the present invention.

With respect to the surface acoustic wave device according to the present invention thus manufactured, isolation characteristics thereof were measured.

Figure 43:
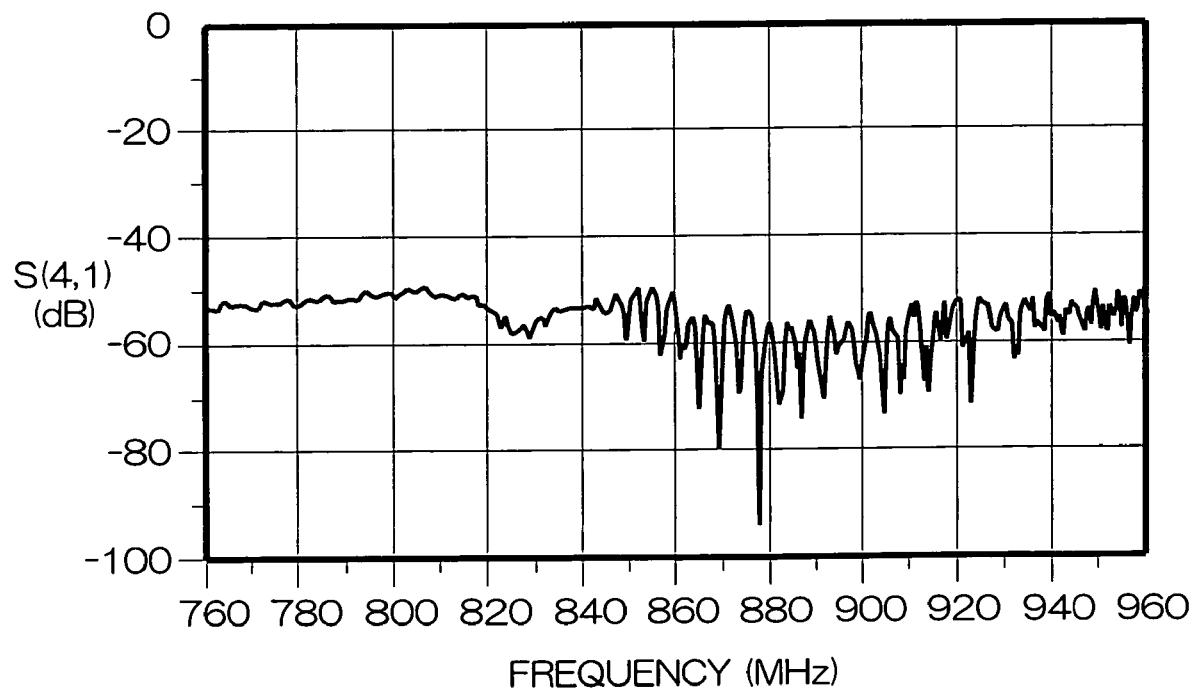
FIG. 43 is a graph showing the isolation characteristics of a surface acoustic wave device manufactured in an example 6 of the present invention.

The isolation characteristics are shown in a graph of FIG. 43. The isolation characteristics were found by applying an RF signal to an input terminal of a transmission-side filter and measuring a signal from an output terminal of a receiving-side filter (measured in a state where a matching network generally inserted between the transmission-side filter and the receiving-side filter when the surface acoustic wave device was employed as a branching filter was not incorporated).

As apparent from the results shown in FIG. 43, the surface acoustic wave device according to the present invention in this example had significantly good isolation characteristics.

EXAMPLE 6-2

As in the example 1, four electrode layers were deposited on a main surface of a lithium tantalate single crystal substrate.

A conductor layer 10 composed of pure Al was then formed on the other surface of a piezoelectric substrate 2 by a sputtering method. The thickness of the conductor layer 10 was 200 nm.

As shown in FIG. 4, the electrode layer on a main surface of a piezoelectric substrate 2 was then patterned by photolithography and RIE, to form a large number of surface acoustic wave element regions each having a transmission-side filter region 12 and a receiving-side filter region 13 respectively comprising IDT electrodes 3, input electrode sections 5i and 5j, and output electrode sections 6i and 6j. At the same time, a ground electrode section 11, a connection electrode 4, and an annular electrode 7 were also formed.

Used as etching gas in the RIE was $BCl_3$ and $Cl_2$. Both the line width of comb-shaped electrodes forming the IDT electrode 3 and the distance between the adjacent comb-shaped electrodes were approximately 1 µm.

A protective film composed of silica was then deposited on a main surface of the piezoelectric substrate by a plasma CVD method. The deposition temperature was 300° C., and the film thickness was 20 nm.

A part of the protective film was then removed by photolithography and RIE, a resistor 15 composed of silicon to which boron was added in small amounts was deposited in a removed portion by a sputtering method, and the IDT electrode 3 was connected to the annular electrode 7 through the resistor 15.

A part of the protective film was then removed by photolithography and RIE, and new electrode layers respectively composed of Cr, Ni, and Au were laminated on the input electrode section 5, the output electrode section 6, and the ground electrode section 11, to respectively form an input electrode pad, an output electrode pad, and a ground electrode pad. Further, electrode layers having the same structure were also formed on the annular electrode 7. The thicknesses of the new electrode layers were respectively 6 nm, 1000 nm, and 100 nm.

The main surface of the piezoelectric substrate 2 was then protected by a photoresist, the photoresist was then also applied to the other surface thereof, followed by photolithography, and the conductor layer 10 on the other surface of the piezoelectric substrate 2 was then patterned in a lattice shape, as shown in FIG. 28, by wet etching using a mixed acid of a nitric acid, a phosphoric acid, and an acetic acid, to dot a large number of conductor-unformed regions.

After the photoresist was removed, the piezoelectric substrate 2 was then separated by dicing for each of the surface acoustic wave element regions, to obtain a large number of surface acoustic wave elements 1. The subsequent mounting step was the same as that in the example 6-1.

Although destruction by sparks might occur during the mounting step in the example 6-1, no destruction by sparks occurred by connecting the IDT electrode 3 to a ground potential directly by the resistor 15 in the example 6-2.

EXAMPLE 6-3

Although wet etching was used in the step of partially removing the conductor layer 10 on the other surface in order to dot a large number of conductor-unformed regions in a predetermined region in the examples 6-1 and 6-2, mechanical grinding by sand paper was used in this example.

Although manufacturing steps of a surface acoustic wave element 1 were the same as those in the examples 1 and 2, partial removal for dotting a large number of conductor-unformed regions on a conductor layer 10 on the other surface was performed after the surface acoustic wave element 1 was mounted on an LTCC substrate serving as a mounting substrate.

Here, used as the sand paper were ones respectively having roughnesses of #1500, #400, and #220. After partially removing the conductor layer 10 using each sand paper, the surface roughness on the other surface of a piezoelectric substrate 2 in a removed portion corresponded to the roughness of the sand paper.

With respect to a surface acoustic wave device thus manufactured, the change in isolation characteristics relative to the roughness of each sand paper used was measured, as in the example 6-1. The isolation characteristics were measured in the state of a circuit shown in FIG. 35(a) in which a matching network was inserted. The change in the isolation characteristics relative to the roughness of each sand paper used was substantially the same as that shown in FIGS. 44(a) to 44(c).

As a result, the higher the roughness of the sand paper was, the more the isolation characteristics were improved. In a case where the sand paper having the roughness "220" was used, the isolation characteristics were significantly improved. The higher the roughness of the sand paper was, the higher the surface roughness on the other surface of the piezoelectric substrate 2 became. Therefore, it was found that fine ripples caused by a bulk wave seen in the waveform of the isolation characteristics were small.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A surface acoustic wave device in which a main surface of a piezoelectric substrate having a filter region formed thereon is mounted on a mounting substrate, comprising:

an IDT electrode, an input electrode section, and an output electrode section formed in the filter region on the main surface of the piezoelectric substrate; and a conductor layer formed on the other surface opposite to the main surface of the piezoelectric substrate; wherein the conductor layer is formed on the other surface of the piezoelectric substrate, except for a region opposed to the input electrode section and/or a region opposed to the output electrode section on the other surface of the piezoelectric substrate.

2. The surface acoustic wave device according to claim 1, wherein the conductor layer is a first conductor layer, and in the region opposed to the input electrode section and/or the region opposed to the output electrode section on the other surface of the piezoelectric substrate, a second conductor layer is provided that is isolated from the first conductor layer.

3. A method of manufacturing the surface acoustic wave device according to claim 1, comprising:

an electrode layer formation step for forming an electrode layer on a main surface of a piezoelectric substrate;

an electrode patterning step for patterning the electrode layer on the main surface to form a filter region comprising an IDT electrode, an input electrode section, and an output electrode section; and a step of carrying out either one, of an separation step for separating the piezoelectric substrate to obtain a large number of surface acoustic wave elements, and a mounting step for mounting the surface acoustic wave elements on a mounting substrate with the main surface of the piezoelectric substrate opposed thereto prior to carrying out the other step, a partial conductor layer formation step for partially forming a conductor layer on the other surface of the piezoelectric substrate being provided, wherein the partial conductor layer formation step comprises:

a conductor layer formation step for forming a conductor layer on the other surface of the piezoelectric substrate before the electrode layer formation step, between the electrode layer formation step and the electrode patterning step, or between the electrode patterning step and the separation step or the mounting step, and a removal step for removing a portion, corresponding to a conductor-unformed region where no conductor layer is formed, of the conductor layer formed on the other surface after the conductor layer formation step, and wherein in partially removing the conductor layer formed on the other surface in the removal step, the surface roughness on the other surface of a region to be removed is higher than the surface roughness on the other surface of a region that is not removed.

4. A communications equipment comprising at least one of a receiving circuit and a transmission circuit each having the surface acoustic wave device according to claim 1.

5. A communications equipment using the surface acoustic wave device according to claim 1 as a branching filter.

6. A surface acoustic wave device in which a main surface of a piezoelectric substrate having a filter region formed thereon is mounted on a mounting substrate, comprising:

an IDT electrode, an input electrode section, and an output electrode section formed in the filter region on the main surface of the piezoelectric substrate; and a conductor layer formed on the other surface opposite to the main surface of the piezoelectric substrate; wherein the conductor layer is formed on the other surface of the piezoelectric substrate, except for a region opposed to a portion connected from the input electrode section to the IDT electrode and/or a region opposed to a portion connected from the output electrode section to the IDT electrode on the other surface of the piezoelectric substrate.

7. The surface acoustic wave device according to claim 6, wherein the conductor layer is a first conductor layer, and in the region opposed to the portion connected from the input electrode section to the IDT electrode and/or the region opposed to the portion connected from the output electrode section to the IDT electrode on the other surface of the piezoelectric substrate, a second conductor layer is provided that is isolated from the first conductor layer.

8. A surface acoustic wave device in which a main surface of a piezoelectric substrate having a filter region formed thereon is mounted on a mounting substrate, comprising:

an IDT electrode, an input electrode section, and an output electrode section formed in the filter region on the main surface of the piezoelectric substrate; and a conductor layer formed on the other surface of the piezoelectric substrate with a large number of conductor-unformed regions dispersed, wherein in the region opposed to the input electrode section and/or the region opposed to the output electrode section on the other surface of the piezoelectric substrate, the ratio of an area occupied by the conductor-unformed regions is higher than that in the other region.

9. A surface acoustic wave device in which a main surface of a piezoelectric substrate having a filter region formed thereon is mounted on a mounting substrate, comprising:

an IDT electrode, an input electrode section, and an output electrode section formed in the filter region on the main surface of the piezoelectric substrate; and a conductor layer formed on the other surface of the piezoelectric substrate with a large number of conductor-unformed regions dispersed, wherein in the region opposed to the portion connected from the input electrode section to the IDT electrode and/or the region opposed to the portion connected from the output electrode section to the IDT electrode on the other surface of the piezoelectric substrate, the ratio of an area occupied by the conductor-unformed regions is higher than that in the other region.

10. A surface acoustic wave device in which a main surface of a piezoelectric substrate having a filter region formed thereon is mounted on a mounting substrate, comprising:

an IDT electrode, an input electrode section, and an output electrode section formed in the filter region on the main surface of the piezoelectric substrate; and a conductor layer formed on the other surface opposite to the main surface of the piezoelectric substrate; wherein the conductor layer is formed on the other surface of the piezoelectric substrate, except for a region opposed to the filter region on the other surface of the piezoelectric substrate.

11. A surface acoustic wave device in which a main surface of a piezoelectric substrate having a filter region formed thereon is mounted on a mounting substrate, comprising:

an IDT electrode, an input electrode section, and an output electrode section formed in the filter region on the main surface of the piezoelectric substrate;

a conductor layer formed on the other surface opposite to the main surface of the piezoelectric substrate; wherein the filter region comprises a transmission-side filter region and a receiving-side filter region, and the conductor layer is formed on the other surface of the piezoelectric substrate, except for a region opposed to the input electrode section in the transmission-side filter region and/or a region opposed to the output electrode section in the receiving-side filter region on the other surface of the piezoelectric substrate.

12. The surface acoustic wave device according to claim 11, wherein the conductor layer is a first conductor layer, and in the region opposed to the input electrode section in the transmission-side filter region and/or the region opposed to the output electrode section in the receiving-side filter region on the other surface of the piezoelectric substrate, a second conductor layer is provided that is isolated from the first conductor layer.

13. A surface acoustic wave device in which a main surface of a piezoelectric substrate having a filter region formed thereon is mounted on a mounting substrate, comprising:

an IDT electrode, an input electrode section, and an output electrode section formed in the filter region on the main surface of the piezoelectric substrate;

a conductor layer formed on the other surface opposite to the main surface of the piezoelectric substrate; wherein the filter region comprises a transmission-side filter region and a receiving-side filter region, and the conductor layer is formed on the other surface of the piezoelectric substrate, except for a region opposed to the transmission-side filter region and/or a region opposed to the receiving-side filter region on the other surface of the piezoelectric substrate.

14. The surface acoustic wave device according to claim 13, wherein the conductor layer is a first conductor layer, and in the region opposed to the transmission-side filter region and/or the region opposed to the receiving-side filter region on the other surface of the piezoelectric substrate, a second conductor layer is provided that is isolated from the first conductor layer.

15. A surface acoustic wave device in which a main surface of a piezoelectric substrate having a filter region formed thereon is mounted on a mounting substrate, comprising:

an IDT electrode, an input electrode section, and an output electrode section formed in the filter region on the main surface of the piezoelectric substrate;

a conductor layer formed on the other surface opposite to the main surface of the piezoelectric substrate; wherein the filter region comprises a transmission-side filter region and a receiving-side filter region, and the conductor layer is formed on the other surface of the piezoelectric substrate, except for a region opposed to a portion connected from the input electrode section to the IDT electrode in the transmission-side filter region and/or a region opposed to a portion connected from the output electrode section to the IDT electrode in the receiving-side filter region on the other surface of the piezoelectric substrate.

16. The surface acoustic wave device according to claim 15, wherein the conductor layer is a first conductor layer, and in the region opposed to the portion connected from the input electrode section to the IDT electrode in the transmission-side filter region and/or the region opposed to the portion connected from the output electrode section to the IDT electrode in the receiving-side filter region on the other surface of the piezoelectric substrate, a second conductor layer is provided that is isolated from the first conductor layer.

17. A surface acoustic wave device in which a main surface of a piezoelectric substrate having a filter region formed thereon is mounted on a mounting substrate, comprising:

an IDT electrode, an input electrode section, and an output electrode section formed in the filter region on the main surface of the piezoelectric substrate;

a conductor layer formed on the other surface opposite to the main surface of the piezoelectric substrate; wherein the filter region comprises a transmission-side filter region and a receiving-side filter region, and the conductor layer is formed on the other surface of the piezoelectric substrate with the region opposed to the transmission-side filter region and the region opposed to the receiving-side filter region isolated from each other.

18. The surface acoustic wave device according to claim 17, wherein the conductor layer is formed, in the region opposed to the transmission-side filter region and/or the region opposed to the receiving-side filter region on the other surface of the piezoelectric substrate, with the region opposed to the input electrode section in the transmission-side filter region and the region opposed to the output electrode section in the receiving-side filter region isolated from each other.

19. A surface acoustic wave device in which a main surface of a piezoelectric substrate having a filter region formed thereon is mounted on a mounting substrate, comprising:

an IDT electrode, an input electrode section, and an output electrode section formed in the filter region on the main surface of the piezoelectric substrate; and a conductor layer partially formed on the other surface opposite to the main surface of the piezoelectric substrate; wherein the piezoelectric substrate is an overlapping of two material layers, and is composed of a piezoelectric material on the side of its main surface and a material having a lower dielectric constant than that of the piezoelectric material on the side of the other surface.

20. A surface acoustic wave device in which a main surface of a piezoelectric substrate having a filter region formed thereon is mounted on a mounting substrate, comprising:
an IDT electrode, an input electrode section, and an output electrode section formed in the filter region on the main surface of the piezoelectric substrate;
a conductor layer formed on the other surface opposite to the main surface of the piezoelectric substrate with a large number of conductor-unformed regions dispersed; wherein
the filter region comprises a transmission-side filter region and a receiving-side filter region, and
in the region opposed to the input electrode section in the transmission-side filter region and/or the region opposed to the output electrode section in the receiving-side filter region on the other surface of the piezoelectric substrate, the ratio of an area occupied by the conductor-unformed regions is higher than that in the other region.

21. A surface acoustic wave device in which a main surface of a piezoelectric substrate having a filter region formed thereon is mounted on a mounting substrate, comprising:
an IDT electrode, an input electrode section, and an output electrode section formed in the filter region on the main surface of the piezoelectric substrate;
a conductor layer formed on the other surface opposite to the main surface of the piezoelectric substrate with a large number of conductor-unformed regions dispersed; wherein
the filter region comprises a transmission-side filter region and a receiving-side filter region, and
in the region opposed to the portion connected from the input electrode section to the IDT electrode in the transmission-side filter region and/or the region opposed to the portion connected from the output electrode section to the IDT electrode in the receiving-side filter region on the other surface of the piezoelectric substrate, the ratio of an area occupied by the conductor-unformed regions is higher than that in the other region.

22. A surface acoustic wave device in which a main surface of a piezoelectric substrate having a filter region formed thereon is mounted on a mounting substrate, comprising:
an IDT electrode, an input electrode section, and an output electrode section formed in the filter region on the main surface of the piezoelectric substrate; and
a conductor layer partially formed on the other surface opposite to the main surface of the piezoelectric substrate; wherein
the surface roughness of a region where the conductor layer is not formed on the other surface of the piezoelectric substrate is higher than the surface roughness of a region where the conductor layer is formed.

23. A surface acoustic wave device in which a main surface of a piezoelectric substrate having a filter region formed thereon is mounted on a mounting substrate, comprising:
an IDT electrode, an input electrode section, and an output electrode section formed in the filter region on the main surface of the piezoelectric substrate; and
a conductor layer partially formed on the other surface opposite to the main surface of the piezoelectric substrate; wherein
an annular electrode is formed so as to enclose the filter region on the main surface of the piezoelectric substrate,
a mounting substrate-side annular conductor is formed on the mounting substrate, and
the annular electrode is joined to the mounting substrate-side annular conductor formed on the mounting substrate.

24. The surface acoustic wave device according to claim 23, wherein
the IDT electrode is electrically connected to the annular electrode through a resistor, and the annular electrode is at a ground potential.

25. A surface acoustic wave device in which a main surface of a piezoelectric substrate having a filter region formed thereon is mounted on a mounting substrate, comprising:
an IDT electrode, an input electrode section, and an output electrode section formed in the filter region on the main surface of the piezoelectric substrate; and
a conductor layer partially formed on the other surface opposite to the main surface of the piezoelectric substrate; wherein
the piezoelectric substrate is composed of a lithium tantalate single crystal or a lithium niobate single crystal or a lithium tetraborate single crystal, the oxygen content of which is lower than a stoichiometric composition ratio.

* * * * *